(12) United States Patent
Lee et al.

(10) Patent No.: US 10,644,023 B2
(45) Date of Patent: May 5, 2020

(54) THREE-DIMENSIONAL SEMICONDUCTOR MEMORY DEVICE INCLUDING STACKED ELECTRODES HAVING PAD PORTIONS

(71) Applicant: Samsung Electronics Co., Ltd., Suwon-si, Gyeonggi-do (KR)

(72) Inventors: Chang-Sup Lee, Hwaseong-si (KR); Sung-Hun Lee, Yongin-si (KR); Joonhee Lee, Seongnam-si (KR); Seong Soon Cho, Suwon-si (KR)

(73) Assignee: Samsung Electronics Co., Ltd. (KR)

( * ) Notice: Subject to any disclaimer, the term of this patent is extended or adjusted under 35 U.S.C. 154(b) by 0 days.

(21) Appl. No.: 16/019,119

(22) Filed: Jun. 26, 2018

(65) Prior Publication Data
US 2018/0315772 A1 Nov. 1, 2018

Related U.S. Application Data

(63) Continuation of application No. 15/403,779, filed on Jan. 11, 2017, now Pat. No. 10,032,791.

(30) Foreign Application Priority Data

Jan. 18, 2016 (KR) .................. 10-2016-0006043

(51) Int. Cl.
| | | |
|---|---|---|
| *H01L 27/11582* | (2017.01) | |
| *H01L 27/1157* | (2017.01) | |
| *H01L 27/11565* | (2017.01) | |
| *H01L 27/11575* | (2017.01) | |
| *H01L 23/522* | (2006.01) | |

(Continued)

(52) U.S. Cl.
CPC ...... *H01L 27/11582* (2013.01); *H01L 23/528* (2013.01); *H01L 23/5226* (2013.01); *H01L 23/535* (2013.01); *H01L 27/1157* (2013.01); *H01L 27/11556* (2013.01);
(Continued)

(58) Field of Classification Search
CPC .......... H01L 27/11582; H01L 27/1157; H01L 27/11565; H01L 27/11575; H01L 27/11556; H01L 23/528; H01L 23/5226
See application file for complete search history.

(56) References Cited

U.S. PATENT DOCUMENTS 8,456,909 B2 6/2013 Lee et al.
8,564,050 B2 10/2013 Park et al.
(Continued)

*Primary Examiner* — Allen L Parker
*Assistant Examiner* — Gustavo G Ramallo
(74) *Attorney, Agent, or Firm* — Myers Bigel, P.A.

(57) ABSTRACT

A three-dimensional semiconductor memory device includes a substrate including a cell array region and a connection region and an electrode structure including first and second electrodes alternatingly and vertically stacked on the substrate and having a stair-step structure on the connection region. Each of the first and second electrodes may include electrode portions provided on the cell array region to extend in a first direction and to be spaced apart from each other in a second direction perpendicular to the first direction, an electrode connecting portion provided on the connection region to extend in the second direction and to horizontally connect the electrode portions to each other, and protrusions provided on the connection region to extend from the electrode connecting portion in the first direction and to be spaced apart from each other in the second direction.

19 Claims, 43 Drawing Sheets

(51) Int. Cl.
  *H01L 23/528* (2006.01)
  *H01L 23/535* (2006.01)
  *H01L 27/11556* (2017.01)
  *H01L 29/423* (2006.01)

(52) U.S. Cl.
  CPC .. *H01L 27/11565* (2013.01); *H01L 27/11575* (2013.01); *H01L 29/42328* (2013.01); *H01L 29/42344* (2013.01)

(56) References Cited

U.S. PATENT DOCUMENTS

| | | |
|---|---|---|
| 8,570,802 B2 | 10/2013 | Shirakawa |
| 8,786,007 B2 | 7/2014 | Chae et al. |
| 8,971,118 B2 | 3/2015 | Jin et al. |
| 9,041,093 B2 | 5/2015 | Tanaka et al. |
| 9,153,705 B2 | 10/2015 | Zhang et al. |
| 9,306,041 B2 | 4/2016 | Hwang et al. |
| 9,711,603 B2 | 7/2017 | Lim et al. |
| 10,204,919 B2 * | 2/2019 | Lee .............. H01L 27/0207 |
| 2009/0020744 A1 * | 1/2009 | Mizukami .......... H01L 23/5226 257/4 |
| 2011/0147818 A1 | 6/2011 | Katsumata et al. |
| 2011/0204420 A1 * | 8/2011 | Kim .................. H01L 27/0688 257/211 |
| 2011/0244666 A1 | 10/2011 | Kim et al. |
| 2011/0284943 A1 * | 11/2011 | Hwang ............. H01L 27/0207 257/314 |
| 2013/0009274 A1 | 1/2013 | Lee et al. |
| 2014/0061747 A1 * | 3/2014 | Tanzawa ........... H01L 29/66833 257/314 |
| 2014/0070295 A1 | 3/2014 | Fukuda et al. |
| 2014/0162420 A1 * | 6/2014 | Oh .................. H01L 27/11565 438/270 |
| 2014/0197546 A1 | 7/2014 | Hwang et al. |
| 2015/0137216 A1 | 5/2015 | Lee et al. |
| 2015/0263024 A1 | 9/2015 | Hishida et al. |
| 2016/0056165 A1 | 2/2016 | Imamura |
| 2016/0155750 A1 | 6/2016 | Yasuda |

* cited by examiner

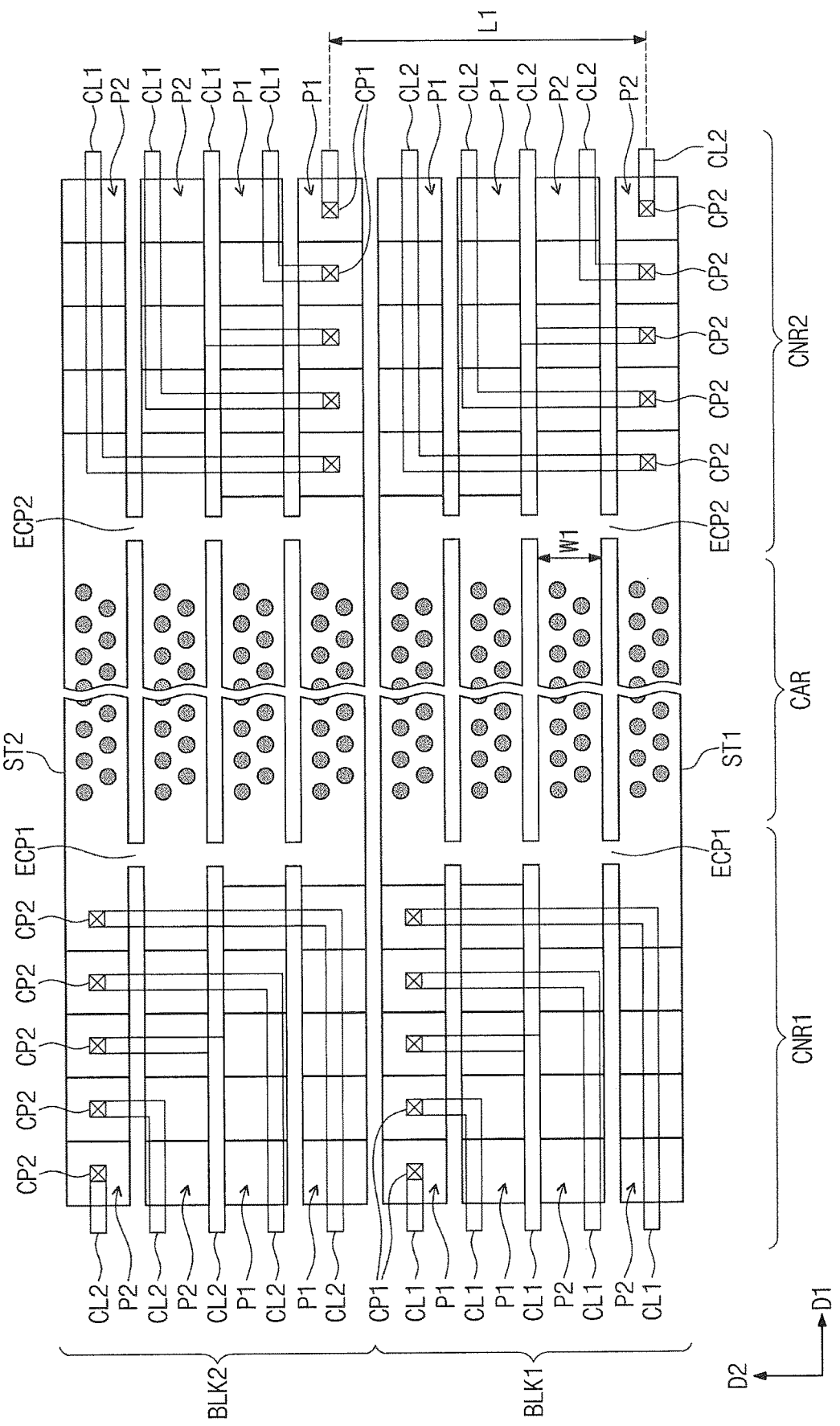

THREE-DIMENSIONAL SEMICONDUCTOR MEMORY DEVICE INCLUDING STACKED ELECTRODES HAVING PAD PORTIONS

REFERENCE TO PRIORITY APPLICATION

This U.S. non-provisional patent application is a continuation of U.S. application Ser. No. 15/403,779, filed Jan. 11, 2017, which claims priority under 35 U.S.C. § 119 to Korean Patent Application No. 10-2016-0006043, filed Jan. 18, 2016, in the Korean Intellectual Property Office, the entire contents of which are hereby incorporated herein by reference.

BACKGROUND OF THE INVENTION

The present disclosure relates to semiconductor memory devices and, in particular, to a highly-integrated three-dimensional semiconductor memory devices.

Higher integration of semiconductor devices is required to satisfy consumer demands for superior performance and inexpensive prices. In the case of semiconductor devices, since their integration is an important factor in determining product prices, increased integration is especially required. In the case of typical two-dimensional or planar semiconductor memory devices, since their integration is mainly determined by the area occupied by a unit memory cell, integration is greatly influenced by the level of a fine pattern forming technology. However, the extremely expensive process equipment needed to increase pattern fineness sets a practical limitation on increasing integration for two-dimensional or planar semiconductor devices. To overcome such a limitation, three-dimensional semiconductor memory devices including three-dimensionally arranged memory cells have been proposed.

SUMMARY

Some embodiments of the inventive concept provide a highly-integrated three-dimensional semiconductor memory device. For example, a vertical non-volatile memory device according to some embodiments of the invention can include a semiconductor substrate having a memory cell region and a connection region thereon. The connection region can extend immediately adjacent the memory cell region. A plurality of spaced-apart first gate electrodes are provided, which extend side-by-side and lengthwise in a first direction from the memory cell region to the connection region. A plurality of spaced-apart second gate electrodes are also provided, which extend side-by-side and lengthwise in the first direction from the memory cell region to the connection region. The plurality of spaced-apart first gate electrodes extend between the plurality of spaced-apart second gate electrodes and the semiconductor substrate. A first gate electrode connecting line is also provided, which extends lengthwise in a second direction across the connection region at a level coplanar with the plurality of spaced-apart first gate electrodes. The first gate electrode connecting line electrically shorts the plurality of spaced-apart first gate electrodes together. A second gate electrode connecting line is provided, which extends lengthwise in the second direction across the connection region at a level coplanar with the plurality of spaced-apart second gate electrodes. The second gate electrode connecting line electrically shorts the plurality of spaced-apart second gate electrodes together.

According to additional embodiments of the invention, the first and second directions are orthogonal to each other (i.e., at 90°) and the first gate electrode connecting line partitions the plurality of spaced-apart first gate electrodes into respective first active gate electrode regions, which extend across at least a portion of the memory cell region, and respective first pad regions, which are located within the connection region and at distal ends of the plurality of spaced-apart first gate electrodes. Similarly, the second gate electrode connecting line partitions the plurality of spaced-apart second gate electrodes into respective second active gate electrode regions, which extend across at least a portion of the memory cell region, and respective second pad regions, which are located within the connection region and at distal ends of the plurality of spaced-apart second gate electrodes. According to some of these embodiments of the invention, at least two of the first pad regions associated with the plurality of spaced-apart first gate electrodes have equivalent contact area dimensions, and at least two of the second pad regions associated with the plurality of spaced-apart second gate electrodes have unequal contact area dimensions.

These memory devices further include a first vertical contact plug, which electrically contacts a first of the at least two of the first pad regions, and a second vertical contact plug, which electrically contacts a first of the at least two of the second pad regions. In some of these embodiments of the invention, the first of the at least two of the second pad regions completely overlaps a second of the at least two of the first pad regions, but a second of the at least two of the second pad regions only partially overlaps the first of the at least two of the first pad regions. The second of the at least two of the second pad regions has smaller contact area dimensions relative to the first of the at least two of the second pad regions.

According to still further embodiments of the invention, a vertical non-volatile memory device is provided, which includes a semiconductor substrate having a memory cell region and a connection region thereon, with the connection region extending adjacent the memory cell region. A pair of spaced-apart first gate electrodes are provided that extend in parallel in a first direction opposite the memory cell region and the connection region, and a pair of spaced-apart second gate electrodes are provided that extend in parallel in the first direction opposite the memory cell region and the connection region. The pair of spaced-apart first gate electrodes extend between the pair of spaced-apart second gate electrodes and the substrate. A first gate electrode connecting line is provided, which extends lengthwise in a second direction across the connection region at a level coplanar with the pair of spaced-apart first gate electrodes and electrically shorts the pair of spaced-apart first gate electrodes together. A second gate electrode connecting line is provided, which extends lengthwise in the second direction across the connection region at a level coplanar with the pair of spaced-apart second gate electrodes and electrically shorts the pair of spaced-apart second gate electrodes together. A first vertical contact plug is provided, which is electrically connected to a first pad region located at a distal end of a first of the pair of spaced-apart first gate electrodes. A second vertical contact plug is provided, which is electrically connected to a second pad region located at a distal end of a second of the pair of spaced-apart second gate electrodes. The first gate electrode connecting line extends between the second gate electrode connecting line and the substrate, and a distance between the first vertical contact plug and the first gate electrode connecting line is equivalent to a distance between the second vertical contact plug and the second gate electrode connecting line.

According to still further embodiments of the invention, a three-dimensional semiconductor memory device may include a substrate including a cell array region and a connection region and an electrode structure including first and second electrodes alternatingly and vertically stacked on the substrate and having a stair-step structure on the connection region. Each of the first and second electrodes may include electrode portions provided on the cell array region to extend in a first direction and to be spaced apart from each other in a second direction perpendicular to the first direction, an electrode connecting portion provided on the connection region to extend in the second direction and to horizontally connect the electrode portions to each other, and protrusions provided on the connection region to extend from the electrode connecting portion in the first direction and to be spaced apart from each other in the second direction. Each of the first electrodes may include a first pad region exposed by the second electrode positioned thereon and provided at an end portion of one of the protrusions, and each of the second electrodes may include a second pad region exposed by the first electrode positioned thereon and provided at an end portion of one of the protrusions. The second pad regions of the second electrodes may be adjacent to the first pad regions of the first electrodes in the second direction.

According to some embodiments of the inventive concept, a three-dimensional semiconductor memory device may include a substrate including a cell array region and a connection region and first and second electrode structures, each including first and second electrodes alternatingly and vertically stacked on the substrate. Each of the first and second electrodes of the first and second electrode structures may include a plurality of electrode portions provided on the cell array region to extend in a first direction and to be spaced apart from each other in a second direction perpendicular to the first direction, an electrode connecting portion provided on the connection region to extend in the second direction and to horizontally connect the electrode portions to each other, and at least one protrusion provided on the connection region to extend from the electrode connecting portion in the first direction. In each of the first and second electrode structures, the protrusions of the first electrodes exposed by the second electrodes may serve as first pad regions defining a first stair-step structure on the connection region, and the protrusions of the second electrodes exposed by the first electrodes may serve as second pad regions defining a second stair-step structure on the connection region. The second stair-step structure may be adjacent to the first stair-step structure in the second direction.

According to some embodiments of the inventive concept, a three-dimensional semiconductor memory device may include a substrate including a cell array region and a connection region, an electrode structure including first and second electrodes alternatingly and vertically stacked on the substrate, the first and second electrodes having first and second pad regions, respectively, first contact plugs coupled to the first pad regions, respectively, second contact plugs coupled to the second pad regions, respectively, first interconnection lines coupled to the first contact plugs, respectively, and second interconnection lines coupled to the second contact plugs, respectively. The electrode structure may have a stair-step structure on the connection region. Furthermore, each of the first and second electrodes may include electrode portions provided on the cell array region to extend in a first direction and to be spaced apart from each other in a second direction perpendicular to the first direction, an electrode connecting portion provided on the connection region to extend in the second direction and to horizontally connect the electrode portions to each other, and at least one protrusion extending from the electrode connecting portion in the first direction. The protrusion of each of the first electrodes may include an end portion serving as the first pad region, the protrusion of each of the second electrodes may include an end portion serving as the second pad region, and the first and second pad regions being adjacent to each other in the second direction. The first and second interconnection lines may be located at the same vertical level from the substrate.

BRIEF DESCRIPTION OF THE DRAWINGS

Example embodiments will be more clearly understood from the following brief description taken in conjunction with the accompanying drawings. The accompanying drawings represent non-limiting, example embodiments as described herein.

FIGS. 16, 17, and 18 are plan views illustrating a 3D semiconductor memory device according to some embodiments of the inventive concept.

Figure 1:
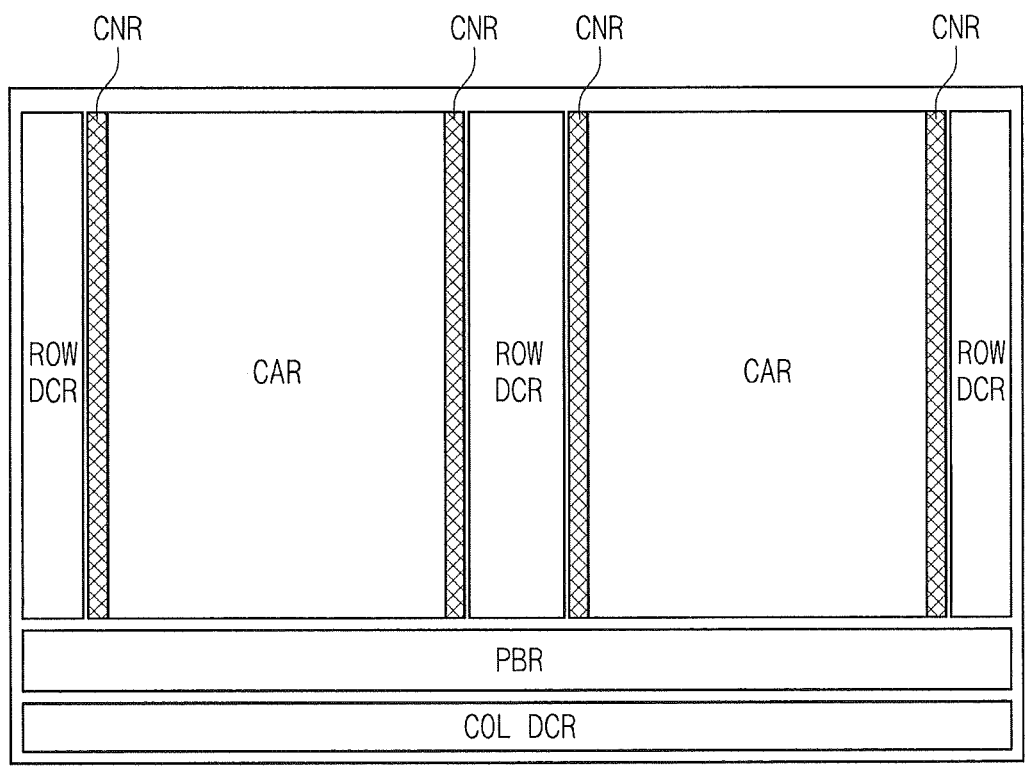
FIG. 1 is a schematic diagram illustrating a chip layout of a three-dimensional (3D) semiconductor memory device according to some embodiments of the inventive concept.

It should be noted that these figures are intended to illustrate the general characteristics of methods, structure and/or materials utilized in certain example embodiments and to supplement the written description provided below. These drawings are not, however, to scale and may not precisely reflect the precise structural or performance characteristics of any given embodiment, and should not be interpreted as defining or limiting the range of values or properties encompassed by example embodiments. For example, the relative thicknesses and positioning of molecules, layers, regions and/or structural elements may be reduced or exaggerated for clarity. The use of similar or identical reference numbers in the various drawings is intended to indicate the presence of a similar or identical element or feature.

DETAILED DESCRIPTION

Exemplary embodiments of aspects of the present inventive concepts explained and illustrated herein include their complementary counterparts. The same reference numerals or the same reference designators denote the same elements throughout the specification.

FIG. 1 is a schematic diagram illustrating a chip layout of a three-dimensional (3D) semiconductor memory device according to some embodiments of the inventive concept. Referring to FIG. 1, a 3D semiconductor memory device may include a cell array region CAR and a peripheral circuit region. The peripheral circuit region may include row decoder regions ROW DCR, a page buffer region PBR, a column decoder region COL DCR, and a control circuit region (not shown). In some embodiments, a connection region CNR may be provided between the cell array region CAR and each of the row decoder regions ROW DCR.

A memory cell array may be provided in the cell array region CAR. In some embodiments, the memory cell array may include a plurality of memory cells, which are three-dimensionally arranged in the memory cell array, and a plurality of word and bit lines, which are electrically connected to the memory cells.

In each of the row decoder regions ROW DCR, a row decoder may be provided to select at least one of the word lines that are provided in the memory cell array, and in the connection region CNR, an interconnection structure may be provided to electrically connect the memory cell array to the row decoder. The row decoder may be configured to select at least one of the word lines, based on address information. The row decoder may be configured to apply different word line voltages to selected and unselected ones of the word lines, in response to control signals from a control circuit (not shown).

In the page buffer region PBR, a page buffer may be provided to read out data stored in the memory cells. Depending on an operation mode, the page buffer may be configured to temporarily store data in the memory cells or to read out data stored in the memory cells. For example, the page buffer may function as a write driver in a program operation mode or as a sense amplifier in a read operation mode.

A column decoder may be provided in the column decoder region COL DCR. The column decoder may be connected to the bit lines of the memory cell array to provide data-transmission paths between the page buffer and an external device (e.g., a memory controller).

Figure 2:
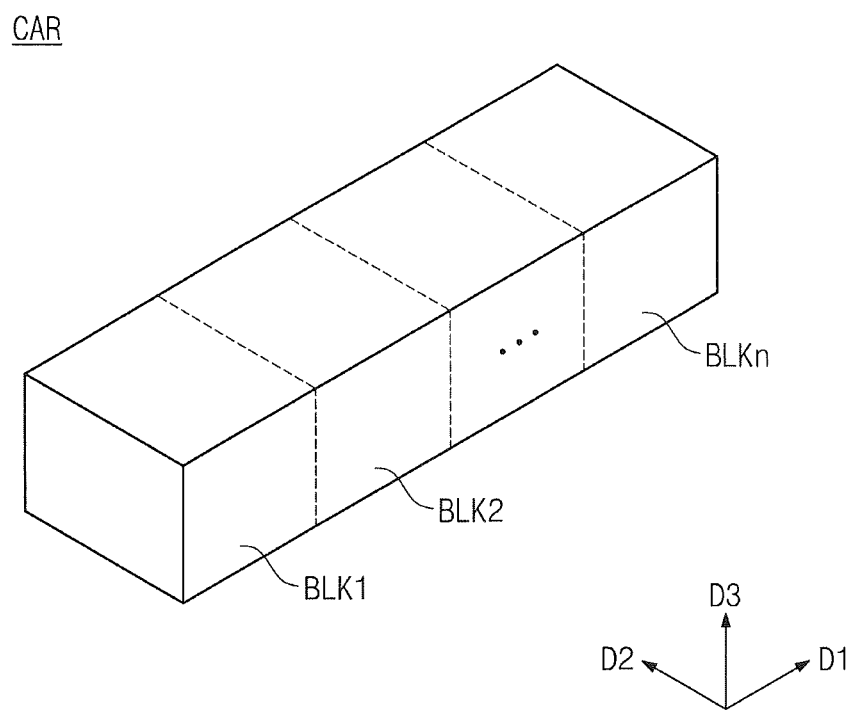
FIG. 2 is a schematic block diagram illustrating a cell array of a 3D semiconductor memory device according to some embodiments of the inventive concept.

FIG. 2 is a schematic block diagram illustrating a cell array of a 3D semiconductor memory device according to some embodiments of the inventive concept. Referring to FIG. 2, the cell array region CAR may include a plurality of cell array blocks BLK1, BLK2, . . . , BLKn. Each of the cell array blocks BLK1, BLK2, . . . , BLKn may include an electrode structure including a plurality of electrodes stacked in a third direction D3 on a plane defined by first and second directions D1 and D2. The electrode structure may be coupled to a plurality of vertical structures or semiconductor pillars to constitute three-dimensionally arranged memory cells. In addition, each of the cell array blocks BLK1, BLK2, . . . , BLKn may include bit lines that are electrically connected to the memory cells.

Figure 3:
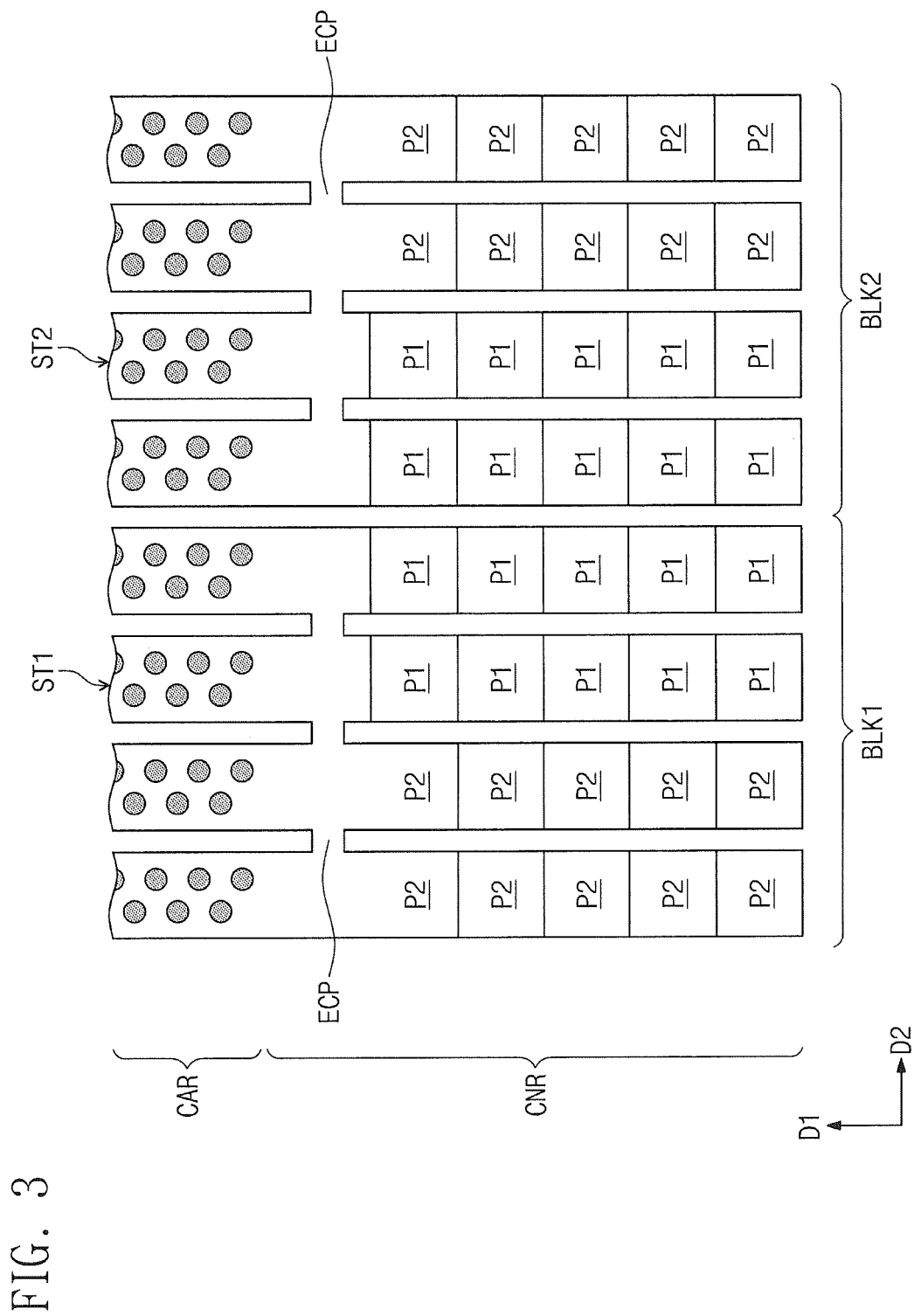
FIGS. 3 and 4 are plan and perspective views illustrating a cell array block of a 3D semiconductor memory device according to some embodiments of the inventive concept.
Figure 4:
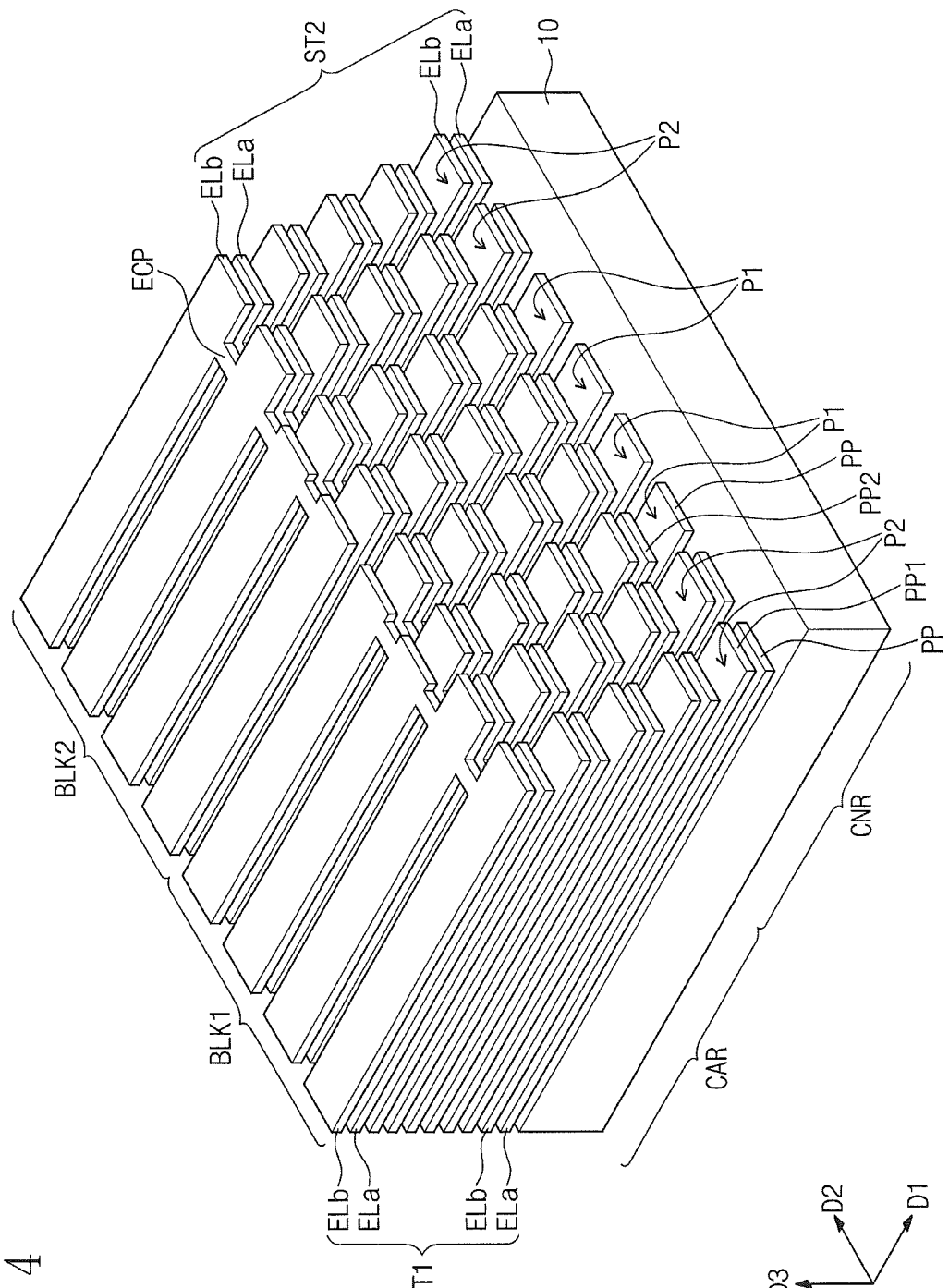
Figure 5A:
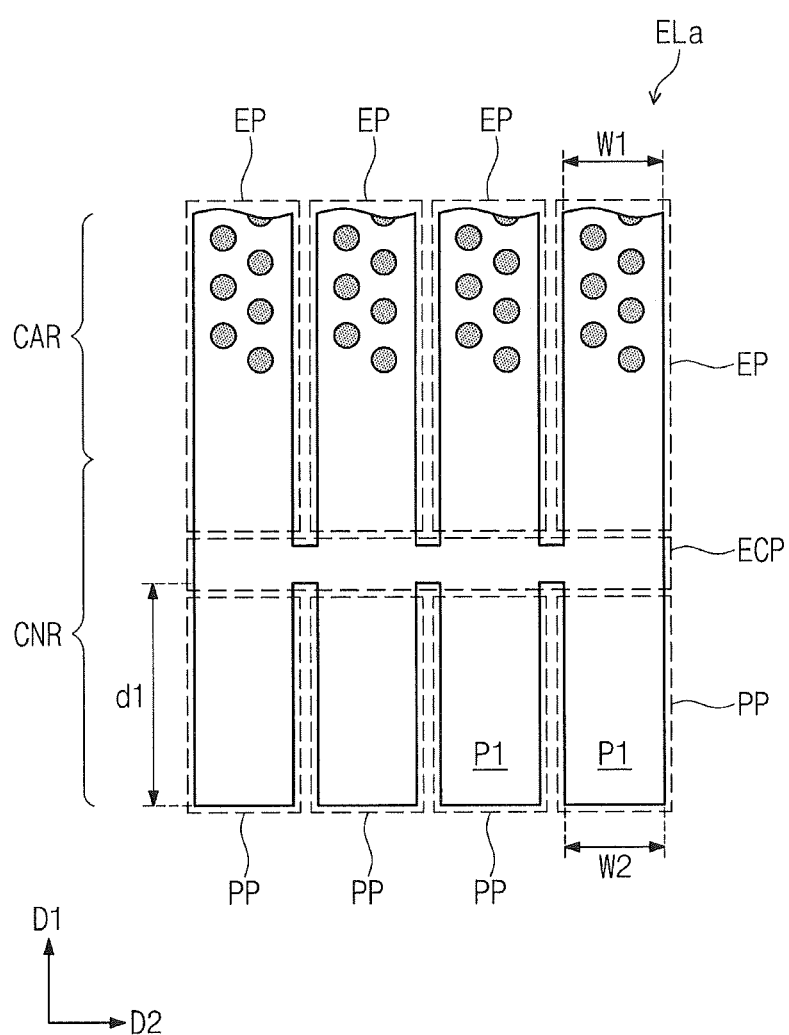
FIG. 5A is a plan view illustrating one of first electrodes of an electrode structure shown in FIGS. 3 and 4.
Figure 5B:
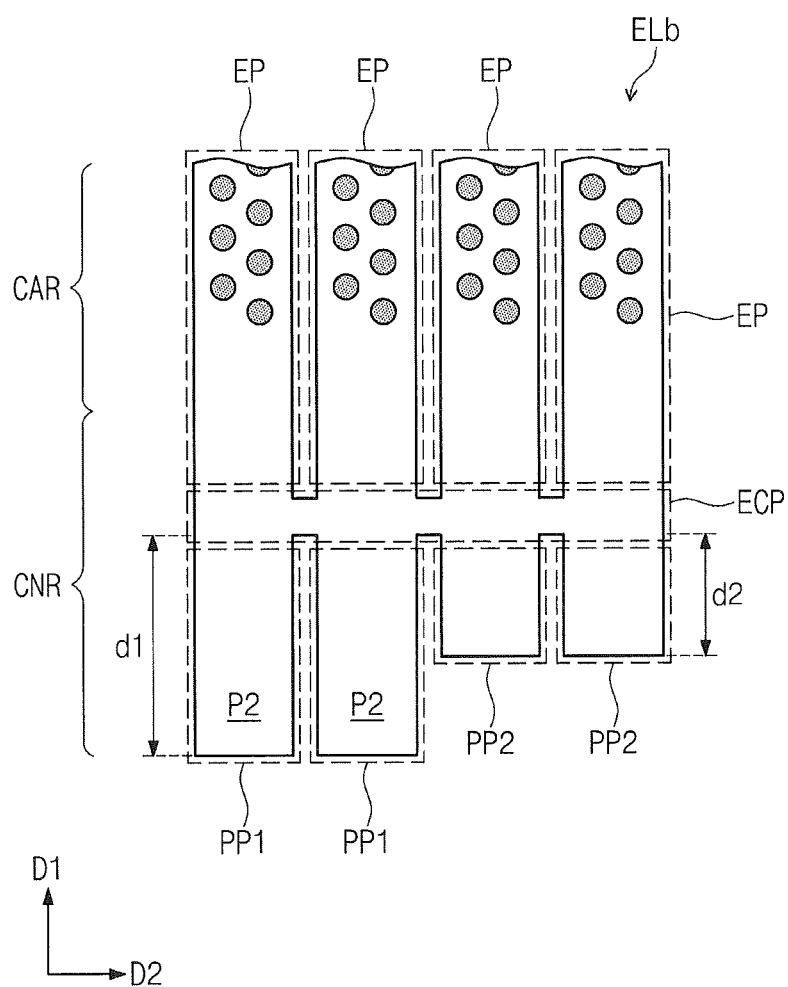
FIG. 5B is a plan view illustrating one of second electrodes of the electrode structure shown in FIGS. 3 and 4.

FIGS. 3 and 4 are plan and perspective views illustrating a cell array block of a 3D semiconductor memory device according to some embodiments of the inventive concept. FIG. 5A is a plan view illustrating one of first electrodes of an electrode structure shown in FIGS. 3 and 4, and FIG. 5B is a plan view illustrating one of second electrodes of the electrode structure shown in FIGS. 3 and 4.

Referring to FIGS. 3 and 4, a substrate 10 may include a cell array region CAR and a connection region CNR. For example, the substrate 10 may be formed of or include at least one of silicon (Si), germanium (Ge), silicon germanium (SiGe), gallium arsenic (GaAs), indium gallium arsenic (InGaAs), or aluminum gallium arsenic (AlGaAs). The substrate 10 may be, for example, a bulk silicon wafer, a silicon-on-insulator (SOI) wafer, a germanium wafer, a germanium-on-insulator (GOI) wafer, a silicon-germanium substrate, or a substrate with an epitaxial layer formed by a selective epitaxial growth (SEG) process. In certain embodiments, the substrate 10 may be formed of or include one or more insulating layers. For example, the substrate 10 may include a silicon oxide layer, a silicon nitride layer, or low-k dielectric.

In some embodiments, a plurality of cell array blocks BLK1 and BLK2 may be provided on the substrate 10, and each of the cell array blocks BLK1 and BLK2 may include an electrode structure, in which a plurality of vertically stacked electrodes ELa and ELb are provided.

A plurality of electrode structures may be provided on the substrate 10, and each of the electrode structures may include a plurality of electrodes ELa and ELb, which are stacked on a top surface of the substrate 10 or in the third direction D3 (e.g., perpendicular to the top surface of the substrate 10). Each of the electrode structures may have a staircase structure on the connection region CNR. In other words, on the connection region CNR, each of the electrode structures may have a thickness decreasing in a stepwise manner in a direction away from the cell array region CAR.

The electrodes ELa and ELb may be formed of or include a conductive material; for example, the electrodes ELa and ELb may include at least one of doped semiconductor (e.g., doped silicon), metals (e.g., tungsten, copper, aluminum, etc.), conductive metal nitrides (e.g., titanium nitride, tantalum nitride, etc.), or transition metals (e.g., titanium, tantalum, etc.). Each of the electrode structures may include insulating layers (not shown) interposed between the electrodes ELa and ELb.

The cell array blocks may include first and second cell array blocks BLK1 and BLK2, which are provided on the substrate 10 to be spaced apart from each other. Also, the electrode structures may include first and second electrode structures ST1 and ST2. The first cell array block BLK1 may include the first electrode structure ST1, and the second cell array block BLK2 may include the second electrode structure ST2. The first and second electrode structures ST1 and ST2 may extend from the cell array region CAR to the connection region CNR in the first direction D1 and may be spaced apart from each other in the second direction D2.

Each of the first and second electrode structures ST1 and ST2 may include first electrodes ELa and second electrodes ELb, which are alternatingly and vertically stacked on the substrate 10. Here, each of the first electrodes ELa may include a first pad region P1, which is located on the connection region CNR and is exposed by the second electrode ELb thereon, and each of the second electrodes ELb may include a second pad region P2, which is located on the connection region CNR and is exposed by the first electrode ELa thereon. In each of the first and second electrode structures ST1 and ST2, the first pad regions P1 of the first electrodes ELa may be located at horizontally and vertically different positions. The second pad regions P2 of the second electrodes ELb may also be located at horizontally and vertically different positions. In addition, the first pad regions P1 of the first electrodes ELa may be adjacent to the second pad regions P2 of the second electrodes ELb in the second direction D2.

In other words, each of the first and second electrode structures ST1 and ST2 may have a first stair-step structure, which is formed by the first pad regions P1 of the first electrodes ELa exposed on the connection region CNR, and a second stair-step structure, which is formed by the second pad regions P2 of the second electrodes ELb exposed on the connection region CNR. For example, in the first stair-step structure of the first electrodes ELa, the first pad regions P1 may be arranged in the first direction D1 when viewed in a plan view, and vertical positions thereof may be lowered in a stepwise manner in the first direction D1. Similarly, in the second stair-step structure of the second electrodes ELb, the second pad regions P2 may be arranged in the first direction D1 when viewed in a plan view, and vertical positions thereof may be lowered in a stepwise manner in the first direction D1. The second stair-step structure may be adjacent to the first stair-step structure in the second direction D2.

Furthermore, the first stair-step structure of the first electrode structure ST1 may be provided to be adjacent to the first stair-step structure of the second electrode structure ST2 in the second direction D2. For example, the first pad regions P1 of the first electrode structure ST1 may be adjacent to the first pad regions P1 of the second electrode structure ST2 in the second direction D2. In other words, the first and second electrode structures ST1 and ST2 adjacent to each other in the second direction D2 may be disposed in a mirror symmetric manner on the connection region CNR.

Hereinafter, the first and second electrodes ELa and ELb in each of the first and second electrode structures ST1 and ST2 will be described in more detail with reference to FIGS. 5A and 5B.

Referring to FIGS. 4 and 5A, each of the first electrodes ELa may include a plurality of electrode portions EP, an electrode connecting portion ECP, and one or more protrusions PP.

The electrode portions EP may extend in the first direction D1 on the cell array region CAR of the substrate 10 and may be spaced apart from each other in the second direction D2. In other words, the electrode portions EP may be horizontally spaced apart from each other. Each of the electrode portions EP may have a first width W1 in the second direction D2.

On the connection region CNR adjacent to the cell array region CAR, the electrode connecting portion ECP may extend in the second direction D2 to horizontally connect the electrode portions EP to each other. For example, in each of the first and second electrode structures ST1 and ST2, the electrode portions EP positioned at the same level from the substrate 10 may be connected to each other through the electrode connecting portion ECP, thereby being in an equipotential state.

The protrusions PP may be located on the connection region CNR and may be extended from the electrode connecting portion ECP in the first direction D1. In some embodiments, in each of the first electrodes ELa, the number of the protrusions PP may be the same as or smaller than that of the electrode portions EP. As an example, the protrusions PP may be continuously extended from the electrode portions EP in the first direction D1 and may be spaced apart from each other in the second direction D2. Each of the protrusions PP may have a second width W2 in the second direction D2, and here, the second width W2 may be substantially equal to the first width W1 of the electrode portions EP. In the second direction D2, a distance between the protrusions PP may be substantially equal to a distance between the electrode portions EP.

All of the protrusions PP of the first electrode ELa may have a first length d1, when measured from the electrode connecting portion ECP in the first direction D1. In other words, the protrusions PP of the first electrode ELa may have the same length (i.e., the first length d1) in the first direction D1. The length d1 of the protrusions PP of the first electrode ELa may be changed depending on a vertical position of the first electrode ELa. In addition, at least one of the protrusions PP of the first electrode ELa may include a portion serving as the first pad region P1.

Referring to FIGS. 4 and 5B, similar to the first electrode ELa, each of the second electrodes ELb may include a plurality of electrode portions EP provided on the cell array region CAR, an electrode connecting portion ECP horizontally connecting the electrode portions EP to each other, and protrusions PP1 and PP2 protruding from the electrode connecting portion ECP. Here, the electrode portions EP may extend in the first direction D1 and may be spaced apart from each other in the second direction D2.

In the second electrode ELb, the protrusions PP1 and PP2 may include first protrusions PP1, which are extended from the electrode connecting portion ECP by the first length d1 in the first direction D1, and second protrusions PP2, which are extended from the electrode connecting portion ECP by a second length d2 shorter than the first length d1. At least one of the first protrusions PP1 of the second electrode ELb may include a portion serving as the second pad region P2. The first protrusions PP1 of the second electrode ELb may have substantially the same length (i.e., the first length d1) as that of the protrusions PP of the first electrode ELa located below the second electrode ELb. The lengths d1 and d2 of the first and second protrusions PP1 and PP2 of the second electrode ELb may be changed depending on a vertical position of the second electrode ELb.

Referring back to FIGS. 3 and 4, in each of the first and second electrode structures ST1 and ST2, the electrode portions EP of the second electrode ELb may be overlapped with the electrode portions EP of the first electrode ELa, when viewed in a plan view. Also, in each of the first and second electrode structures ST1 and ST2, the electrode connecting portion ECP of the first electrode ELa may be overlapped with the electrode connecting portion ECP of the second electrode ELb, when viewed in a plan view.

Furthermore, in each of the first and second electrode structures ST1 and ST2, the first protrusions PP1 of the second electrode ELb may be overlapped with some of the protrusions PP of the first electrode ELa positioned therebelow, when viewed in a plan view. The second protrusions PP2 of the second electrode ELb may be provided to expose the others of the protrusions PP of the first electrode ELa positioned therebelow, when viewed in a plan view. Also, side surfaces of the first protrusions PP1 of the second electrode ELb may be aligned to side surfaces of the protrusions PP of the first electrode ELa positioned therebelow. Side surfaces of the second protrusions PP2 of the second electrode ELb may be aligned to side surfaces of the protrusions PP of the first electrode ELa positioned thereon.

Figure 6:
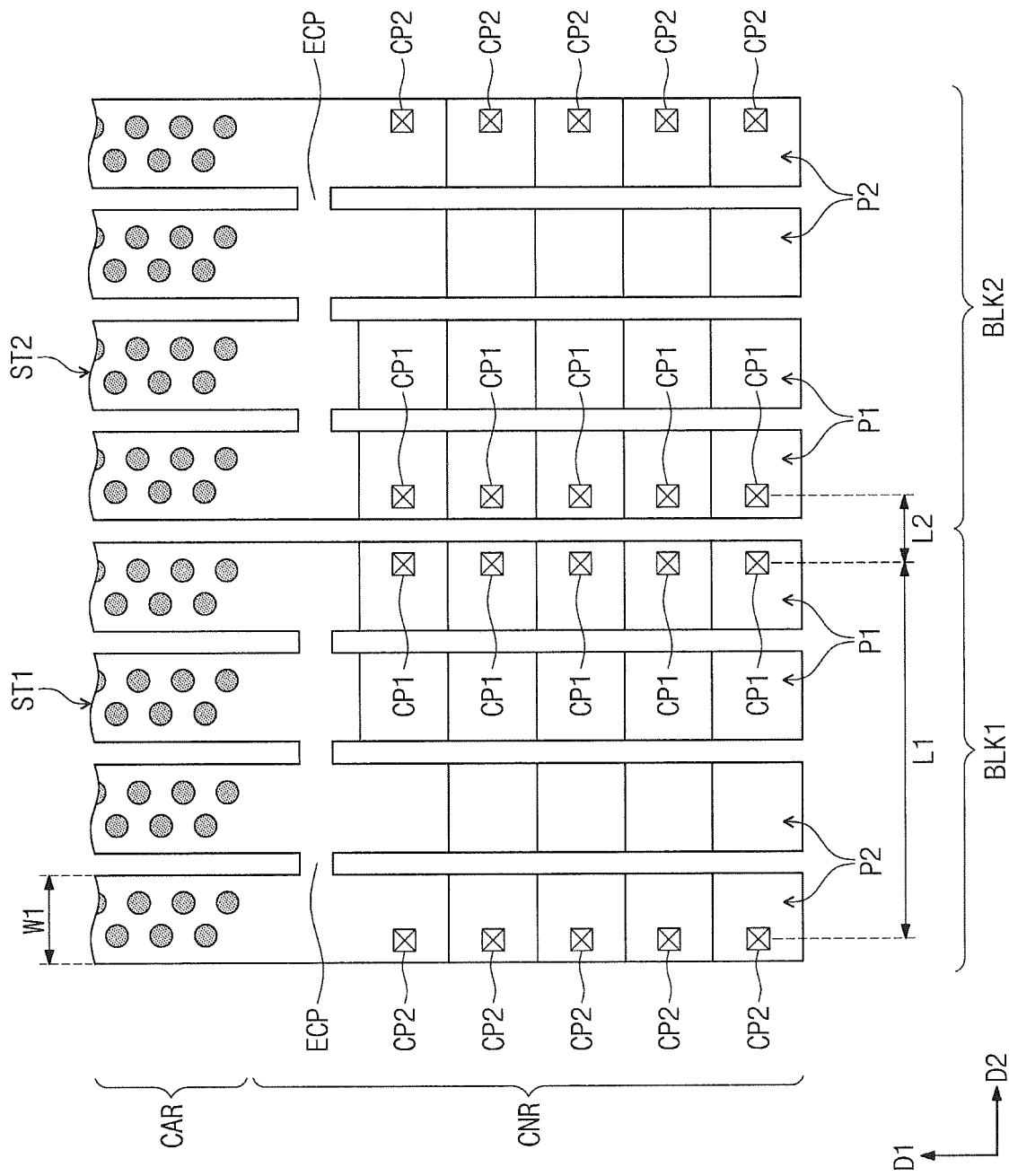
FIGS. 6, 7, and 8 illustrate contact plugs connected to the electrode structure shown in FIGS. 3 and 4.
Figure 7:
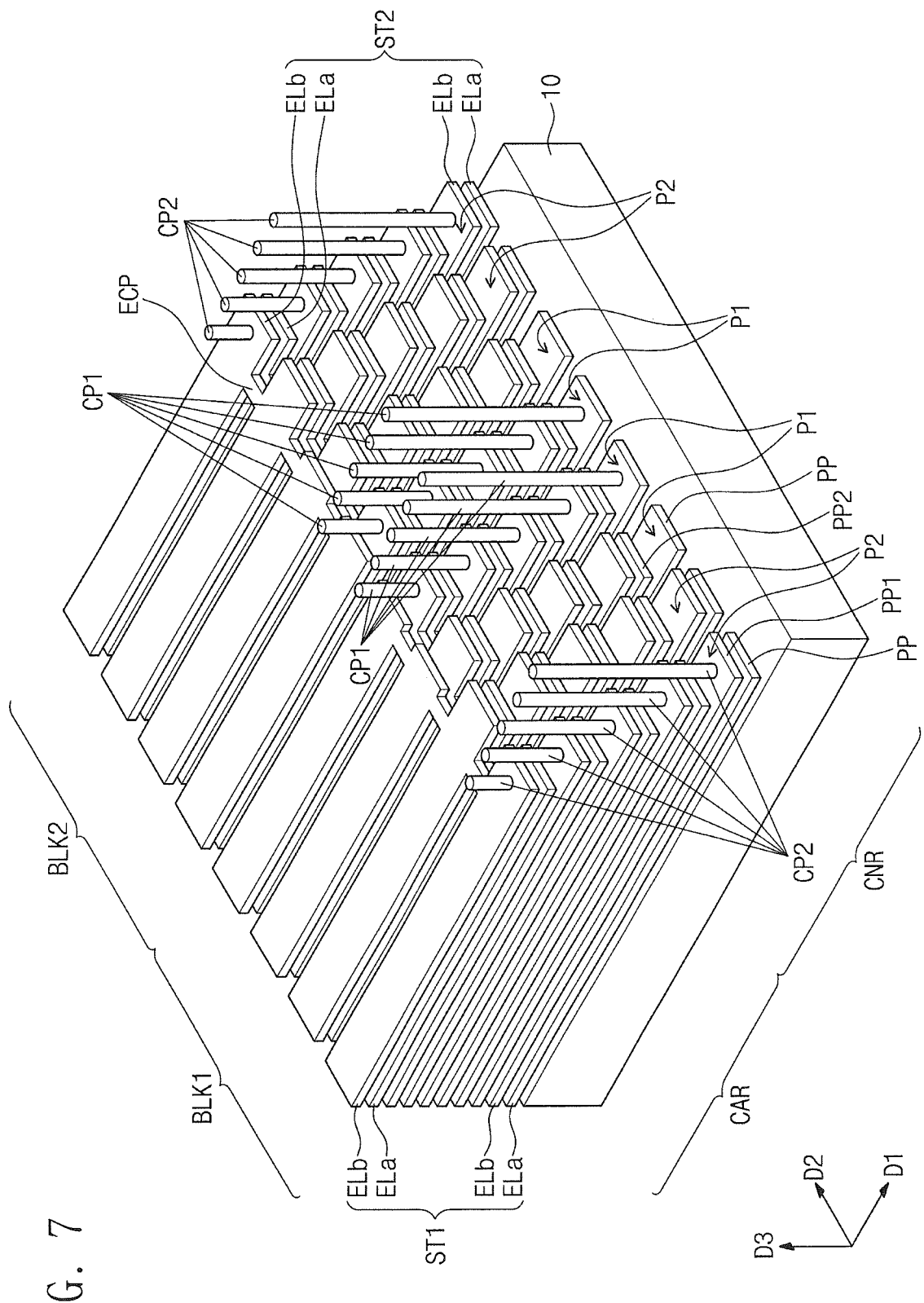
Figure 8:
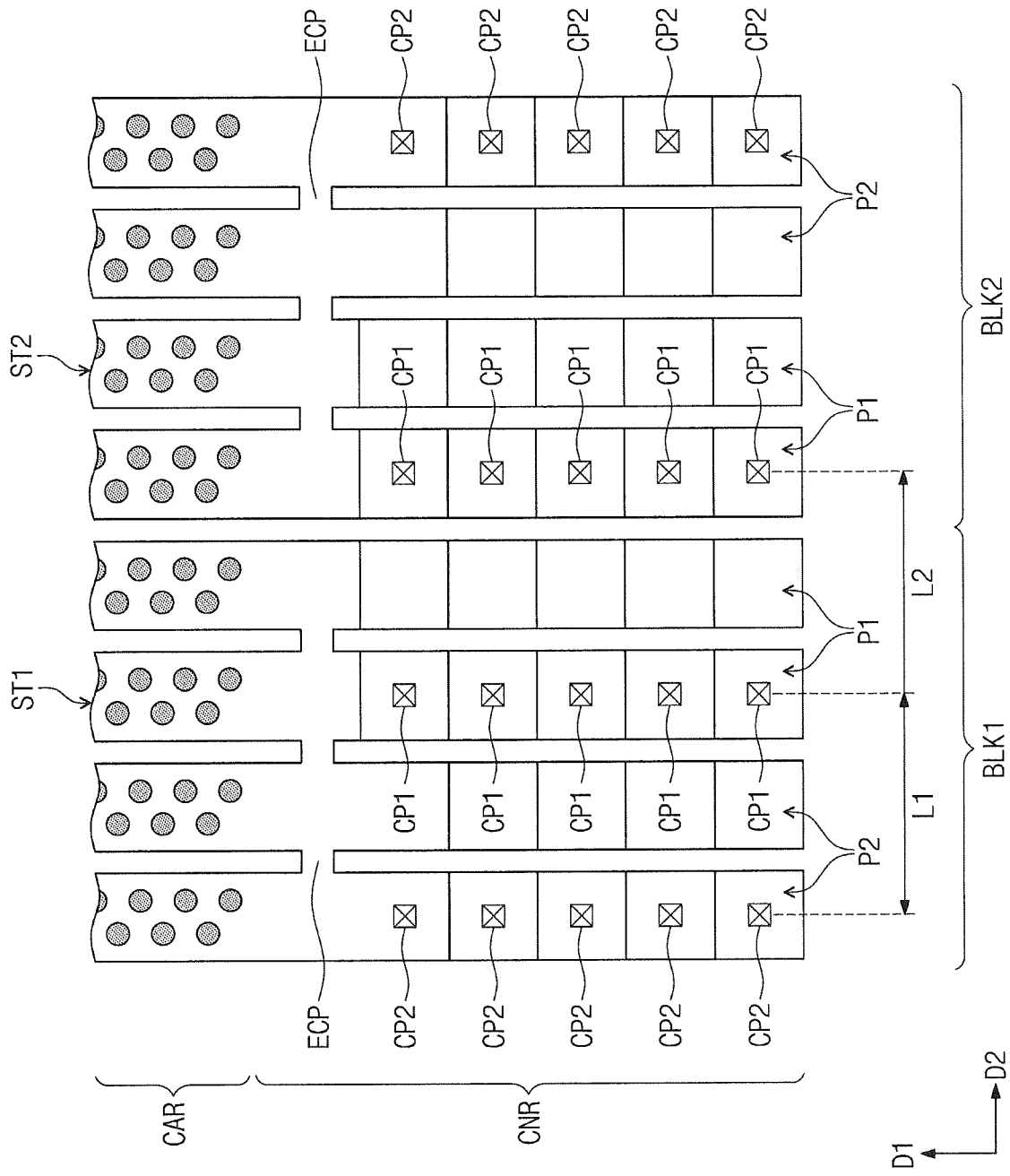

FIGS. 6, 7, and 8 illustrate contact plugs connected to the electrode structure shown in FIGS. 3 and 4.

Referring to FIGS. 6 and 7, first contact plugs CP1 may be coupled to the first electrodes ELa, respectively, of the first electrode structure ST1 on the connection region CNR, and second contact plugs CP2 may be coupled to the second electrodes ELb, respectively, of the first electrode structure ST1 on the connection region CNR. For example, the number of the first contact plugs CP1 connected to the first electrode structure ST1 may be the same as the number of the first electrodes ELa constituting the first electrode structure ST1. Similarly, the number of the second contact plugs CP2 connected to the first electrode structure ST1 may be the same as the number of the second electrodes ELb constituting the first electrode structure ST1.

The first contact plugs CP1 may be provided on the first stair-step structure, and the second contact plugs CP2 may be provided on the second stair-step structure. For example, the first contact plugs CP1 may be respectively coupled to the first pad regions P1 of the first electrodes ELa, and the second contact plugs CP2 may be respectively coupled to the second pad regions P2 of the second electrodes ELb. In other words, each of the first contact plugs CP1 may be coupled to a corresponding one of the protrusions PP of the first electrode ELa, and each of the second contact plugs CP2 may be coupled to a corresponding one of the first protrusions PP1 of the second electrode ELb.

The first contact plugs CP1 may be arranged to be spaced apart from each other in the first direction D1, and bottom surfaces of the first contact plugs CP1 may be positioned at different levels from the substrate 10. Similarly, the second contact plugs CP2 may be arranged to be spaced apart from each other in the first direction D1, and bottom surfaces of the second contact plugs CP2 may be positioned at different levels from the substrate 10.

In some embodiments, the first contact plugs CP1 may be spaced apart from the second contact plugs CP2 by a first horizontal distance L1 in the second direction D2. Here, the first horizontal distance L1 may be greater than the width W1 of the electrode portions EP of the first and second electrodes ELa and ELb. For example, the first horizontal distance L1 may be equal to or greater than two times the width W1 of the electrode portions EP of the first and second electrodes ELa and ELb. This may make it possible to increase a process margin in distance between the first and second contact plugs CP1 and CP2 coupled to the first electrode structure ST1.

In addition, the first contact plugs CP1 of the first electrode structure ST1 may be spaced apart from the first contact plugs CP1 of the second electrode structure ST2 by a second horizontal distance L2 in the second direction D2, where the second horizontal distance L2 may be shorter than the first horizontal distance L1. The second horizontal distance L2 may be equal to or longer than the width W1 of the electrode portions EP of the first and second electrodes ELa and ELb. As another example, the second horizontal distance L2 may be substantially equal to the first horizontal distance L1, as shown in FIG. 8.

Thus, as described hereinabove with respect to FIGS. 3-7, a vertical non-volatile memory device according to embodiments of the invention includes a semiconductor substrate 10 having a memory cell region CAR (e.g., cell array region) and a connection region CNR thereon. As illustrated, the connection region CNR can extend immediately adjacent the memory cell region CAR. A plurality of spaced-apart first gate electrodes ELa are provided, which extend side-by-side and lengthwise in a first direction D1 from the memory cell region CAR to the connection region CNR. A plurality of spaced-apart second gate electrodes ELb are also provided, which extend side-by-side and lengthwise in the first direction D1 from the memory cell region CAR to the connection region CNR. As shown by FIG. 4, the plurality of spaced-apart first gate electrodes ELa may extend between the corresponding plurality of spaced-apart second gate electrodes ELb and the semiconductor substrate 10. As shown by FIG. 5A, a first gate electrode connecting line ECP (e.g., electrode connecting portion) is also provided, which extends lengthwise in a second direction D2 across the connection region CNR at a level coplanar with the plurality of spaced-apart first gate electrodes ELa. The first gate electrode connecting line ECP electrically shorts the plurality of spaced-apart first gate electrodes ELa together. As shown by FIG. 5B, a second gate electrode connecting line ECP is provided, which extends lengthwise in the second direction D2 across the connection region CNR at a level coplanar with the plurality of spaced-apart second gate electrodes ELb. The second gate electrode connecting line ECP electrically shorts the plurality of spaced-apart second gate electrodes ELb together.

According to additional embodiments of the invention, the first and second directions (D1 and D2) are orthogonal to each other (i.e., at 90°) and the first gate electrode connecting line ECP partitions the plurality of spaced-apart first gate electrodes ELa into respective first active gate electrode regions EP, which extend across at least a portion of the memory cell region CAR, and respective first pad regions PP (P1), which are located within the connection region CNR and at distal ends of the plurality of spaced-apart first gate electrodes ELa, as shown by FIG. 5A. Similarly, the second gate electrode connecting line ECP partitions the plurality of spaced-apart second gate electrodes ELb into respective second active gate electrode regions EP, which extend across at least a portion of the memory cell region CAR, and respective second pad regions P2 and PP2, which are located within the connection region CNR and at distal ends of the plurality of spaced-apart second gate electrodes ELb, as shown by FIG. 5B. As shown by FIG. 5A versus FIG. 5B (and FIGS. 4, 7), at least two of the first pad regions P1 associated with the plurality of spaced-apart first gate electrodes ELa have equivalent contact area dimensions, and at least two of the second pad regions PP1 (P2) v. PP2 associated with the plurality of spaced-apart second gate electrodes ELb have unequal contact area dimensions.

As shown by FIG. 7, these memory devices further include a first vertical contact plug CP1, which electrically contacts a first of the at least two of the first pad regions P1, and a second vertical contact plug CP2, which electrically contacts a first of the at least two of the second pad regions P2. As shown by FIGS. 4, 5A-5B and 7, the first of the at least two of the second pad regions P2 completely overlaps a second of the at least two of the first pad regions P1, but a second of the at least two of the second pad regions PP2 only partially overlaps the first of the at least two of the first pad regions P1. As shown best by FIG. 5B, the second of the at least two of the second pad regions PP2 has smaller contact area dimensions relative to the first of the at least two of the second pad regions PP1.

Figure 9:
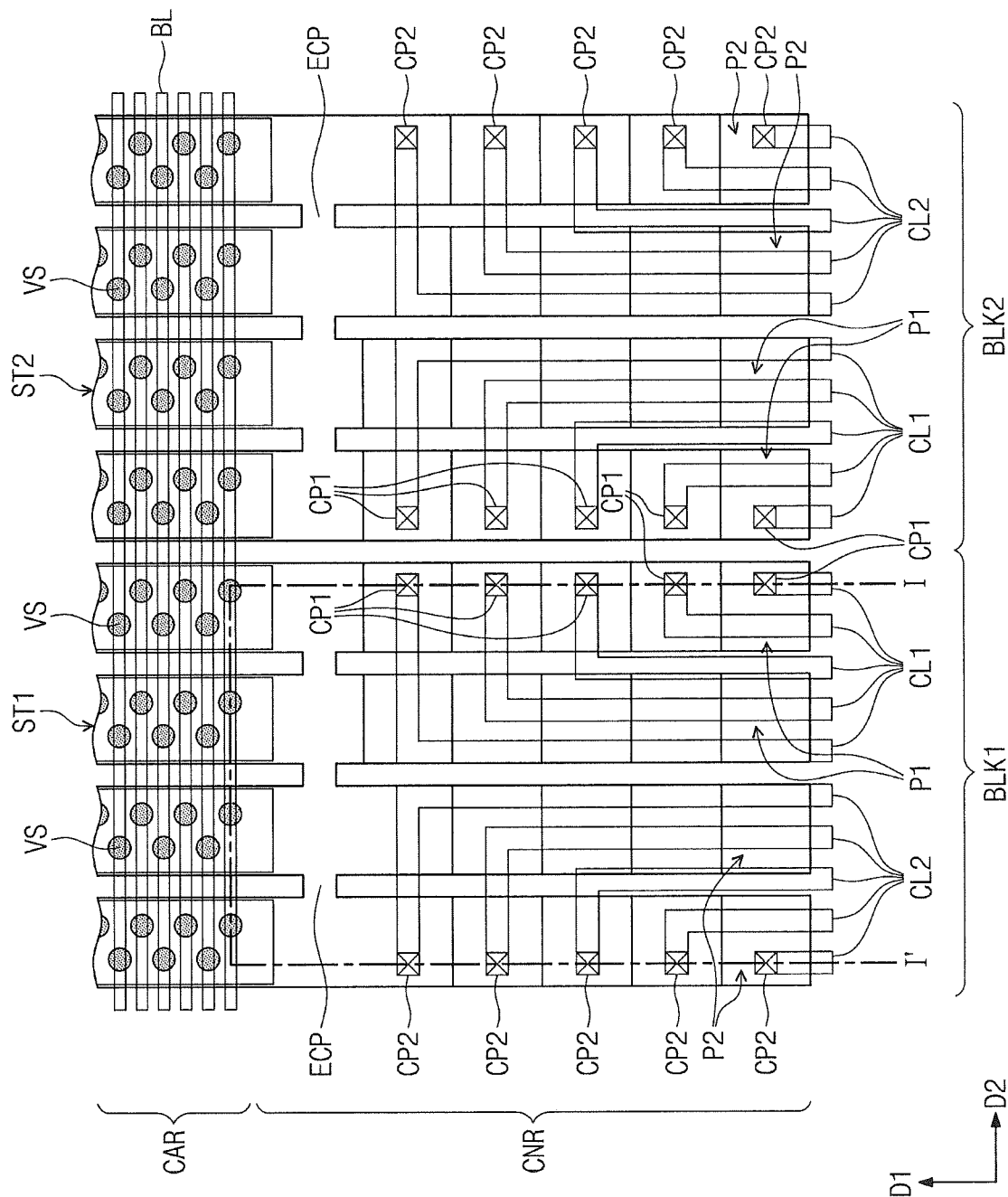
FIGS. 9 and 10 illustrate interconnection lines connected to the electrode structure shown in FIGS. 3 and 4.
Figure 10:
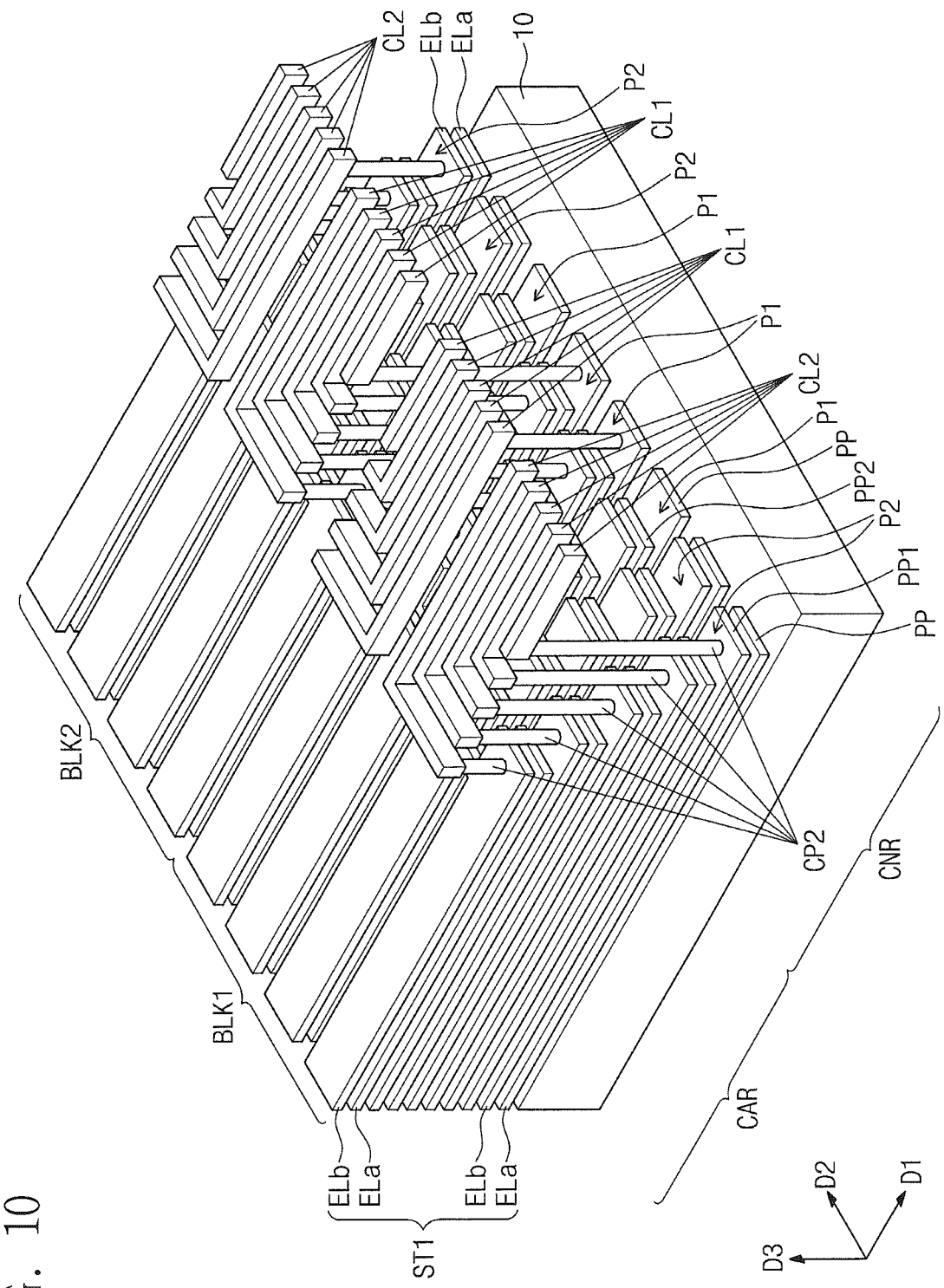
Figure 11A:
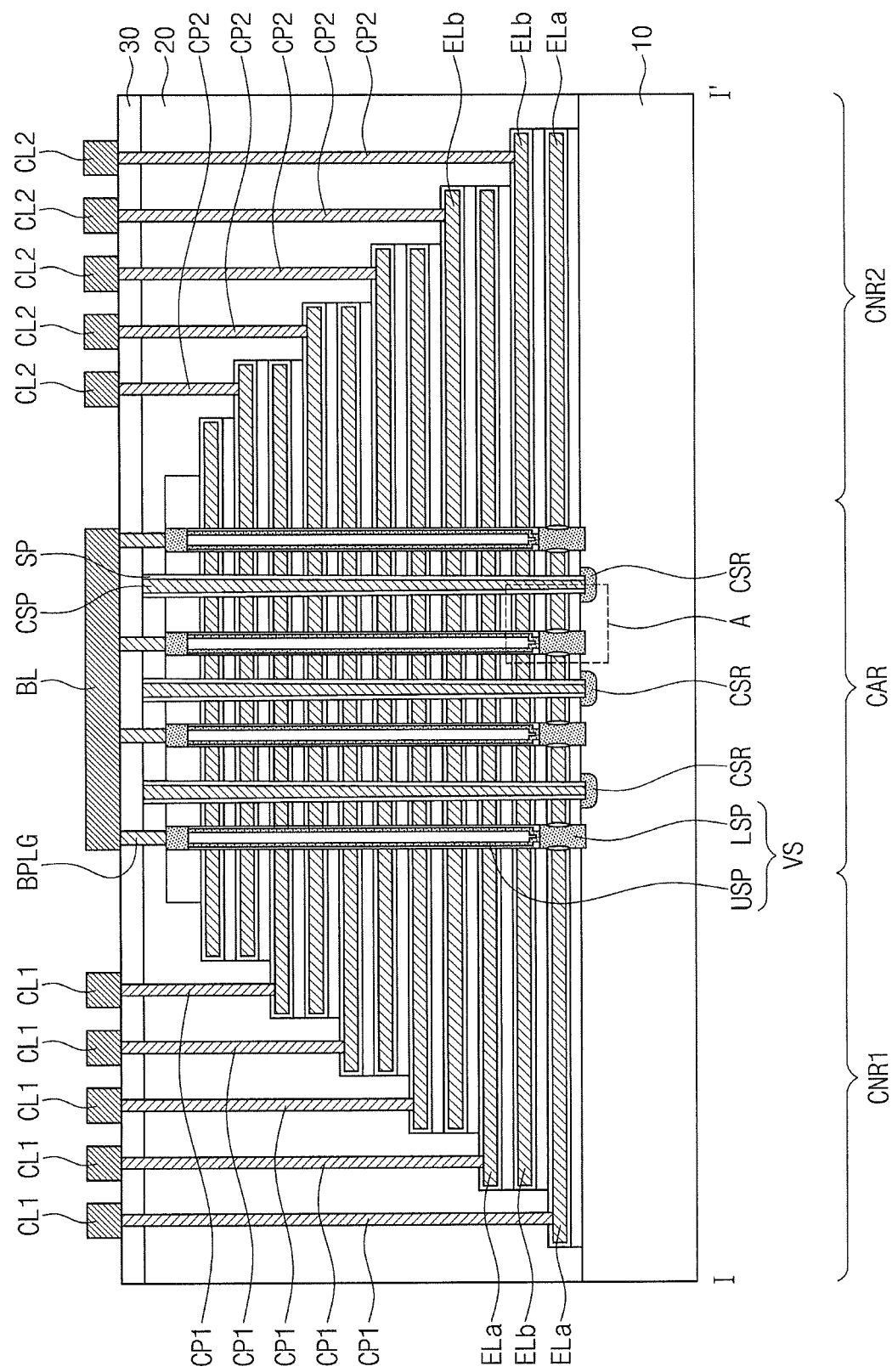
FIG. 11A is a sectional view, which is taken along line I-I' of FIG. 9 to illustrate a 3D semiconductor memory device according to some embodiments of the inventive concept.
Figure 11B:
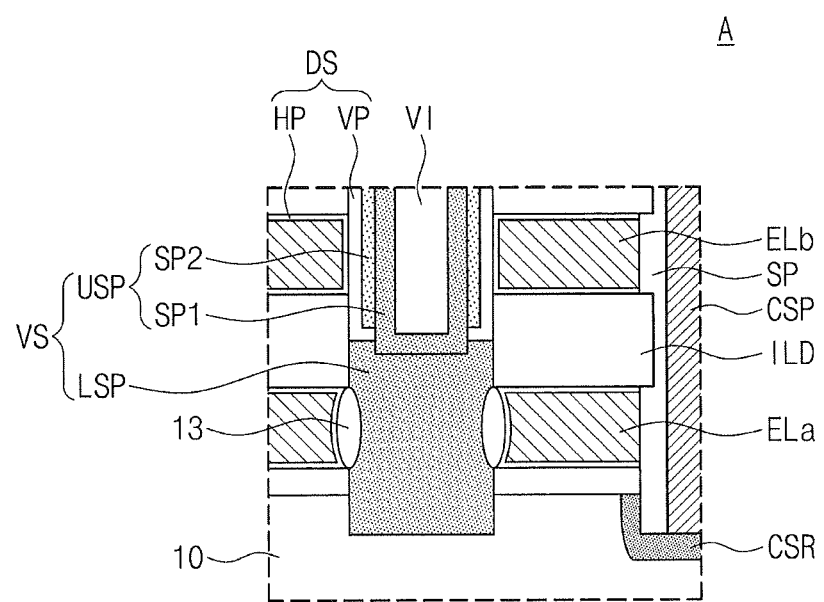
FIG. 11B is an enlarged sectional view of a portion 'A' of FIG. 11A.

FIGS. 9 and 10 illustrate interconnection lines connected to the electrode structure shown in FIGS. 3 and 4. FIG. 11A is a sectional view, which is taken along line I-I' of FIG. 9 to illustrate a 3D semiconductor memory device according to some embodiments of the inventive concept, and FIG. 11B is an enlarged sectional view of a portion 'A' of FIG. 11A.

Referring to FIGS. 9, 10, and 11A, first interconnection lines CL1 may be provided on the connection region CNR and may be coupled to the first contact plugs CP1, respectively, of the first electrode structure ST1, and second interconnection lines CL2 may be provided on the connection region CNR and may be coupled to the second contact plugs CP2, respectively, of the first electrode structure ST1. For example, the number of the first interconnection lines CL1 connected to the first electrodes ELa of the first electrode structure ST1 may be the same as the number of the first electrodes ELa, and the number of the second interconnection lines CL2 connected to the second electrodes ELb of the first electrode structure ST1 may be the same as the number of the second electrodes ELb. In some embodiments, the first and second interconnection lines CL1 and CL2 may be disposed at the same vertical level from the substrate 10.

In detail, each of the first and second interconnection lines CL1 and CL2 may include a first portion extending in the first direction D1 and a second portion extending in the second direction D2. The first portions of the first interconnection lines CL1 may be spaced apart from each other by a uniform distance in the second direction D2, and the second portions of the first interconnection lines CL1 may be in contact with the first contact plugs CP1, respectively. The second interconnection lines CL2 may be provided in a similar manner to the first interconnection lines CL1. Meanwhile, the shape and arrangement of the first and second interconnection lines CL1 and CL2 are not limited to the above examples and may be variously changed. As an example, the first and second interconnection lines CL1 and CL2 connected to the first electrode structure ST1 may be overlapped with the first electrode structure ST1, when viewed in a plan view. Also, the first and second interconnection lines CL1 and CL2 connected to the second electrode structure ST2 may be overlapped with the second electrode structure ST2, when viewed in a plan view.

According to some embodiments of the inventive concept, since, in each of the first and second electrode structures ST1 and ST2, the electrode portions EP positioned at the same level are connected to each other through the electrode connecting portion ECP, it is possible to simplify the interconnection structures (i.e., the first and second contact plugs CP1 and CP2 and the first and second interconnection lines CL1 and CL2) connected to each of the first and second electrode structures ST1 and ST2 and to increase a process margin in a process of forming the interconnection structures.

The 3D semiconductor memory device may further include vertical structures VS, a data storing layer DS, common source structures SP and CSP, and bit lines BL, which are disposed on the cell array region CAR.

For example, as shown in FIGS. 11A and 11B, a plurality of vertical structures VS may be provided on the cell array region CAR to penetrate the first and second electrode structures ST1 and ST2. The vertical structures VS may be provided to penetrate the electrode portions EP of the first and second electrodes ELa and ELb and may be electrically connected to the substrate 10. The vertical structures VS may be provided to form a zigzag arrangement in the first direction D1, when viewed in a plan view.

The vertical structures VS may include a semiconductor material or a conductive material. Bottom surfaces of the vertical structures VS may be positioned between top and bottom surfaces of the substrate 10. Contact pads may be provided on the vertical structures VS, respectively, and the bit line contact plugs BPLG may be respectively connected to the contact pads.

As an example, each of the vertical structures VS may include a lower semiconductor pattern LSP and an upper semiconductor pattern USP. As an example, the lower and upper semiconductor patterns LSP and USP may be formed of or include at least one of doped or intrinsic semiconductor materials (e.g., of silicon (Si), germanium (Ge), or compounds thereof) and may have different crystal structures. The lower and upper semiconductor patterns LSP and USP may have one of polycrystalline, amorphous, and single-crystalline structures. The lower and upper semiconductor patterns LSP and USP may be in an undoped state or may be doped to have the same conductivity type as the substrate 10.

The lower semiconductor pattern LSP may be provided to be in direct contact with the substrate 10 and to penetrate the lowermost one of the electrodes of the first and second electrode structures ST1 and ST2. The upper semiconductor pattern USP may include a first semiconductor pattern SP1 and a second semiconductor pattern SP2. The first semiconductor pattern SP1 may be coupled to the lower semiconductor pattern LSP and may have a pipe or macaroni shape with closed bottom and open top. An inner space of the first semiconductor pattern SP1 may be filled with an insulating gap-fill pattern VI. In addition, the first semiconductor pattern SP1 may be in contact with an inner surface of the second semiconductor pattern SP2 and the top surface of the lower semiconductor pattern LSP. In other words, the first semiconductor pattern SP1 may allow the second semiconductor pattern SP2 to be electrically connected to the lower semiconductor pattern LSP. The second semiconductor pattern SP2 may be a pipe or macaroni structure with open top and bottom. The second semiconductor pattern SP2 may be spaced apart from (i.e., in non-contact with) the lower semiconductor pattern LSP.

In some embodiments, the data storing layer DS may be disposed between the first and second electrode structures ST1 and ST2 and the vertical structures VS. The data storing layer DS may include a vertical insulating layer VP, which is provided to penetrate the electrodes EL, and a horizontal insulating layer HP, which is extended from a region between the electrodes EL and the vertical insulating layer VP to cover top and bottom surfaces of the electrodes EL.

In some embodiments, the 3D semiconductor device may be a NAND FLASH memory device. For example, the data storing layer DS interposed between the electrode structure ST and the vertical structure VS may include a tunnel insulating layer, a charge storing layer, and a blocking insulating layer. Data stored in the data storing layer DS may be changed using a Fowler-Nordheim FN tunneling effect, which may be caused by a voltage difference between the vertical structure VS and the electrodes EL of the electrode structure ST.

Common source regions CSR may be provided in the substrate 10 and between the electrode portions EP of the electrode structures on the cell array region CAR. The common source regions CSR may extend parallel to the electrode portions EP of the electrode structures or in the first direction D1. In some embodiments, the common source regions CSR may be formed by doping the substrate 10 with impurities of a second conductivity type. The common source regions CSR may be doped with, for example, n-type impurities (e.g., arsenic (As) or phosphorus (P)).

The common source plug CSP may be coupled to the common source region CSR, and an insulating sidewall spacer SP may be interposed between the common source plug CSP and the electrode portions EP of the first and second electrode structures ST1 and ST2. The common source plug CSP may have a substantially uniform top width and may extend parallel to the electrode portions EP or in the first direction D1.

An insulating gapfill layer 20 may be provided on the substrate 10 to cover the electrode structures ST. The insulating gapfill layer 20 may have a substantially flat top surface and may have a thickness increasing in a direction from the cell array region CAR toward the connection region CNR. For example, the insulating gapfill layer 20 may be provided to cover the first and second pad regions P1 and P2 or the protrusions PP of the first and second electrode structures ST1 and ST2, on the connection region CNR.

A capping insulating layer 30 may be provided on the insulating gapfill layer 20, and the bit lines BL may be provided on the capping insulating layer 30 to extend in the second direction D2 and to cross the electrode portions EP of the first and second electrode structures ST1 and ST2. The bit lines BL may be electrically connected to the vertical structure VS through the bit line contact plug BPLG. Also, the first and second interconnection lines CL1 and CL2 may be provided on the capping insulating layer 30 and may be connected to the first and second contact plugs CP1 and CP2.

Figure 11C:
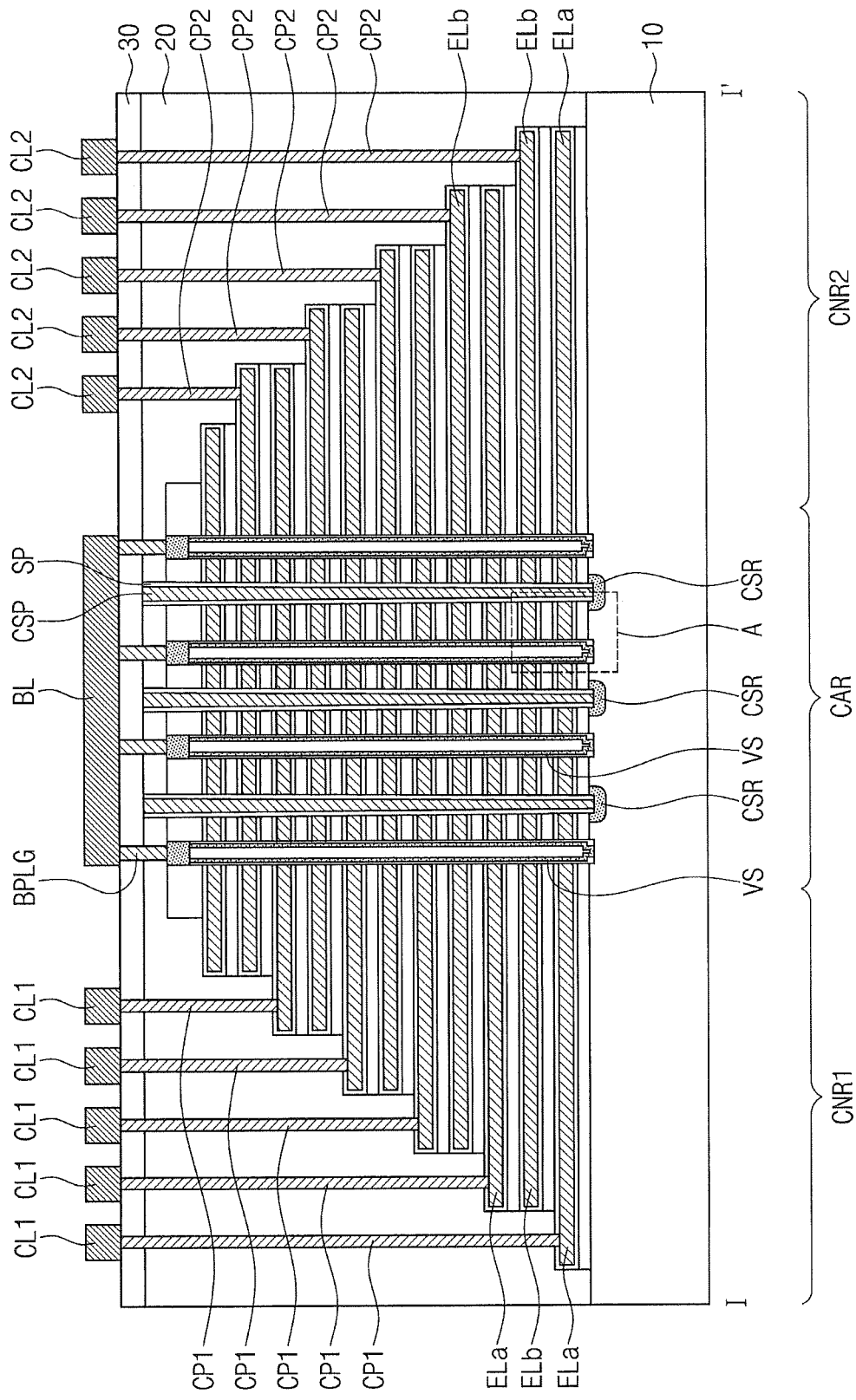
FIG. 11C is a sectional view, which is taken along line I-I' of FIG. 9 to illustrate a 3D semiconductor memory device according to some embodiments of the inventive concept.
Figure 11D:
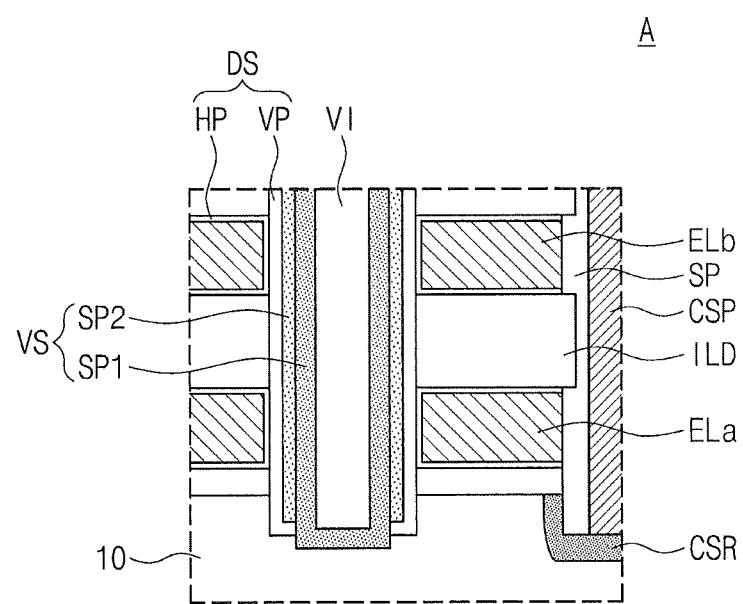
FIG. 11D is an enlarged sectional view of a portion 'A' of FIG. 11C.

FIG. 11C is a sectional view, which is taken along line I-I' of FIG. 9 to illustrate a 3D semiconductor memory device according to some embodiments of the inventive concept, and FIG. 11D is an enlarged sectional view of a portion 'A' of FIG. 11C. For concise description, an element previously described with reference to FIGS. 3 to 11B may be identified by a similar or identical reference number without repeating an overlapping description thereof.

Referring to FIGS. 11C and 11D, the vertical structures VS may be provided to penetrate the first and second electrode structures ST1 and ST2 on the cell array region CAR. The vertical structures VS may be provided to penetrate the electrode portions EP of the first and second electrodes ELa and ELb and may be electrically connected to the substrate 10.

In some embodiments, each of the vertical structures VS may include the first semiconductor pattern SP1, which is provided to penetrate the electrode structures ST and to be in contact with the substrate 10, and the second semiconductor pattern SP2, which is interposed between the electrode structures ST and the first semiconductor pattern SP1.

In detail, the first semiconductor pattern SP1 may be provided to have a hollow pipe structure or a macaroni structure. The first semiconductor pattern SP1 may have a closed bottom, and an inner space of the first semiconductor pattern SP1 may be filled with the gap-fill insulating pattern VI. Alternatively, the first semiconductor pattern SP1 may be provided to have a circular solid pillar structure. The first semiconductor pattern SP1 may be in contact with an inner side surface of the second semiconductor pattern SP2 and a top surface of the substrate 10. In other words, the first semiconductor pattern SP1 may be provided to electrically connect the second semiconductor pattern SP2 to the substrate 10. In certain embodiments, the first semiconductor pattern SP1 may have a bottom surface that is positioned at a lower level than the top surface of the substrate 10.

The second semiconductor pattern SP2 may be a pipe or macaroni structure with open top and bottom. The second semiconductor pattern SP2 may have a bottom surface that is positioned at a higher level than a bottom surface of the first semiconductor pattern SP1 and is spaced apart from the substrate 10. Alternatively, the second semiconductor pattern SP2 may be in direct contact with the substrate 10.

The first and second semiconductor patterns SP1 and SP2 may be in an undoped state or may be doped to have the same conductivity type as the substrate 10. The first and second semiconductor patterns SP1 and SP2 may be provided to have a polycrystalline or single crystalline structure.

Figure 11E:
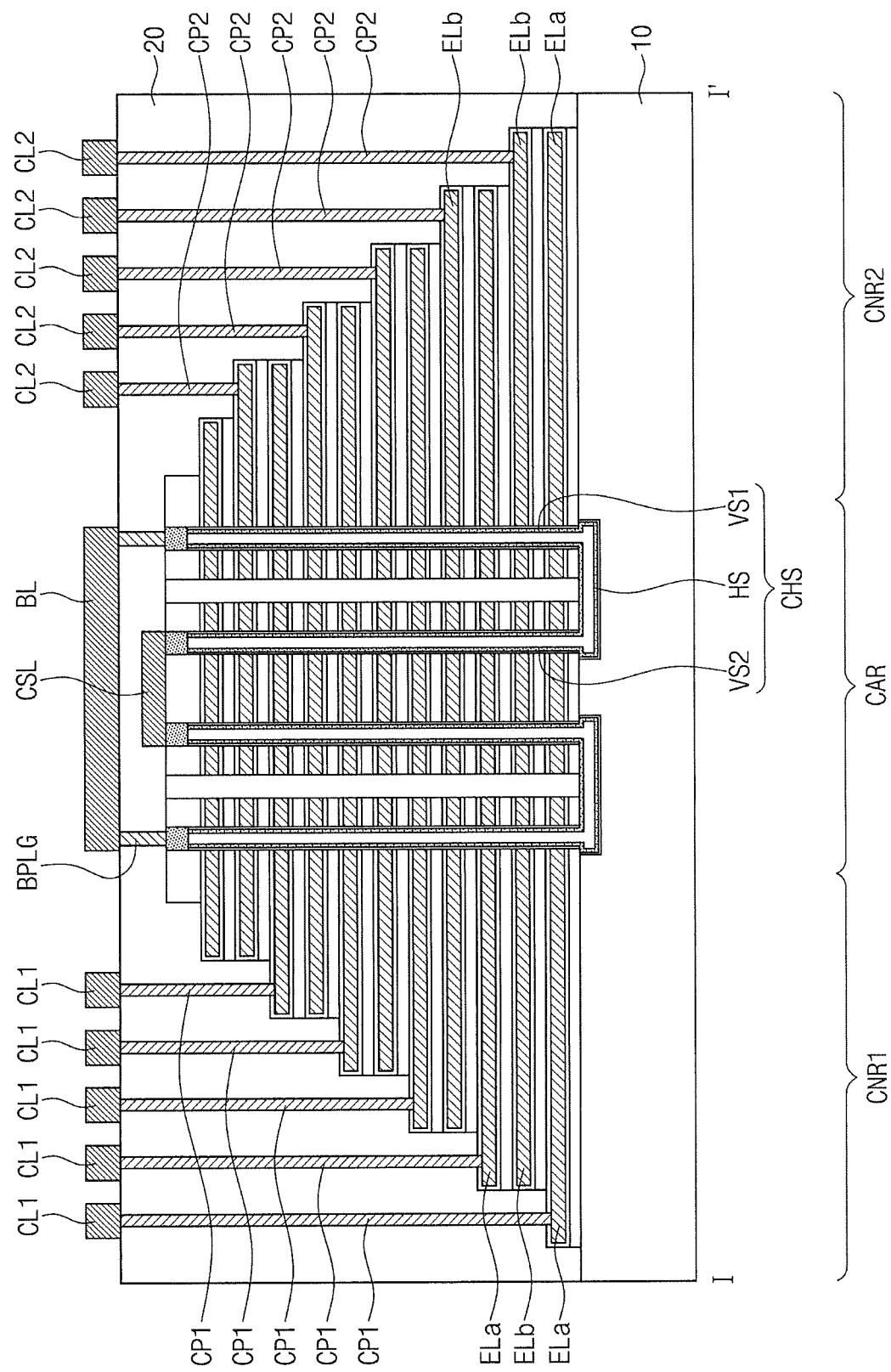
FIG. 11E is a sectional view illustrating another example of a 3D semiconductor memory device according to some embodiments of the inventive concept.

FIG. 11E is a sectional view illustrating another example of a 3D semiconductor memory device according to some embodiments of the inventive concept. For concise description, an element previously described with reference to FIGS. 3 to 11B may be identified by a similar or identical reference number without repeating an overlapping description thereof.

Referring to FIG. 11E, channel structures CHS may be provided on the cell array region CAR to penetrate the first and second electrode structures ST1 and ST2. For example, the channel structures CHS may be provided to penetrate the electrode portions EP of the first and second electrodes ELa and ELb.

In some embodiments, each of the channel structures CHS may include first and second vertical channels VS1 and VS2, which are provided to penetrate the first and second electrode structures ST1 and ST2, and a horizontal channel HS, which is provided below the first and second electrode structures ST1 and ST2 to connect the first and second vertical channels VS1 and VS2 to each other. The first and second vertical channels VS1 and VS2 may be provided in vertical holes penetrating the first and second electrode structures ST1 and ST2. The horizontal channel HS may be provided in a recess region, which is formed in an upper portion of the substrate 10. The horizontal channel HS may be provided between the substrate 10 and the first and second electrode structures ST1 and ST2 to connect the first and second vertical channels VS1 and VS2 to each other.

As an example, the horizontal channel HS may be a hollow structure (e.g., a pipe or a macaroni), which is continuously connected to the first and second vertical channels VS1 and VS2. For example, the first and second vertical channels VS1 and VS2 and the horizontal channel HS may be connected to form a single pipe-shaped structure. In other words, the first and second vertical channels VS1 and VS2 and the horizontal channel HS may be a single continuous semiconductor pattern that is substantially absent of any interface. Here, the semiconductor pattern may be formed of or include a semiconductor material and may have a single crystalline structure, an amorphous structure, or a polycrystalline structure. In addition, as described above, the data storing layer may be interposed between the channel structures CHS and the first and second electrodes ELa and ELb.

In some embodiments, the first vertical channel VS1 of each channel structure CHS may be connected to a corresponding one of the bit lines BL, and the second vertical channel VS2 may be connected to a common source line CSL. The channel structures CHS may be electrically separated from each other, and electric potential of each of the channel structures CHS may be controlled by voltages applied to the first and second electrode structures ST1 and ST2. For example, the electric potential of each of the channel structures CHS may be controlled to selectively form a current path between the bit line BL and the common source line CSL.

Figure 12:
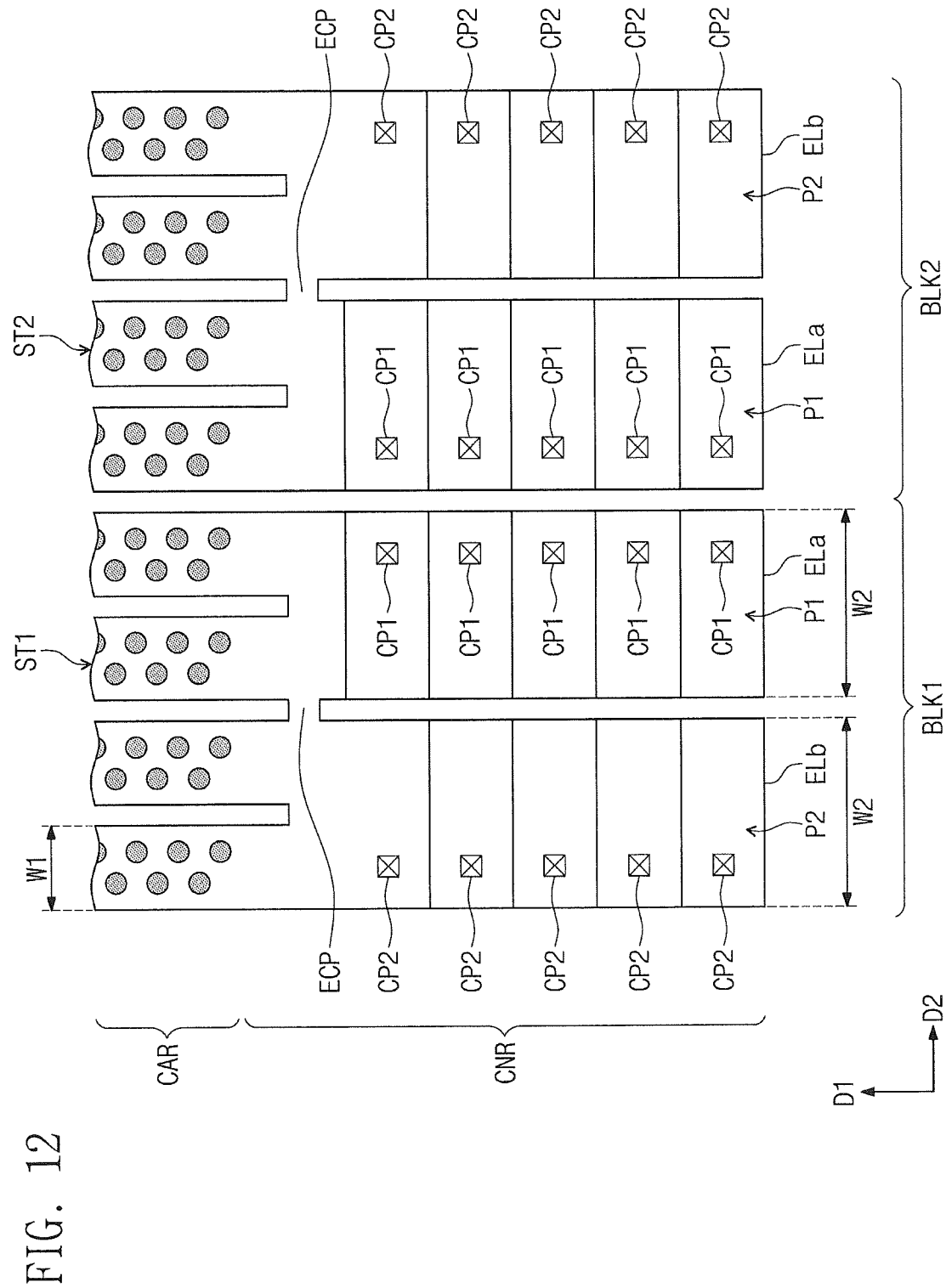
FIG. 12 is a plan view illustrating another example of an electrode structure of a 3D semiconductor memory device according to some embodiments of the inventive concept.
Figure 13A:
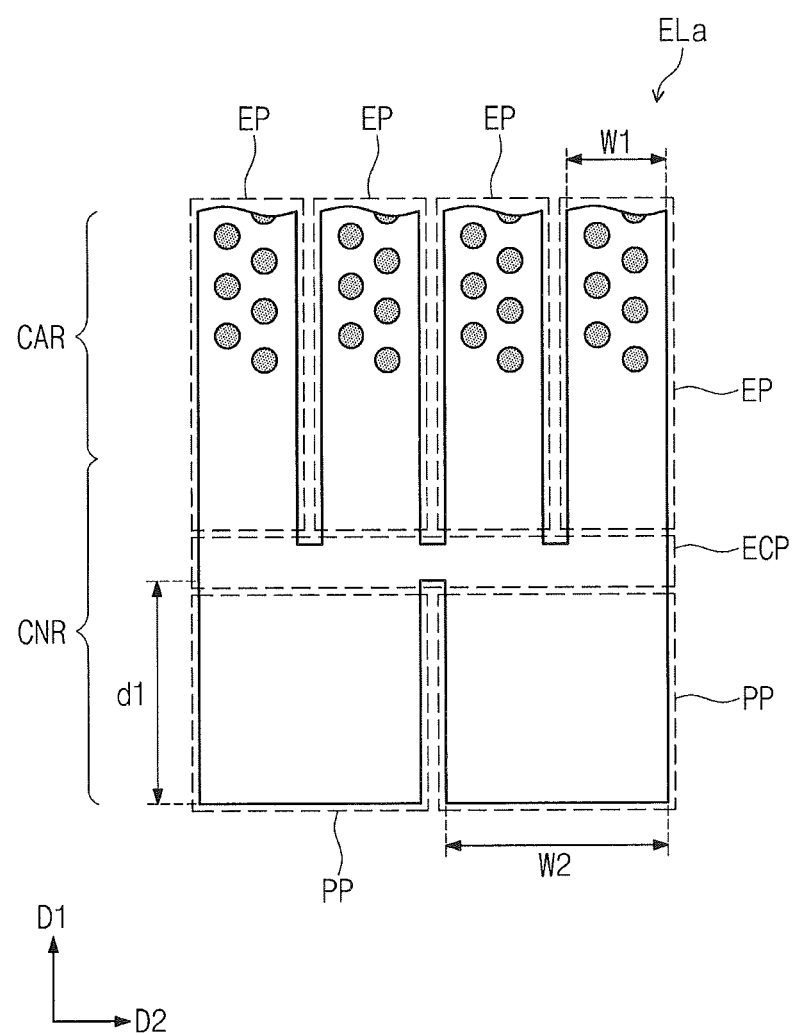
FIG. 13A is a plan view illustrating one of first electrodes of electrode structures shown in FIG. 12.
Figure 13B:
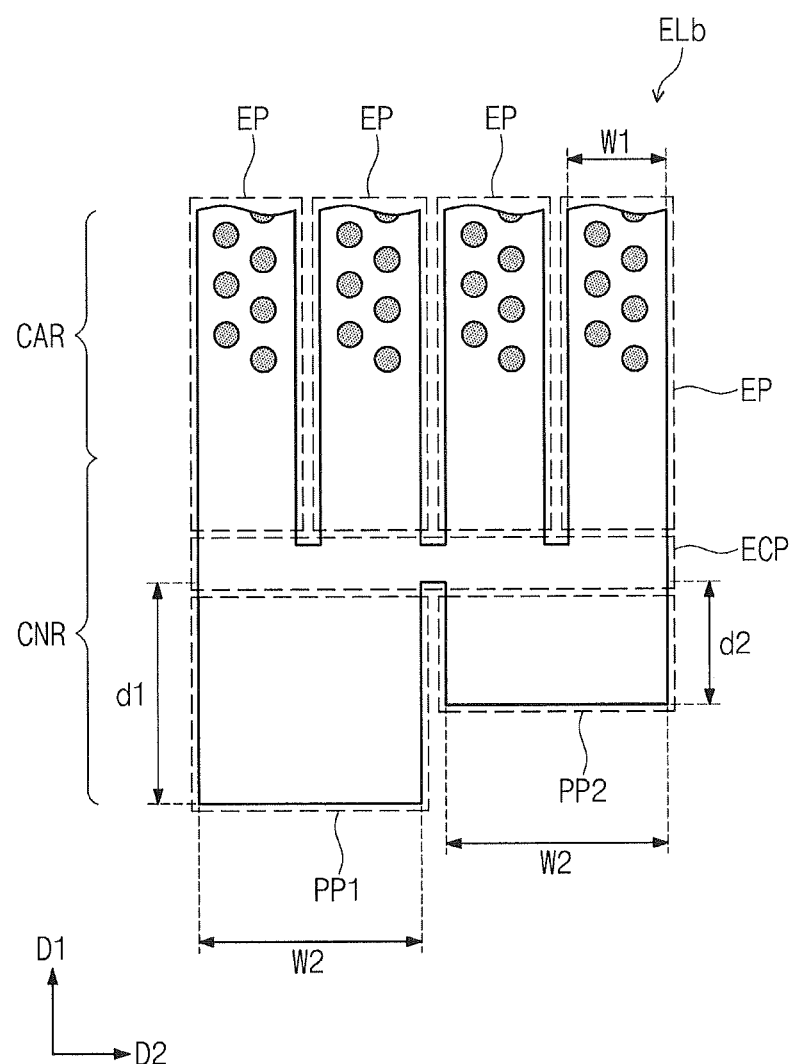
FIG. 13B is a plan view illustrating one of second electrodes of the electrode structures shown in FIG. 12.

FIG. 12 is a plan view illustrating another example of an electrode structure of a 3D semiconductor memory device according to some embodiments of the inventive concept. FIG. 13A is a plan view illustrating one of first electrodes of electrode structures shown in FIG. 12, and FIG. 13B is a plan view illustrating one of second electrodes of the electrode structures shown in FIG. 12. In the description that follows, a discussion of features identical to those of FIGS. 3 to 11B will be minimized in order to avoid redundancy.

Referring to FIGS. 12, 13A, and 13B, the first and second electrode structures ST1 and ST2 may be provided on the substrate 10 to be spaced apart from each other in the second direction D2. Each of the first and second electrode structures ST1 and ST2 may include the first electrodes ELa and the second electrodes ELb, which are vertically and alternatingly stacked on the substrate 10.

As described above, each of the first electrodes ELa may include the first pad region P1, which is located on the connection region CNR and is exposed by the second electrode ELb thereon, and each of the second electrodes ELb may include the second pad region P2, which is located on the connection region CNR and is exposed by the first electrode ELa thereon. Here, the first pad regions P1 of the first electrodes ELa may be adjacent to the second pad regions P2 of the second electrodes ELb in the second direction D2. Also, the first pad regions P1 of the first electrode structure ST1 may be adjacent to the first pad regions P1 of the second electrode structure ST2 in the second direction D2.

Referring to FIG. 13A, each of the first electrodes ELa of the first and second electrode structures ST1 and ST2 may include a plurality of the electrode portions EP, the electrode connecting portion ECP, and one or more protrusions PP. The electrode portions EP may be provided on the cell array region CAR to extend in the first direction D1 and may be spaced apart from each other in the second direction D2. On the connection region CNR adjacent to the cell array region CAR, the electrode connecting portion ECP may extend in the second direction D2 to horizontally connect the electrode portions EP to each other. The protrusions PP may be extended from the electrode connecting portion ECP in the first direction D1 and may be spaced apart from each other in the second direction D2. As an example, each of the protrusions PP may have the second width W2 in the second direction D2, and here, the second width W2 may be greater than the first width W1 of the electrode portions EP. When measured in the second direction D2, a distance between the protrusions PP may be substantially equal to a distance between the electrode portions EP. All of the protrusions PP of the first electrode ELa may have the first length d1, when measured from the electrode connecting portion ECP in the first direction D1. In addition, at least one of the protrusions PP of the first electrode ELa may include a portion serving as the first pad region P1.

Referring to FIG. 13B, each of the first electrodes ELa of the first and second electrode structures ST1 and ST2 may include a plurality of the electrode portions EP, the electrode connecting portion ECP, and one or more protrusions PP. The protrusions PP of the second electrode ELb may include the first protrusion PP1, which is extended from the electrode connecting portion ECP by the first length dl in the first direction D1, and the second protrusion PP2, which is extended from the electrode connecting portion ECP by the second length d2 shorter than the first length d1 in the first direction D1. Each of the first and second protrusions PP1 and PP2 may have the second width W2 in the second direction D2, and the second width W2 may be larger than the first width W1 of the electrode portions EP. When measured in the second direction D2, a distance between the first and second protrusions PP1 and PP2 may be substantially equal to a distance between the electrode portions EP. The first protrusion PP1 of the second electrode ELb may include a portion serving as the second pad region P2.

Referring back to FIG. 12, the first and second electrodes ELa and ELb may be alternatingly stacked on the substrate 10, and the electrode connecting portions ECP of the first and second electrodes ELa and ELb may be overlapped with each other, when viewed in a plan view. In other words, the electrode connecting portion ECP of the second electrode ELb may be disposed on the electrode connecting portion ECP of the first electrode ELa. Furthermore, the lengths d1 and d2, in the first direction D1, of the protrusions PP of the first and second electrodes ELa and ELb may decrease with increasing vertical distance from the substrate 10.

Figure 14:
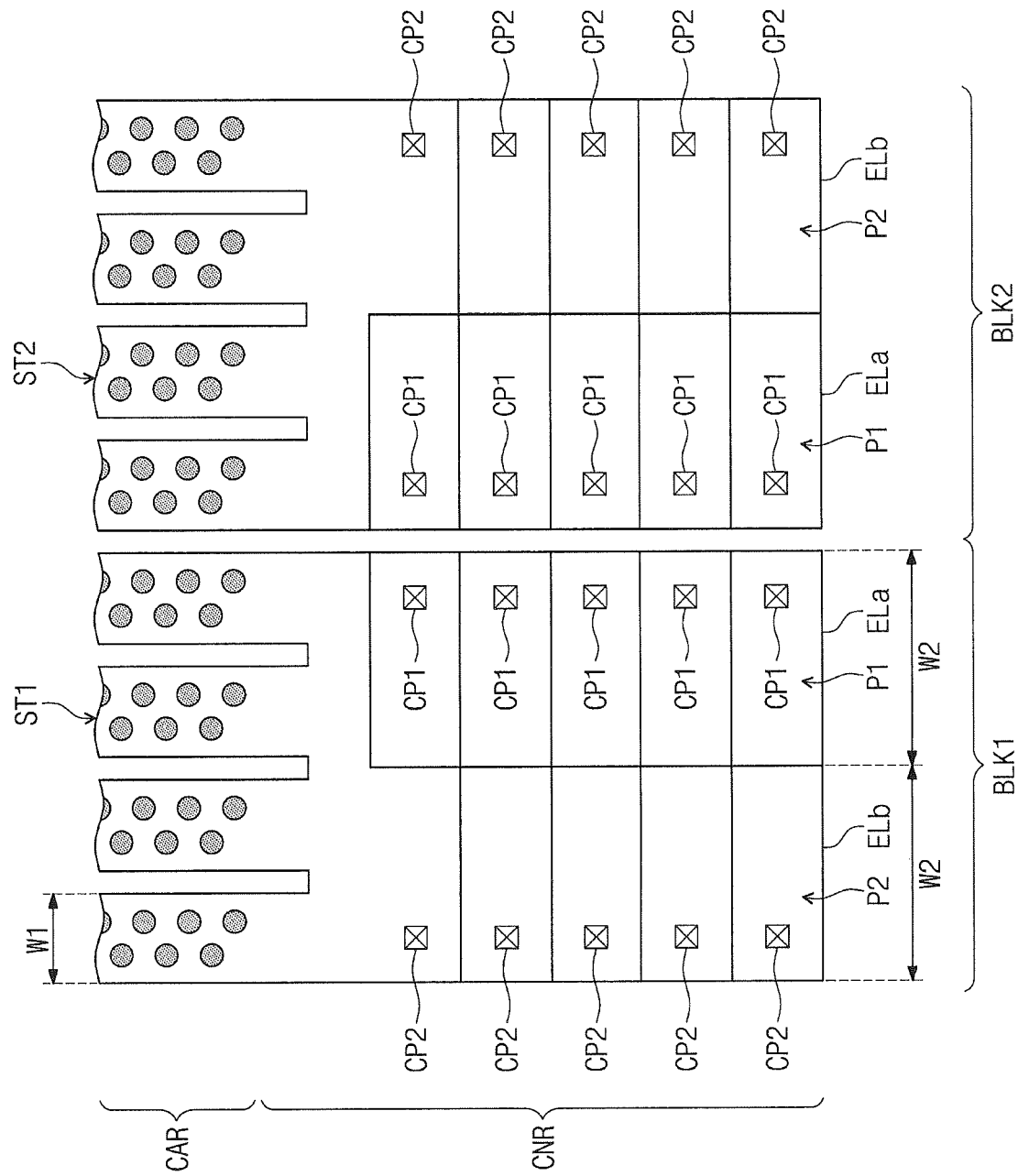
FIG. 14 is a plan view illustrating another example of an electrode structure of a 3D semiconductor memory device according to some embodiments of the inventive concept.
Figure 15A:
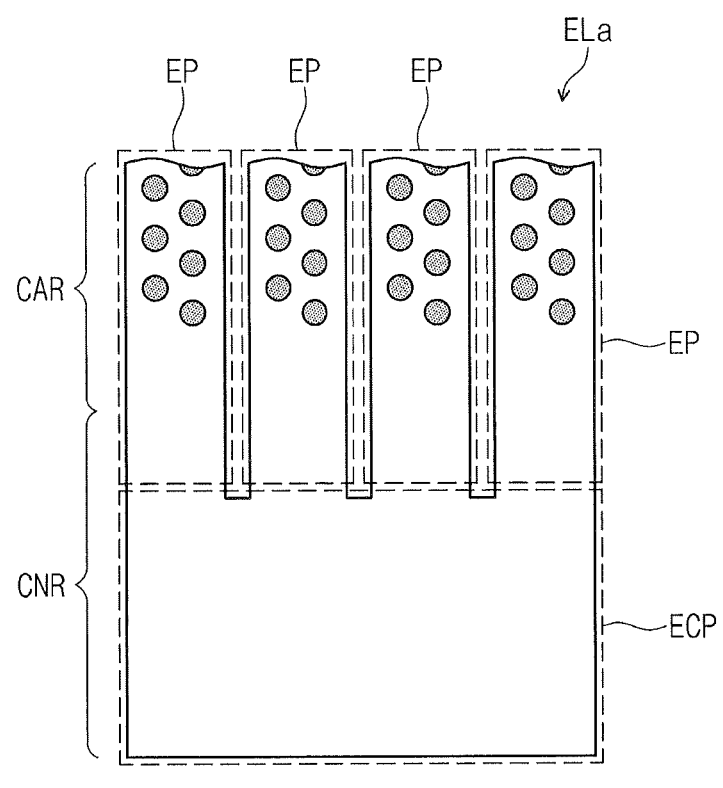
FIG. 15A is a plan view illustrating one of first electrodes of electrode structures shown in FIG. 14.
Figure 15B:
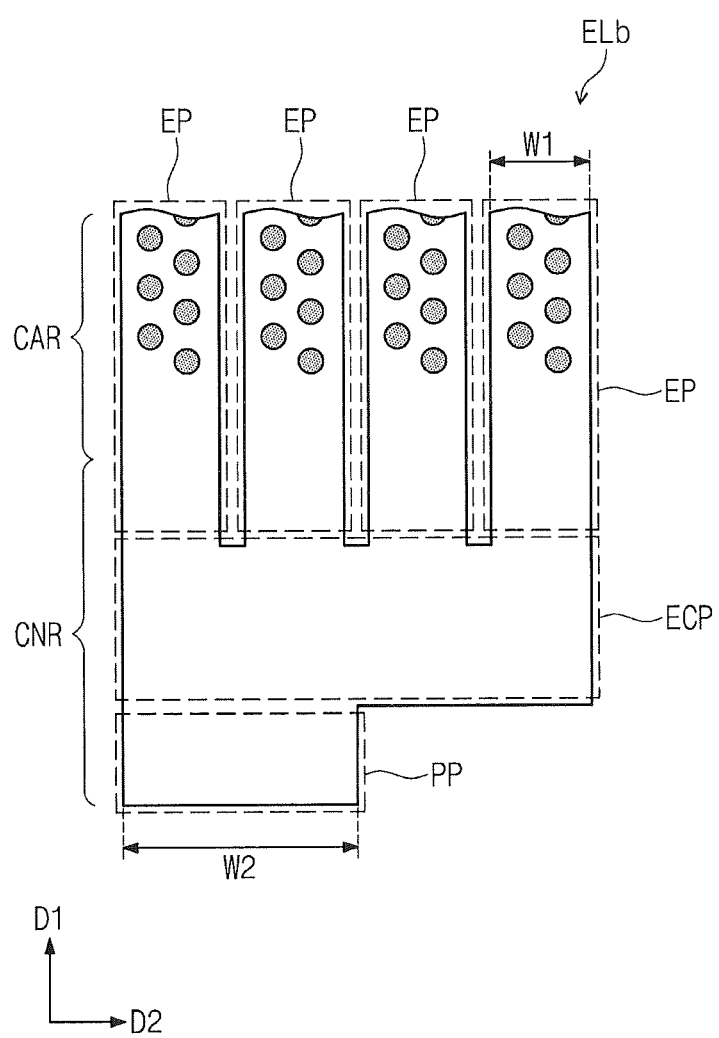
FIG. 15B is a plan view illustrating one of second electrodes of the electrode structures shown in FIG. 14.

FIG. 14 is a plan view illustrating another example of an electrode structure of a 3D semiconductor memory device according to some embodiments of the inventive concept. FIG. 15A is a plan view illustrating one of first electrodes of electrode structures shown in FIG. 14, and FIG. 15B is a plan view illustrating one of second electrodes of the electrode structures shown in FIG. 14. In the description that follows, a discussion of features identical to those of FIGS. 3 to 11B will be minimized in order to avoid redundancy.

Referring to FIGS. 14, 15A, and 15B, each of the first and second electrode structures ST1 and ST2 may include the first and second electrodes ELa and ELb, which are vertically and alternatingly stacked on the substrate 10. The first electrodes ELa of the first and second electrode structures ST1 and ST2 may include the first pad region P1, which is positioned on the connection region CNR and is exposed by the second electrode ELb positioned thereon, and each of the second electrodes ELb may include the second pad region P2, which is positioned on the connection region CNR and is exposed by the first electrode ELa positioned thereon. Here, the first pad regions P1 of the first electrodes ELa may be adjacent to the second pad regions P2 of the second electrodes ELb in the second direction D2. Also, the first pad regions P1 of the first electrode structure ST1 may be adjacent to the first pad regions P1 of the second electrode structure ST2 in the second direction D2.

Referring to FIG. 15A, each of the first electrodes ELa may include a plurality of the electrode portions EP, which are provided on the cell array region CAR to extend in the first direction D1, and the electrode connecting portion ECP, which extends in the second direction D2 and horizontally connects the electrode portions EP to each other. In some embodiments, a side surface of the electrode connecting portion ECP of the first electrode ELa may be aligned to a side surface of the protrusion PP of the second electrode ELb positioned thereon. As an example, a portion of the electrode connecting portion ECP of the first electrode ELa may be exposed by the second electrode ELb positioned thereon, and the exposed portion of the electrode connecting portion ECP exposed by the second electrode ELb may serve as the first pad region P1.

Referring to FIG. 15B, each of the second electrodes ELb may include a plurality of the electrode portions EP, which are provided on the cell array region CAR to extend in the first direction D1, the electrode connecting portion ECP, and the protrusion PP. As an example, a width of the protrusion PP of the second electrode ELb may be equal to or greater than two times the width of the electrode portions EP. The protrusion PP of the second electrode ELb may have the second pad region P2, and a side surface of the protrusion PP of the second electrode ELb may be aligned to a side surface of the electrode connecting portion ECP of the first electrode ELa positioned therebelow.

Referring back to FIG. 14, the first and second electrodes ELa and ELb may be alternatingly stacked on the substrate 10, and the electrode connecting portions ECP of the first and second electrodes ELa and ELb may be overlapped with each other, when viewed in a plan view. Furthermore, a length of the electrode connecting portion ECP of the first electrode ELa in the first direction D1 may decrease with increasing vertical distance from the substrate 10. Also, a length of the protrusion PP of the second electrode ELb in the first direction D1 may decrease with increasing vertical distance from the substrate 10.

Figure 17:
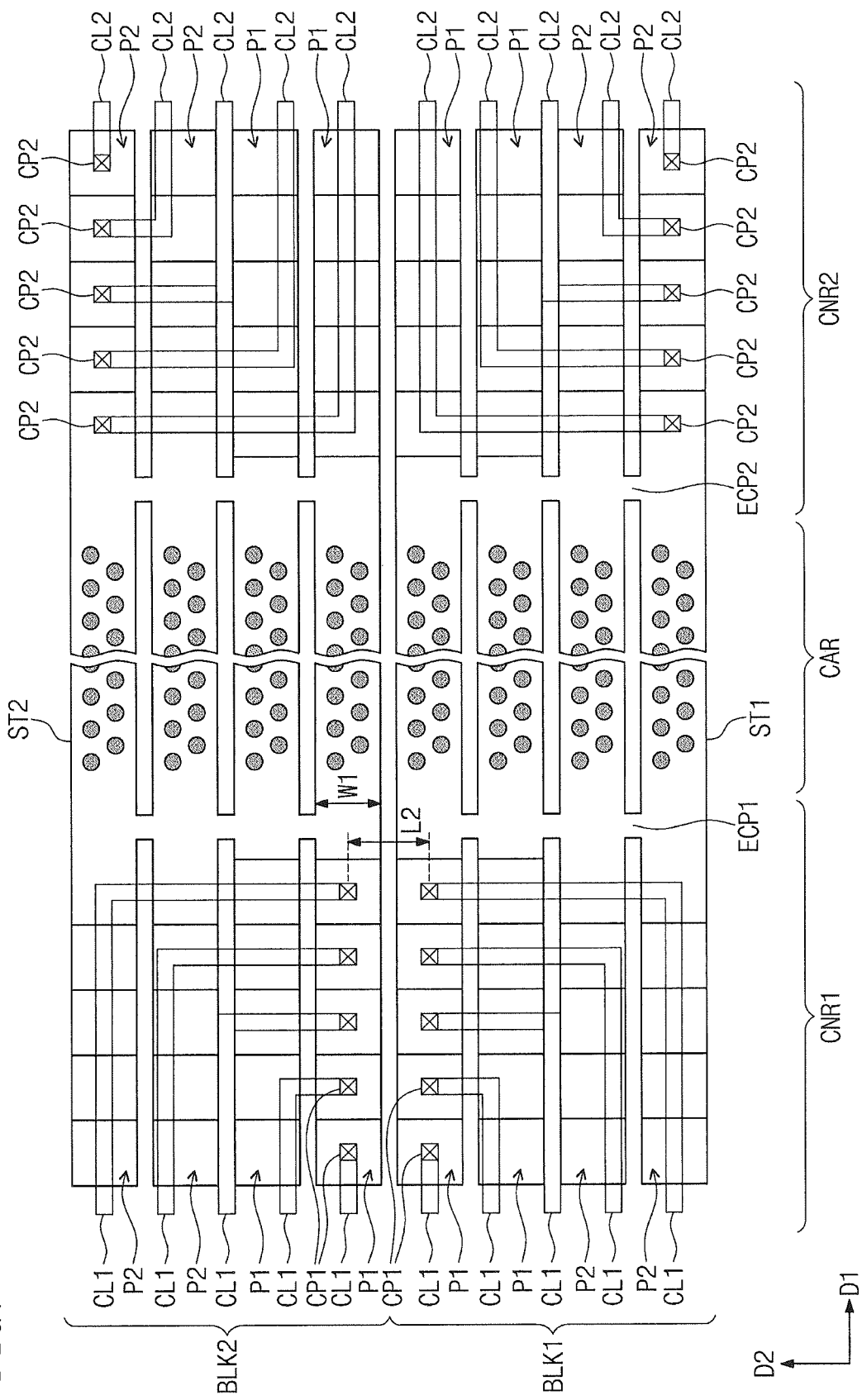
Figure 18:
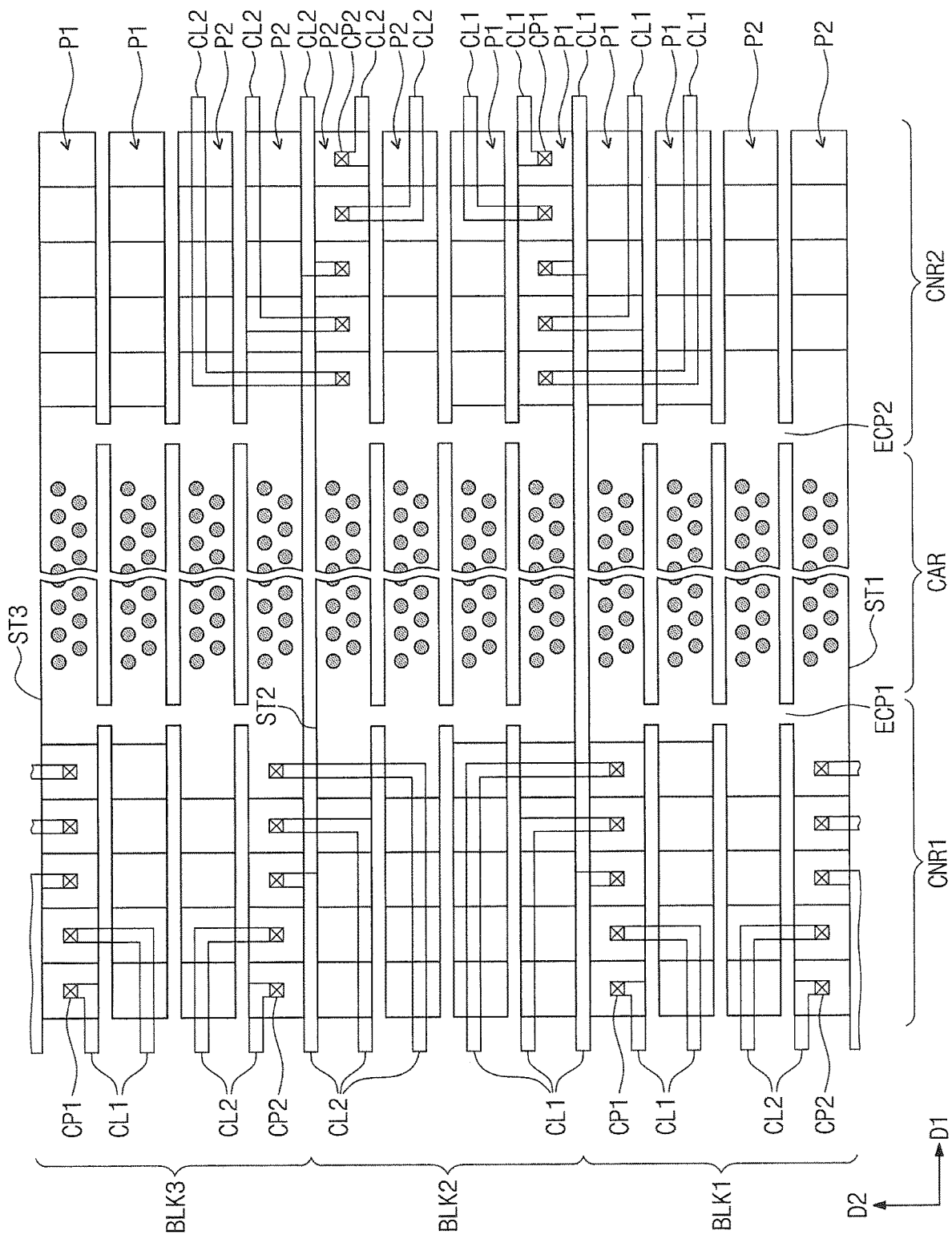

FIGS. 16, 17, and 18 are plan views illustrating a 3D semiconductor memory device according to some embodiments of the inventive concept.

Referring to FIGS. 16, 17, and 18, the substrate 10 may include a first connection region CNR1, a second connection region CNR2, and the cell array region CAR between the first and second connection regions CNR1 and CNR2. In some embodiments, the first and second connection regions CNR1 and CNR2 may be spaced apart from each other in the first direction D1.

The first and second electrode structures ST1 and ST2 may be provided on the substrate 10 to be spaced apart from each other in the second direction D2. The first and second electrode structures ST1 and ST2 may extend from the cell array region CAR to the first and second connection regions CNR1 and CNR2 in the first direction D1. Each of the first and second electrode structures ST1 and ST2 may include the first and second electrodes ELa and ELb, which are alternatingly and vertically stacked on the substrate 10. In some embodiments, lengths of the first and second electrodes ELa and ELb in the first direction D1 may decrease with increasing vertical distance from the substrate 10.

For example, in the first and second electrode structures ST1 and ST2, each of the first electrodes ELa may include the first pad regions P1 provided on each of the first and second connection regions CNR1 and CNR2. The first pad regions P1 of the first electrodes ELa may be exposed by the second electrodes ELb positioned thereon. Similarly, each of the second electrodes ELb may include the second pad regions P2 provided on each of the first and second connection regions CNR1 and CNR2. The second pad regions P2 of the second electrodes ELb may be exposed by the first electrodes ELa positioned thereon.

In some embodiments, in each of the first and second electrode structures ST1 and ST2, the first pad regions P1 of the first electrodes ELa may be arranged in the first direction D1, and the second pad regions P2 of the second electrodes ELb may be arranged in the first direction D1. The first pad regions P1 and the second pad regions P2 may be disposed adjacent to each other in the second direction D2. In other words, on each of the first and second connection regions CNR1 and CNR2, each of the first and second electrode structures ST1 and ST2 may have the first stair-step structure, which are formed by end portions of the first electrodes ELa, and the second stair-step structure, which are formed by end portions of the second electrodes ELb. Here, the first stair-step structure and the second stair-step structure may be adjacent to each other in the second direction D2. Furthermore, the first stair-step structure of the first electrode structure ST1 may be adjacent to the first stair-step structure of the second electrode structure ST2 in the second direction D2, and the second stair-step structure of the first electrode structure ST1 may be adjacent to the second stair-step structure of the second electrode structure ST2 in the second direction D2.

In some embodiments, similar to that shown in FIG. 5A, each of the first electrodes ELa may include a plurality of the electrode portions EP, which are provided on the cell array region CAR to extend in the first direction D1 and are spaced apart from each other in the second direction D2, a first electrode connecting portion ECP1, which is provided on the first connection region CNR1 to horizontally connect the electrode portions EP to each other, and a second electrode connecting portion ECP2, which is provided on the second connection region CNR2 to horizontally connect the electrode portions EP to each other. Each of the first electrodes ELa may include protrusions PP, which are provided on the first connection region CNR1 and are extended from the first electrode connecting portion ECP1 in the first direction D1, and protrusions PP, which are provided on the second connection region CNR2 and are extended from the second electrode connecting portion ECP2 in the first direction D1. As described with reference to FIG. 5A, the protrusions PP may have the same width as that of the electrode portions EP, when measured in in the second direction D2, and may be spaced apart from each other in the second direction D2. As an example, on the first and second connection regions CNR1 and CNR2, at least one of the protrusions PP of each of the first electrodes ELa may serve as the first pad region P1.

Similar to that shown in FIG. 5B, each of the second electrodes ELb may include a plurality of the electrode portions EP, the first electrode connecting portion ECP1, which is provided on the first connection region CNR1 to horizontally connect the electrode portions EP to each other, the second electrode connecting portion ECP2, which is provided on the second connection region CNR2 to horizontally connect the electrode portions EP to each other, and protrusions PP1 and PP2 protruding from first and second electrode connecting portions ECP1 and ECP2. As described with reference to FIG. 5B, the protrusions PP of the second electrode ELb may include the first protrusions PP1, which are extended from each of the first and second electrode connecting portions ECP1 and ECP2 by a first length in the first direction D1, and the second protrusions PP2, which are extended from each of the first and second electrode connecting portions ECP1 and ECP2 by a second length shorter than the first length. In addition, the first protrusions PP1 of each of the second electrodes ELb may include end portions which are positioned on the first and second connection regions CNR1 and CNR2 to serve as the second pad regions P2.

In the first and second electrode structures ST1 and ST2, the first contact plugs CP1 may be coupled to the first electrodes ELa, respectively, and the second contact plugs CP2 may be coupled to the second electrodes ELb, respectively.

As for the first electrode structure ST1, as shown in FIG. 16, the first contact plugs CP1 may be coupled to the first pad regions P1 of the first electrodes ELa, respectively, on the first connection region CNR1, and the second contact plugs CP2 may be coupled to the second pad regions P2 of the second electrodes ELb, respectively, on the second connection region CNR2. As for the second electrode structure ST2, the first contact plugs CP1 may be coupled to the first pad regions P1 of the first electrodes ELa, respectively, on the second connection region CNR2, and the second contact plugs CP2 may be coupled to the second pad regions P2 of the second electrodes ELb, respectively, on the first connection region CNR1.

On the first connection region CNR1, the first contact plugs CP1 coupled to the first electrode structure ST1 may be provided to be spaced apart from the second contact plugs CP2 coupled to the second electrode structure ST2 by the first horizontal distance L1 in the second direction D2. In some embodiments, the first horizontal distance L1 may be equal to or greater than two times the width of the electrode portions EP of the first and second electrodes ELa and ELb. Similarly, on the second connection region CNR2, the second contact plugs CP2 coupled to the first electrode structure ST1 may be provided to be spaced apart from the first contact plugs CP1 coupled to the second electrode structure ST2 by the first horizontal distance L in the second direction D2.

In some embodiments, the first interconnection lines CL1 may be coupled to the first contact plugs CP1 of the first and second electrode structures ST1 and ST2, respectively, and the second interconnection lines CL2 may be coupled to the second contact plugs CP2 of the first and second electrode structures ST1 and ST2, respectively. As an example, the first interconnection lines CL1 connected to the first contact plugs CP1 of the first electrode structure ST1 may be provided on the first connection region CNR1, and the second interconnection lines CL2 connected to the second contact plugs CP2 of the first electrode structure ST1 may be provided on the second connection region CNR2. The first interconnection lines CL1 connected to the first contact plugs CP1 of the second electrode structure ST2 may be provided on the second connection region CNR2, and the second interconnection lines CL2 connected to the second contact plugs CP2 of the second electrode structure ST2 may be provided on the first connection region CNR1.

As described above, each of the first and second interconnection lines CL1 and CL2 may include a first portion, which is provided to extend in the first direction D1, and a second portion, which is provided to extend in the second direction D2 and to be in contact with the first or second contact plug CP1 or CP2. Furthermore, the first interconnection lines CL1 connected to the first electrode structure ST1 may be disposed to be overlapped with the first electrode structure ST1, when viewed in a plan view. Similarly, the second interconnection lines CL2 connected to the second electrode structure ST2 may be disposed to be overlapped with the second electrode structure ST2, when viewed in a plan view. In some embodiments, the maximum length of the second portion in the first and second interconnection lines CL1 and CL2 may be shorter than the width of the first and second electrode structures ST1 and ST2 in the second direction D2.

As shown in FIG. 17, the first contact plugs CP1 coupled to the first and second electrode structures ST1 and ST2 may be disposed on the first connection region CNR1, and the second contact plugs CP2 coupled to the first and second electrode structures ST1 and ST2 may be disposed on the second connection region CNR2.

On the first connection region CNR1, the first contact plugs CP1 coupled to the first electrode structure ST1 may be spaced apart from the first contact plugs CP1 coupled to the second electrode structure ST2 by the second horizontal distance L2 in the second direction D2, where the second horizontal distance L2 may be substantially equal to or greater than the width W1 of the electrode portions of the first electrodes ELa.

The first interconnection lines CL1 connected to the first electrode structure ST1 and the first interconnection lines CL1 connected to the second electrode structure ST2 may be disposed in a mirror symmetric manner on the first connection region CNR1. Similarly, the second interconnection lines CL2 connected to the first electrode structure ST1 and the second interconnection lines CL2 connected to the second electrode structure ST2 may be disposed in a mirror symmetric manner on the second connection region CNR2.

As shown in FIG. 18, first to third cell array blocks BLK1, BLK2, and BLK3 may be arranged in the second direction D2 on the substrate 10, the first to third cell array blocks BLK1, BLK2, and BLK3 may include first to third electrode structures ST1, ST2, and ST3, respectively.

As described with reference to FIGS. 3 and 4, each of the first to third electrode structures ST1, ST2, and ST3 may be provided to have the first and second stair-step structures on the first and second connection regions CNR1 and CNR2. The first and second electrode structures ST1 and ST2 may be disposed in such a way that the first stair-step structures are adjacent to each other in the second direction D2, and the second and third electrode structures ST2 and ST3 may be disposed in such a way that the second stair-step structures are adjacent to each other in the second direction D2.

As an example, the first and second contact plugs CP1 and CP2 coupled to the first and third electrode structures ST1 and ST3 may be disposed on the first connection region CNR1. The first and second contact plugs CP1 and CP2 coupled to the second electrode structure ST2 may be disposed on the second connection region CNR2. This may make it possible to increase a distance between the first and second contact plugs CP1 and CP2 adjacent to each other in the second direction D2 or to increase a process margin in a contact forming process.

The first and second interconnection lines CL1 and CL2 connected to the first and third electrode structures ST1 and ST3 may be disposed on the first connection region CNR1, and the first and second interconnection lines CL1 and CL2 connected to the second electrode structure ST2 may be disposed on the second connection region CNR2.

The first and second interconnection lines CL1 and CL2 connected to the first electrode structure ST1 may be partially overlapped with a portion of the second electrode structure ST2, when viewed in a plan view. The first and second interconnection lines CL1 and CL2 connected to the second electrode structure ST2 may be overlapped with portions of the first and third electrode structures ST1 and ST3 adjacent to the second electrode structure ST2, when viewed in a plan view. Accordingly, it is possible to increase a horizontal space between the first interconnection lines CL1, on the first and second connection regions CNR1 and CNR2. In other words, it is possible to increase a degree of freedom for the first and second interconnection lines CL1 and CL2 connected to the first to third electrode structures ST1, ST2, and ST3.

Figure 19:
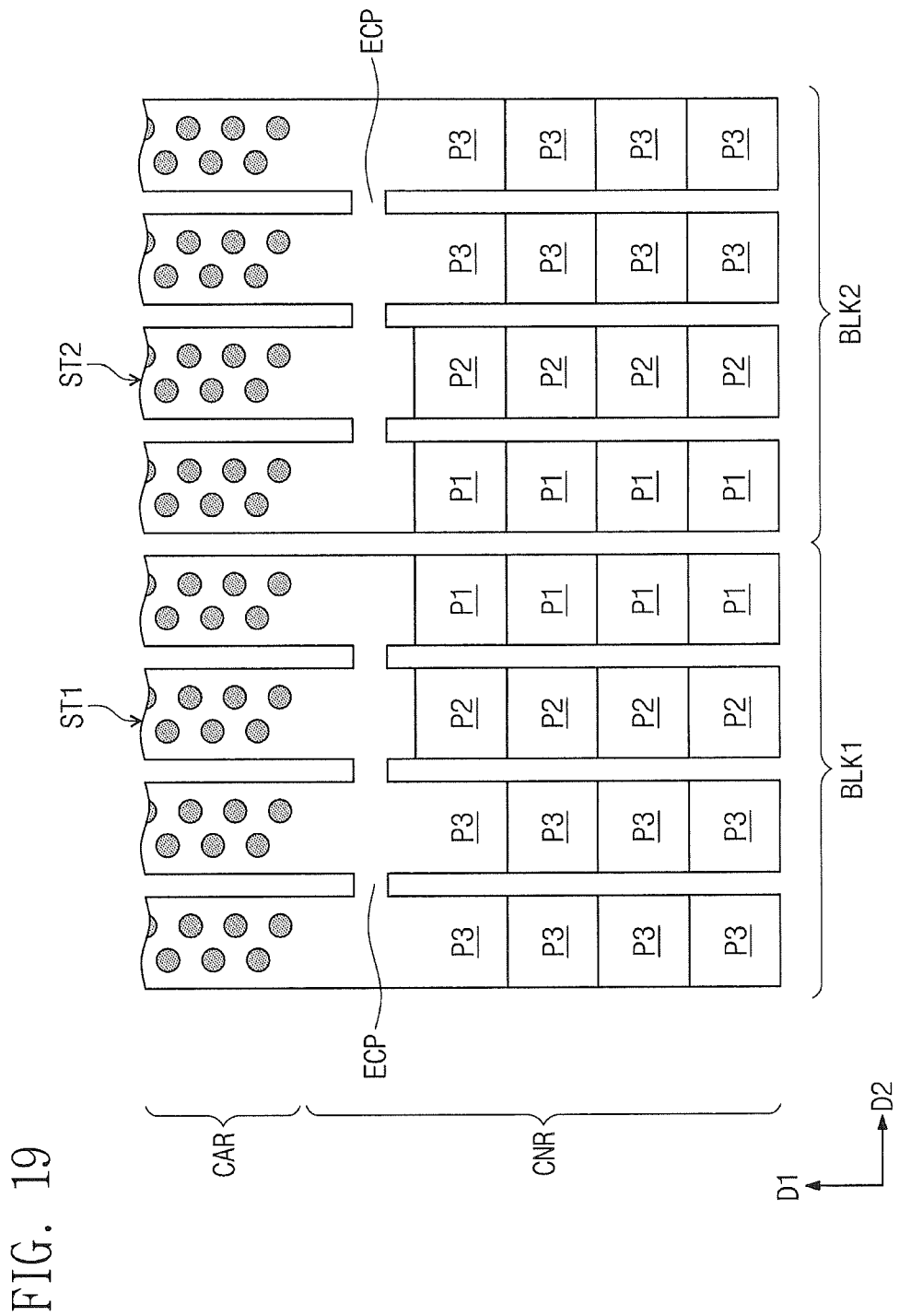
FIGS. 19 and 20 are plan and perspective views illustrating a cell array block of a 3D semiconductor memory device according to some embodiments of the inventive concept.
Figure 20:
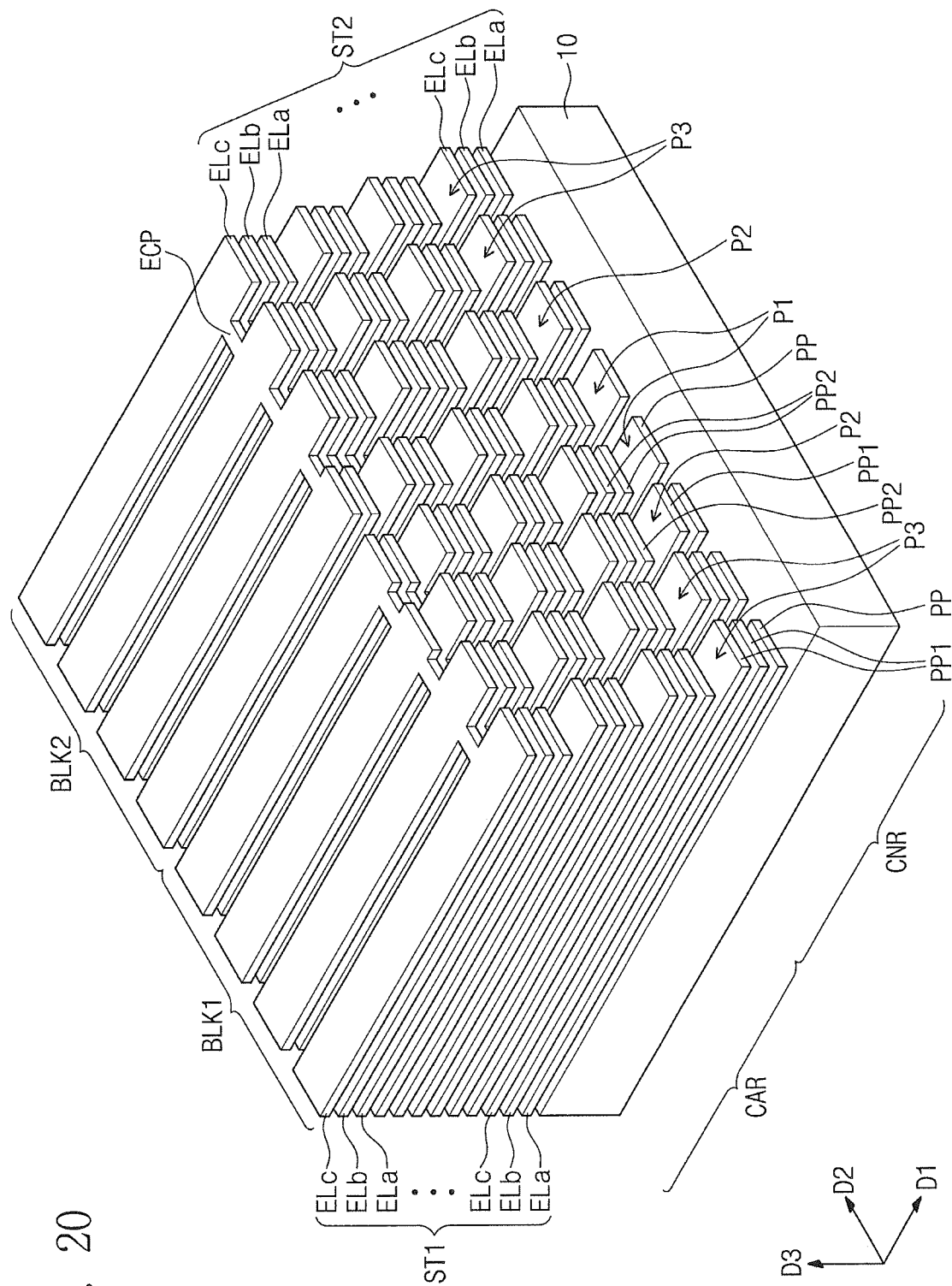

FIGS. 19 and 20 are plan and perspective views illustrating a cell array block of a 3D semiconductor memory device according to some embodiments of the inventive concept.

Referring to FIGS. 19 and 20, the substrate 10 may include the cell array region CAR and the connection region CNR. A plurality of cell array blocks may be provided on the substrate 10, and each of the cell array blocks may include the first and second electrode structures ST1 and ST2 extending from the cell array region CAR to the connection region CNR in the first direction D1.

Each of the first and second electrode structures ST1 and ST2 may include first, second, and third electrodes ELa, ELb, and ELc, which are consecutively stacked on the substrate 10. In some embodiments, the first to third electrodes ELa, ELb, and ELc may be repeatedly and vertically stacked on the substrate 10. Insulating layers may be interposed between the first to third electrodes ELa, ELb, and ELc.

Here, each of the first electrodes ELa may include the first pad region P1, which is located on the connection region CNR and is exposed by the second electrode ELb thereon, and each of the second electrodes ELb may include the second pad region P2, which is located on the connection region CNR and is exposed by the third electrode ELc positioned thereon. Each of the third electrodes ELc may include a third pad region P3, which is exposed by the first electrode ELa positioned thereon.

The first pad regions P1 of the first electrodes ELa may be arranged in the first direction D1, when viewed in a plan view, and moreover, they may be positioned at different vertical levels from the substrate 10. The second pad regions P2 of the second electrodes ELb and the third pad regions P3 of the third electrodes ELc may be configured to have substantially the same features as the first pad regions P1 of the first electrodes ELa. Accordingly, on the connection region CNR, each of the first and second electrode structures ST1 and ST2 may have a third stair-step structure, which is formed by the third pad regions P3 of the third electrodes ELc, in addition to the first stair-step structure, which is formed by the first pad regions P1 of the first electrodes ELa, and the second stair-step structure, which is formed by the second pad regions P2 of the second electrodes ELb.

The first to third pad regions P1, P2, and P3 may be arranged in the second direction D2, when viewed in a plan view. In other words, the first pad regions P1 may be adjacent to the second pad regions P2 in the second direction D2, and the third pad regions P3 may be adjacent to the second pad regions P2 in the second direction D2. In addition, the first to third pad regions P1, P2, and P3 which are adjacent to each other in the second direction D2 may be positioned at different vertical levels from the substrate 10. For example, vertical positions of the first to third pad regions P1, P2, and P3 may be lowered in a stepwise manner in the second direction D2, and thus, each of the first and second electrode structures ST1 and ST2 may have a stair-step structure in the second direction D2.

An adjacent pair of the first and second electrode structures ST1 and ST2 may be disposed in such a way that the first stair-step structures or the third stair-step structures thereof are adjacent to each other in the second direction D2. In other words, the first and second electrode structures ST1 and ST2 adjacent to each other in the second direction D2 may be disposed in a mirror symmetric manner on the connection region CNR.

In detail, as described with reference to FIG. 5A, each of the first electrodes ELa may include a plurality of the electrode portions EP, the electrode connecting portion ECP connecting the electrode portions EP to each other, and a plurality of the protrusions PP protruding from the electrode connecting portion ECP. Here, at least one of the protrusions PP of the first electrode ELa may include an end portion serving as the first pad region P1.

As described with reference to FIG. 5B, each of the second electrodes ELb may include a plurality of the electrode portions EP, the electrode connecting portion ECP connecting the electrode portions EP to each other, and the first and second protrusions PP1 and PP2 protruding from the electrode connecting portion ECP.

In each of the first and second electrode structures ST1 and ST2, the first protrusions PP1 of the second electrode ELb may be provided to cover the protrusions PP of the first electrode ELa positioned below the second electrode ELb and to have a side surface aligned to that of the protrusions PP of the first electrode ELa. Each of the second protrusions PP2 of the second electrode ELb may be provided to expose at least one of the protrusions PP of the first electrode ELa. At least one of the first protrusions PP1 of the second electrode ELb may include an end portion serving as the second pad region P2.

On the connection region CNR, each of the third electrodes ELc may be provided to expose portions of the first and second electrodes ELa and ELb positioned therebelow. For example, similar to the second electrode ELb, each of the third electrodes ELc may include a plurality of the electrode portions EP, the electrode connecting portion ECP connecting the electrode portions EP, and the first and second protrusions PP1 and PP2 protruding from the electrode connecting portion ECP. Here, the first protrusions PP1 may be extended from the electrode connecting portion ECP by a first length, and the second protrusions PP2 may be extended from the electrode connecting portion ECP by a second length shorter than the first length. The number of the first protrusions PP1 of the third electrode ELc may be smaller than the number of the first protrusions PP1 of the second electrode ELb.

Accordingly, in each of the first and second electrode structures ST1 and ST2, each of the third electrodes ELc may expose one of the first protrusions PP1 of the second electrode ELb positioned therebelow. The first protrusions PP1 of the third electrode ELc may be extended onto the first protrusions PP1 of the second electrode ELb positioned below the third electrode ELc and may have side surfaces that are aligned to side surfaces of the first protrusions PP1 of the second electrode ELb. The second protrusions PP2 of the third electrode ELc may be provided to expose at least one of the first protrusions PP1 of the second electrode ELb positioned below the third electrode ELc and at least one of the protrusions PP of the first electrode ELa positioned below the third electrode ELc. At least one of the first protrusions PP1 of the third electrode ELc may include an end portion serving as the third pad region P3.

As described above, the first to third electrodes ELa, ELb, and ELc may be vertically and repeatedly stacked on the substrate 10 such that the electrode connecting portions ECP and the electrode portions EP thereof are overlapped with each other, when viewed in a plan view.

Figure 21:
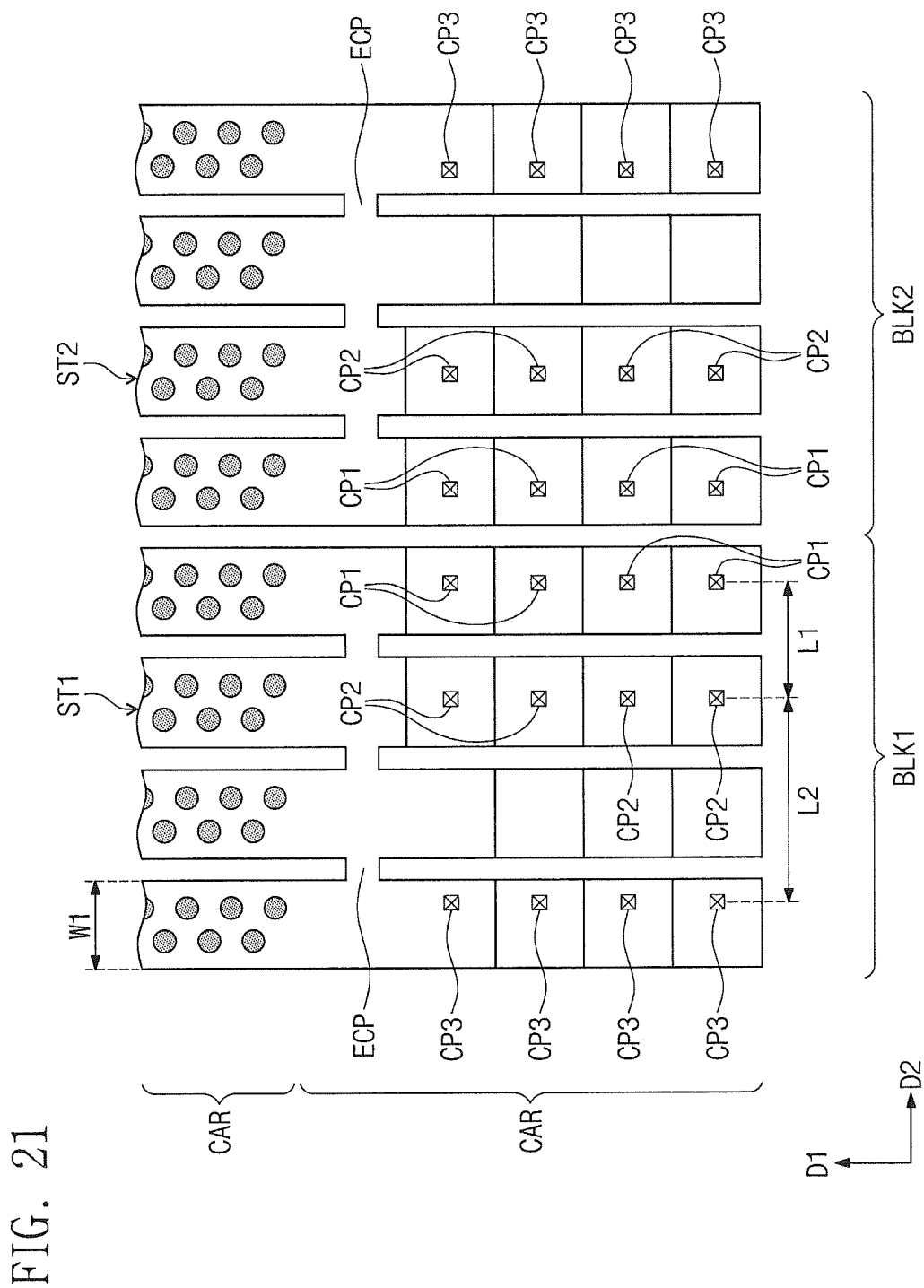
FIGS. 21 and 22 are plan and perspective views illustrating contact plugs connected to an electrode structure shown in FIGS. 19 and 20.
Figure 22:
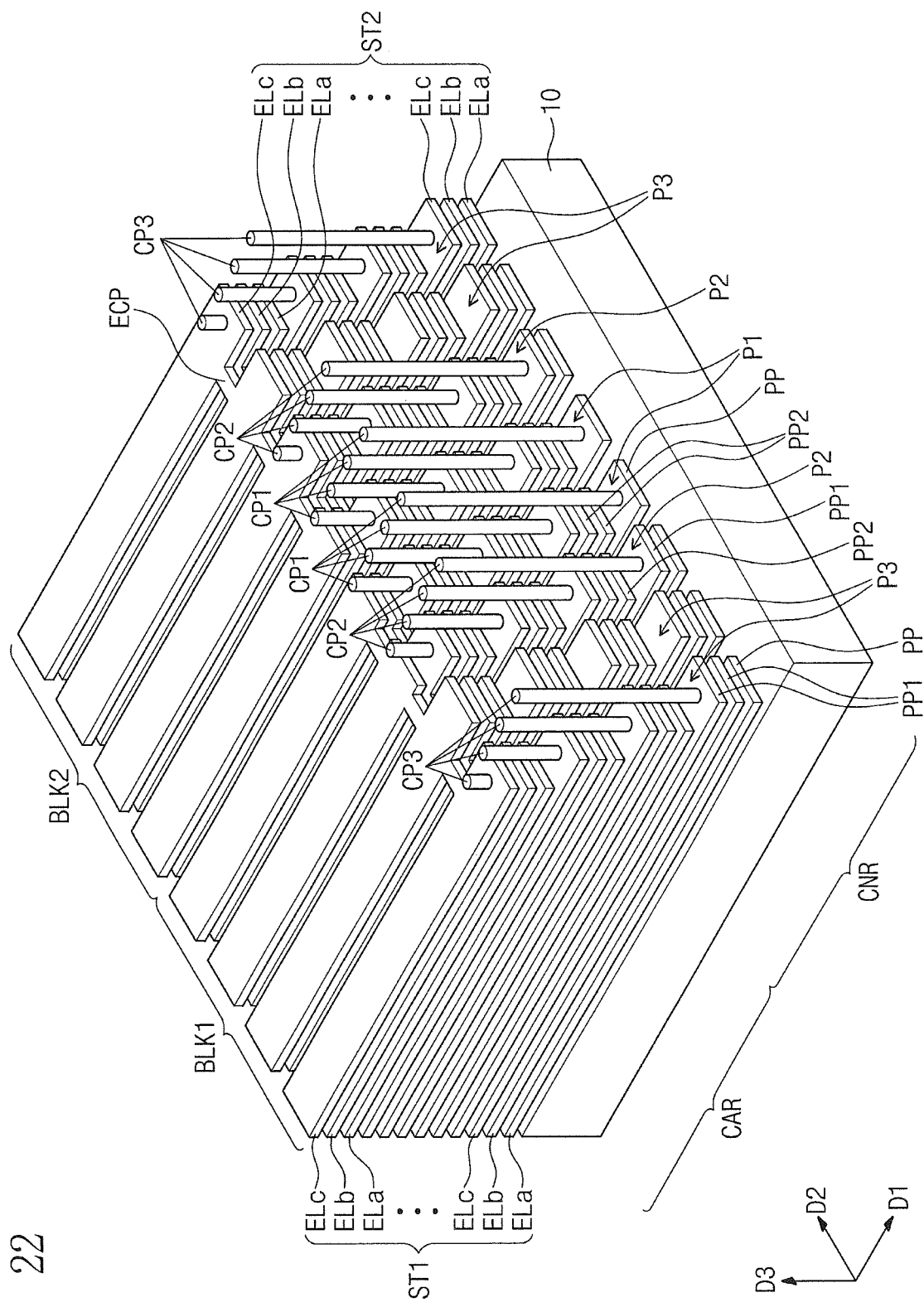

FIGS. 21 and 22 are plan and perspective views illustrating contact plugs connected to an electrode structure shown in FIGS. 19 and 20.

Referring to FIGS. 21 and 22, in each of the first and second electrode structures ST1 and ST2, the first contact plugs CP1 may be coupled to the first pad regions P1 of the first electrodes ELa, respectively, and the second contact plugs CP2 may be coupled to the second pad regions P2 of the second electrodes ELb, respectively. Also, third contact plugs CP3 may be coupled to the third pad regions P3 of the third electrodes ELc, respectively.

The first contact plugs CP1 and the second contact plugs CP2 may be disposed to be spaced apart from each other in the second direction D2, and the first horizontal distance L1 between adjacent ones of the first and second contact plugs CP1 and CP2 may be greater than the width W1 of the electrode portions EP of the first to third electrodes ELa, ELb, and ELc. The third contact plugs CP3 may be disposed to be horizontally spaced apart from the second contact plugs CP2 in the second direction D2, and the second horizontal distance L2 between adjacent ones of the second and third contact plugs CP2 and CP3 may be greater than the width W1 of the electrode portions EP of the first to third electrodes ELa, ELb, and ELc. As an example, the second horizontal distance L2 may be greater than or equal to the first horizontal distance L1.

In some embodiments, the number of the first contact plugs CP1 coupled to each of the first and second electrode structures ST1 and ST2 may be the same as the stacking number of the first electrodes ELa. The number of the second contact plugs CP2 coupled to each of the first and second electrode structures ST1 and ST2 may be the same as the stacking number of the second electrodes ELb, and the number of the third contact plugs CP3 coupled to each of the first and second electrode structures ST1 and ST2 may be the same as the stacking number of the third electrodes ELc. That is, in some embodiments, the stacking number of the electrodes constituting each of the first and second electrode structures ST1 and ST2 may be the same as the number of the contact plugs CP1, CP2, and CP3 coupled to each electrode structure. Furthermore, the vertical lengths of the first contact plugs CP1 may be different from each other, and the same may be true for the second and third contact plugs CP2 and CP3.

Figure 23:
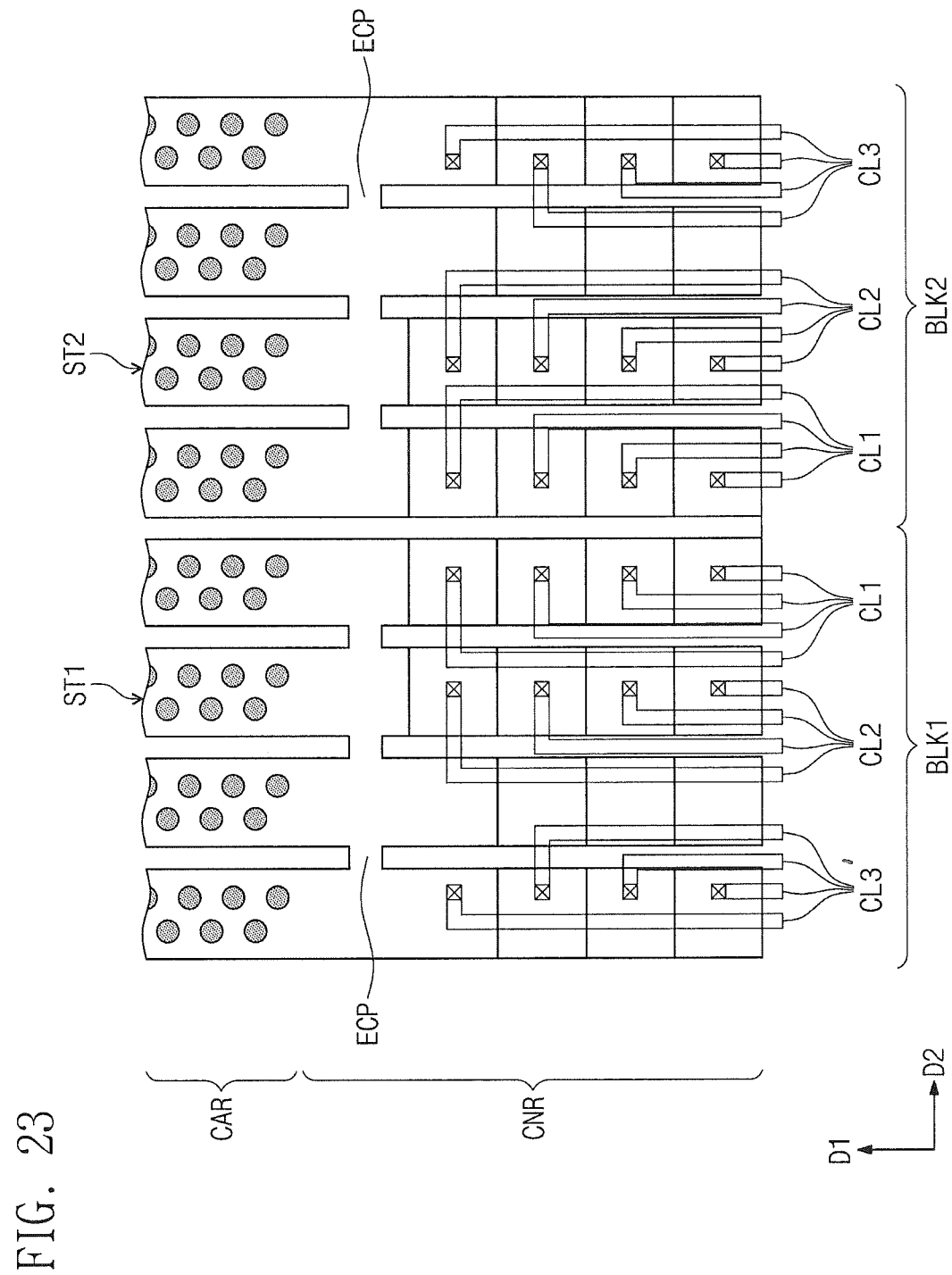
FIG. 23 is a plan view illustrating interconnection lines connected to an electrode structure shown in FIGS. 19 and 20.

FIG. 23 is a plan view illustrating interconnection lines connected to an electrode structure shown in FIGS. 19 and 20.

Referring to FIG. 23, the first interconnection lines CL1 may be provided on the connection region CNR to be coupled to the first contact plugs CP1 of the first electrode structure ST1, respectively, and the second interconnection lines CL2 may be provided on the connection region CNR to be coupled to the second contact plugs CP2 of the first electrode structure ST1, respectively. Also, third interconnection lines CL3 may be provided on the connection region CNR to be coupled to the third contact plugs CP3 of the first electrode structure ST1, respectively. The first to third interconnection lines CL1, CL2, and CL3 may be provided at the same vertical level from the substrate 10.

In some embodiments, the number of the first interconnection lines CL1 connected to the first electrodes ELa of the first electrode structure ST1 may be the same as the number of the first electrodes ELa, and the number of the second interconnection lines CL2 connected to the second electrodes ELb of the first electrode structure ST1 may be the same as the number of the second electrodes ELb. The number of the third interconnection lines CL3 connected to the third electrodes ELc of the first electrode structure ST1 may be the same as the number of the third electrodes ELc.

Each of the first to third interconnection lines CL1, CL2, and CL3 may include a first portion extending in the first direction D1 and a second portion extending in the second direction D2. On the first electrode structure ST1, the first portions of the first to third interconnection lines CL1, CL2, and CL3 may be spaced apart from each other by the same distance. The second portions of the first to third interconnection lines CL1, CL2, and CL3 may be in contact with the first to third contact plugs CP1, CP2, and CP3, respectively. In some embodiments, the first to third interconnection lines CL1, CL2, and CL3 connected to the first electrode structure ST1 may be overlapped with a portion of the first electrode structure ST1, when viewed in a plan view.

Figure 24:
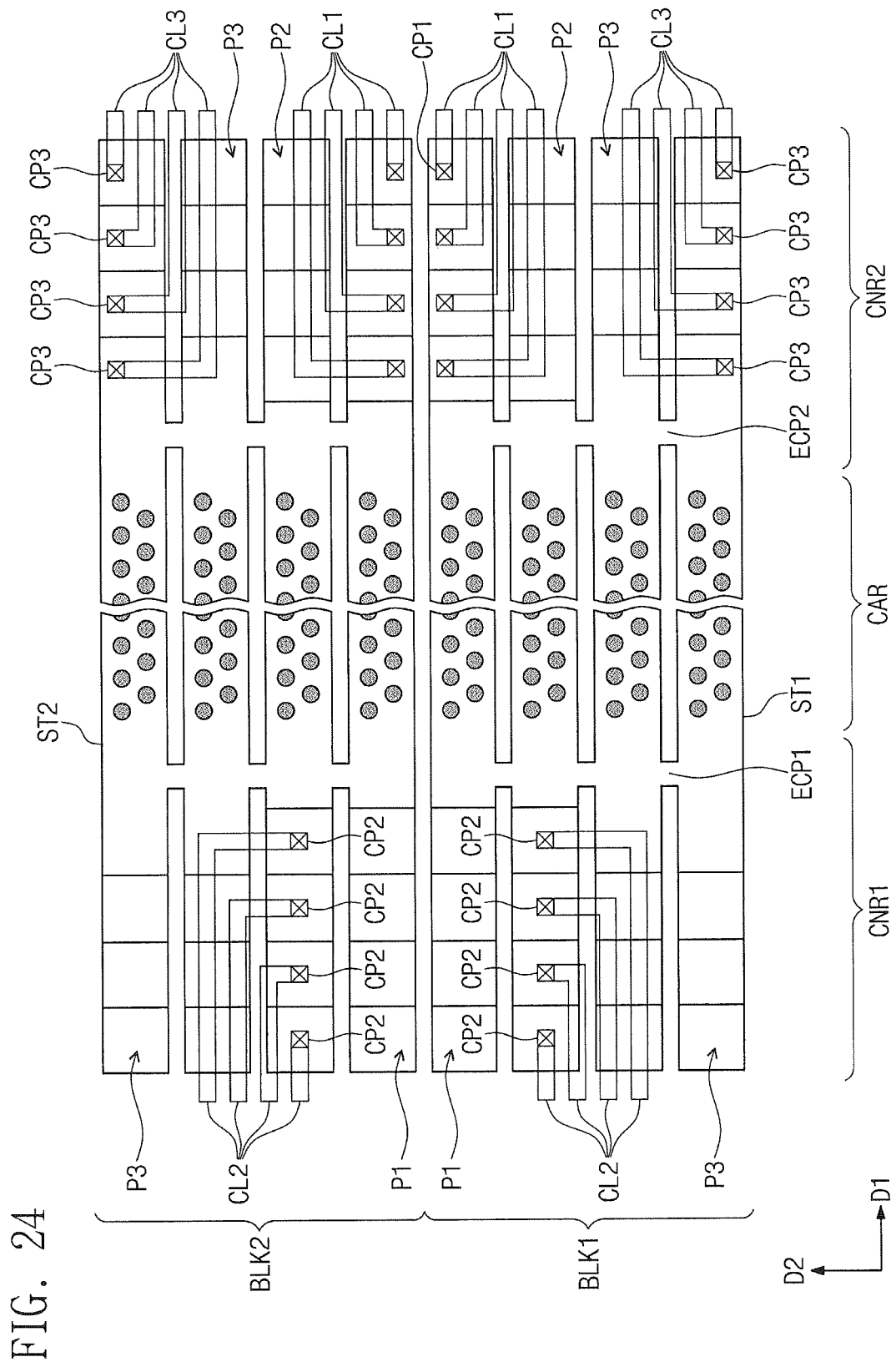
FIGS. 24 and 25 are plan views illustrating a 3D semiconductor memory device according to some embodiments of the inventive concept.
Figure 25:
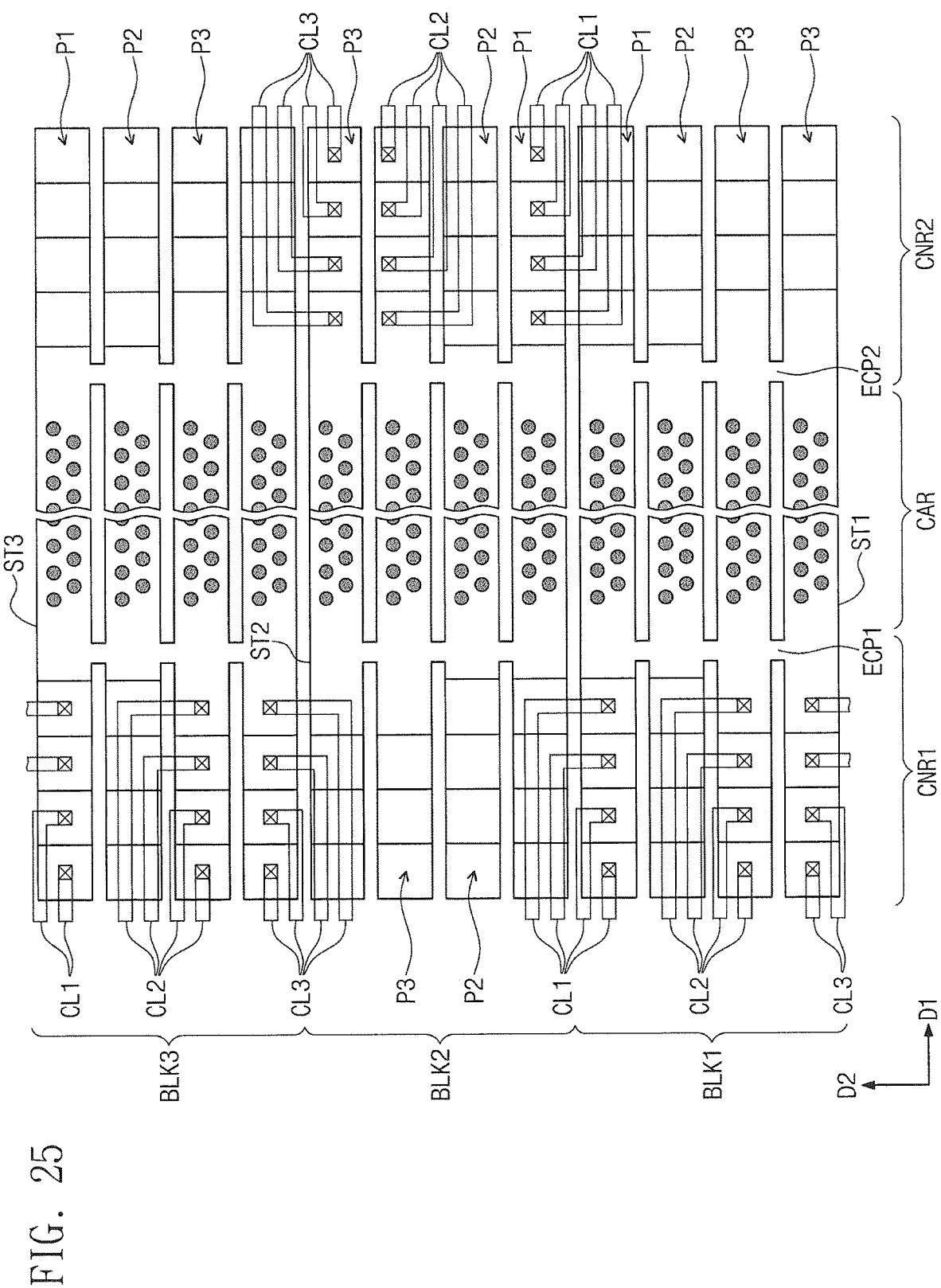

FIGS. 24 and 25 are plan views illustrating a 3D semiconductor memory device according to some embodiments of the inventive concept. In the description that follows, a discussion of features identical to those of FIGS. 19 to 23 will be minimized in order to avoid redundancy.

Referring to FIGS. 24 and 25, the substrate 10 may include the first and second connection regions CNR1 and CNR2, which are spaced apart from each other in the first direction D1, and the cell array region CAR, which are provided between the first and second connection regions CNR1 and CNR2.

The first and second electrode structures ST1 and ST2 may be provided to be spaced apart from each other in the second direction D2. Each of the first and second electrode structures ST1 and ST2 may include the first to third electrodes ELa, ELb, and ELc, which are consecutively stacked on the substrate 10. The first to third electrodes ELa, ELb, and ELc may be provided to extend from the cell array region CAR to the first and second connection regions CNR1 and CNR2 in the first direction D1.

On each of the first and second connection regions CNR1 and CNR2, the first and second electrode structures ST1 and ST2 may have the first to third stair-step structures, as described with reference to FIGS. 19 and 20. For example, on each of the first and second connection regions CNR1 and CNR2, each of the first electrodes ELa may have the first pad regions P1 exposed by the second electrode ELb positioned thereon. On each of the first and second connection regions CNR1 and CNR2, each of the second electrodes ELb may have the second pad regions P2 exposed by the third electrode ELc positioned thereon. On each of the first and second connection regions CNR1 and CNR2, each of the third electrodes ELc may have the third pad regions P3 exposed by the first electrode ELa positioned thereon.

In some embodiments, each of the first to third electrodes ELa, ELb, and ELc may include a plurality of the electrode portions EP, which are provided on the cell array region CAR to extend in the first direction D1, the first electrode connecting portion ECP1, which is provided on the first connection region CNR1 to horizontally connect the electrode portions EP to each other, and the second electrode connecting portion ECP2, which is provided on the second connection region CNR2 to horizontally connect the electrode portions EP to each other. Each of the first electrodes ELa may include the protrusions PP protruding from the first and second electrode connecting portions ECP1 and ECP2, and each of the second and third electrodes ELb and ELc may include the first and second protrusions PP1 and PP2 protruding from the first and second electrode connecting portions ECP1 and ECP2.

In an embodiment shown in FIG. 24, the first and third contact plugs CP1 and CP3 may be disposed on the second connection region CNR2, and the second contact plugs CP2 may be disposed on the first connection region CNR1. For example, the first contact plugs CP1 may be disposed on the second connection region CNR2 to be coupled to the first pad regions P1 of the first electrodes ELa, and the third contact plugs CP3 may be disposed on the second connection region CNR2 to be coupled to the third pad regions P3 of the third electrodes ELc. Also, the second contact plugs CP2 may be disposed on the first connection region CNR1 to be coupled to the second pad regions P2 of the second electrodes ELb. Accordingly, it is possible to increase horizontal distances between the contact plugs CP1, CP2, and CP3 adjacent to each other in the second direction D2. This may make it possible to increase a process margin in a process of forming the contact plugs CP1, CP2, and CP3.

The first and third interconnection lines CL1 and CL3 may be provided on the second connection region CNR2 to be coupled to the first and third contact plugs CP1 and CP3, respectively, and the second interconnection lines CL2 may be provided on the first connection region CNR1 to be coupled to the second contact plugs CP2, respectively.

Referring to FIG. 25, as another example, the first to third electrode structures ST1, ST2, and ST3 may be provided on the substrate 10 to be spaced apart from each other in the second direction D2. Each of the first to third electrode structures ST1, ST2, and ST3 may include the first to third electrodes ELa, ELb, and ELc with the first to third pad regions P1, P2, and P3, on the first and second connection regions CNR1 and CNR2, similar to that described with reference to FIGS. 19 and 20. For example, each of the first to third electrode structures ST1, ST2, and ST3 may be provided to have the first to third stair-step structures, on the first and second connection regions CNR1 and CNR2.

In some embodiments, the first pad regions P1 of the first electrode structure ST1 may be adjacent to the first pad regions P1 of the second electrode structure ST2 in the second direction D2, and the third pad regions P3 of the second electrode structure ST2 may be adjacent to the third pad regions P3 of the third electrode structure ST3 in the second direction D2.

The first to third contact plugs CP1, CP2, and CP3 may be coupled to the first to third electrode structures ST1, ST2, and ST3, respectively. In some embodiments, the first to third contact plugs CP1, CP2, and CP3 connected to the first and third electrode structures ST1 and ST3 may be disposed on the first connection region CNR1, and the first to third contact plugs CP1, CP2, and CP3 connected to the second electrode structure ST2 may be disposed on the second connection region CNR2.

In addition, the first to third interconnection lines CL1, CL2, and CL3 may be coupled to the first to third contact plugs CP1, CP2, and CP3, respectively. The first to third interconnection lines CL1, CL2, and CL3 coupled to the first and third electrode structures ST1 and ST3 may be disposed on the first connection region CNR1, and the first to third interconnection lines CL1, CL2, and CL3 coupled to the second electrode structure ST2 may be disposed on the second connection region CNR2.

Figure 26:
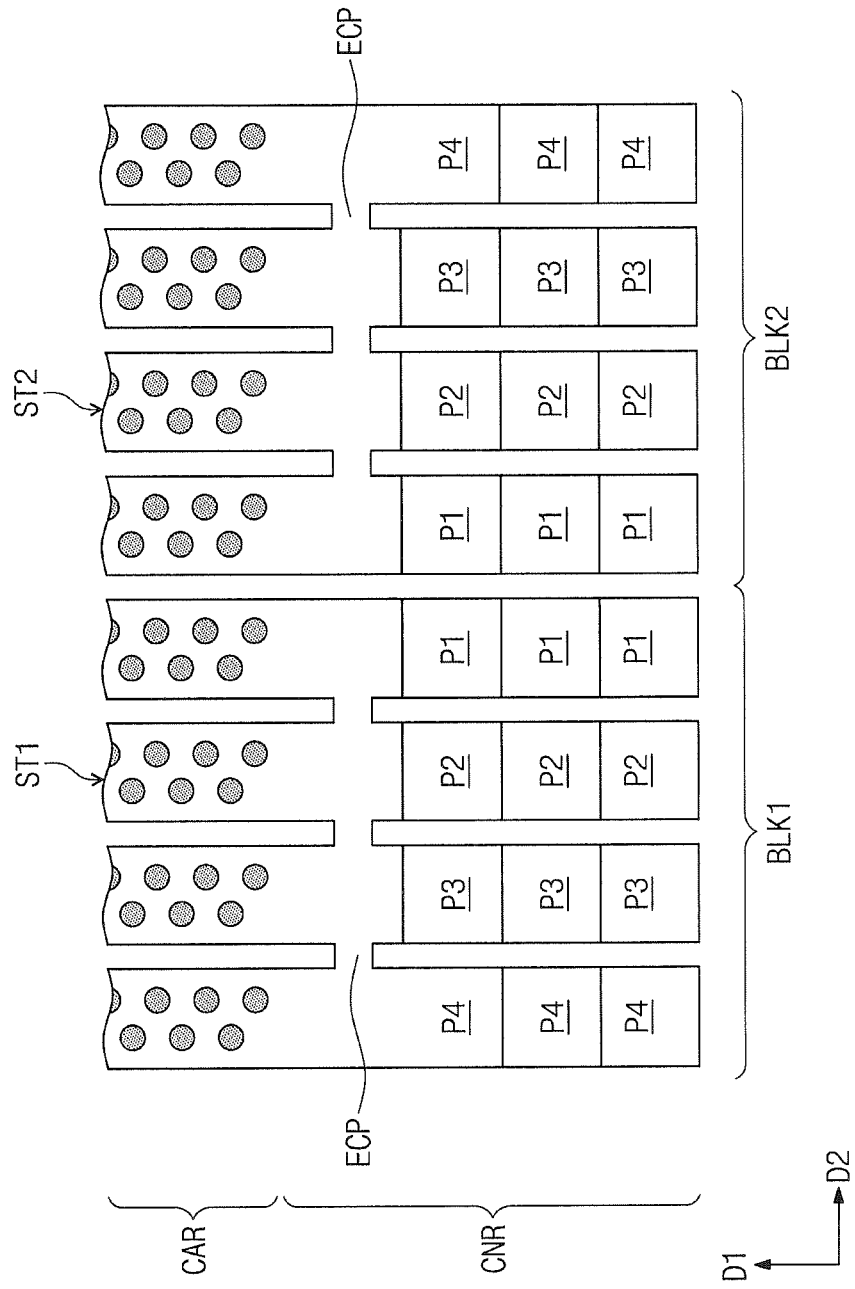
FIGS. 26 and 27 are plan and perspective views illustrating an electrode structure of a 3D semiconductor memory device according to some embodiments of the inventive concept.
Figure 27:
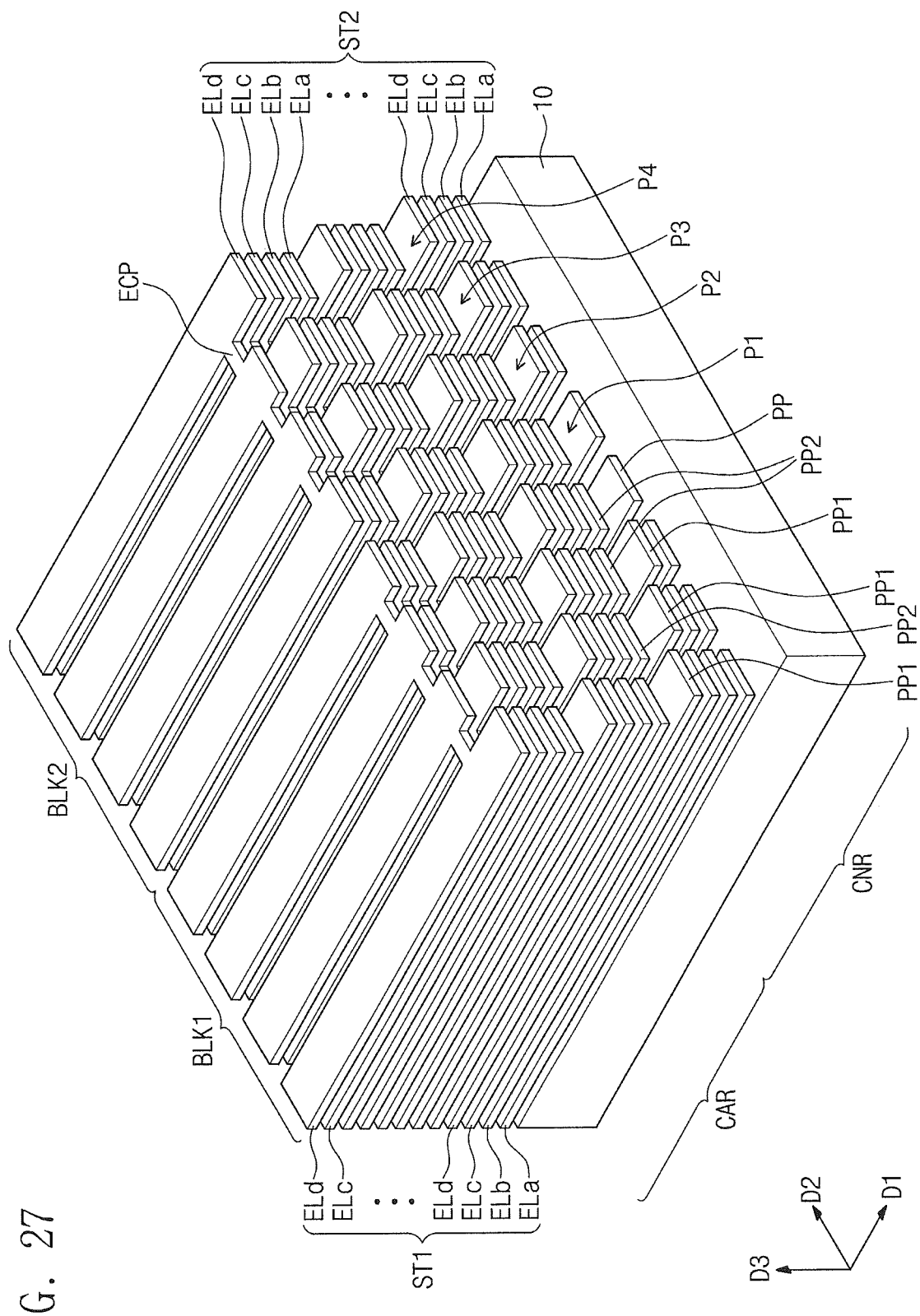

FIGS. 26 and 27 are plan and perspective views illustrating an electrode structure of a 3D semiconductor memory device according to some embodiments of the inventive concept. In the description that follows, a discussion of features identical to those of FIGS. 19 to 23 will be minimized in order to avoid redundancy.

Referring to FIGS. 26 and 27, the first and second electrode structures ST1 and ST2 may be disposed on the substrate 10, and each of the first and second electrode structures ST1 and ST2 may include first to fourth electrodes ELa, ELb, ELc, and ELd, which are vertically and alternatingly stacked on the substrate 10. Furthermore, each of the first and second electrode structures ST1 and ST2 may include insulating layers (not shown), each of which is interposed between a corresponding pair of the first to fourth electrodes ELa, ELb, ELc, and ELd. The first to fourth electrodes ELa, ELb, ELc, and ELd may extend from the cell array region CAR to the connection region CNR in the first direction Dl.

Each of the first electrodes ELa may include the first pad region P1, which is positioned on the connection region CNR and is exposed by the second electrode ELb positioned thereon, and each of the second electrodes ELb may include the second pad region P2, which is positioned on the connection region CNR and is exposed by the third electrode ELc positioned thereon. Each of the third electrodes ELc may include the third pad region P3, which is exposed by the fourth electrode ELd positioned thereon. Each of the fourth electrodes ELd may include a fourth pad region P4, which is exposed by the first electrode ELa positioned thereon.

The first pad regions P1 of the first electrodes ELa may be arranged in the first direction D1, when viewed in a plan view, and moreover, they may be positioned at different vertical levels from the substrate 10. The second pad regions P2 of the second electrodes ELb, the third pad regions P3 of the third electrodes ELc, and the fourth pad regions P4 of the fourth electrodes ELd may be configured to have substantially the same features as the first pad regions P1 of the first electrodes ELa. Accordingly, each of the first and second electrode structures ST1 and ST2 may have the first stair-step structure formed by the first pad regions P1, the second stair-step structure formed by the second pad regions P2, the third stair-step structure formed by the third pad regions P3, and the fourth stair-step structure formed by the fourth pad regions P4. In addition, in each of the first and second electrode structures ST1 and ST2, the first to fourth pad regions P1, P2, P3, and P4 may be arranged in the second direction D2. For example, vertical positions of the first to fourth pad regions P1, P2, P3, and P may be lowered in a stepwise manner in the second direction D2, and thus, each of the first and second electrode structures ST1 and ST2 may have a stair-step structure in the second direction D2. In addition, the first and second electrode structures ST1 and ST2 may be provided in such a way that the first to fourth pad regions P1, P2, P3, and P4 of them are disposed in a mirror symmetric manner on the connection region CNR.

As described above, each of the first to fourth electrodes ELa, ELb, ELc, and ELd may include a plurality of the electrode portions EP, the electrode connecting portions ECP, and the protrusions PP. Each of the second to fourth electrodes ELb, ELc, and ELd may include at least one first protrusion PP1, which is extended from the electrode connecting portion ECP by a first length, and at least one second protrusion PP2, which is extended from the electrode connecting portion ECP a second length shorter than the first length. In each of the second to fourth electrodes ELb, ELc, and ELd, at least one of the first protrusions PP1 may serve as the pad region.

In each electrode structure, the second electrode ELb may be provided to expose a portion of one of the protrusions PP of the first electrode ELa positioned therebelow. The third electrode ELc may be provided to expose not only one of the protrusions PP of the first electrode ELa positioned therebelow but also one the protrusions PP of the second electrode ELb positioned therebelow. The fourth electrode ELd may be provided to expose one of the protrusions PP of the first electrode ELa positioned therebelow, one of the protrusions PP of the second electrode ELb positioned therebelow, and one of the protrusions PP of the third electrode ELc positioned therebelow.

According to some embodiments of the inventive concept, in each of the second electrodes ELb, side surfaces of the first protrusions PP1 may be aligned to side surfaces of the protrusions PP of the first electrode ELa positioned therebelow. In each of the third electrodes ELc, side surfaces of the first protrusions PP1 may be aligned to side surfaces of the first protrusions PP1 of the second electrode ELb positioned therebelow, and side surfaces of the second protrusions PP2 may be aligned to side surfaces of the second protrusions PP2 of the second electrode ELb positioned therebelow. In each of the fourth electrodes ELd, side surfaces of the first protrusions PP1 may be aligned to side surfaces of the first protrusions PP1 of the third electrodes ELc positioned therebelow, and side surfaces of the second protrusions PP2 may be aligned to side surfaces of the second protrusions PP2 of the third electrode ELc positioned therebelow.

Figure 28:
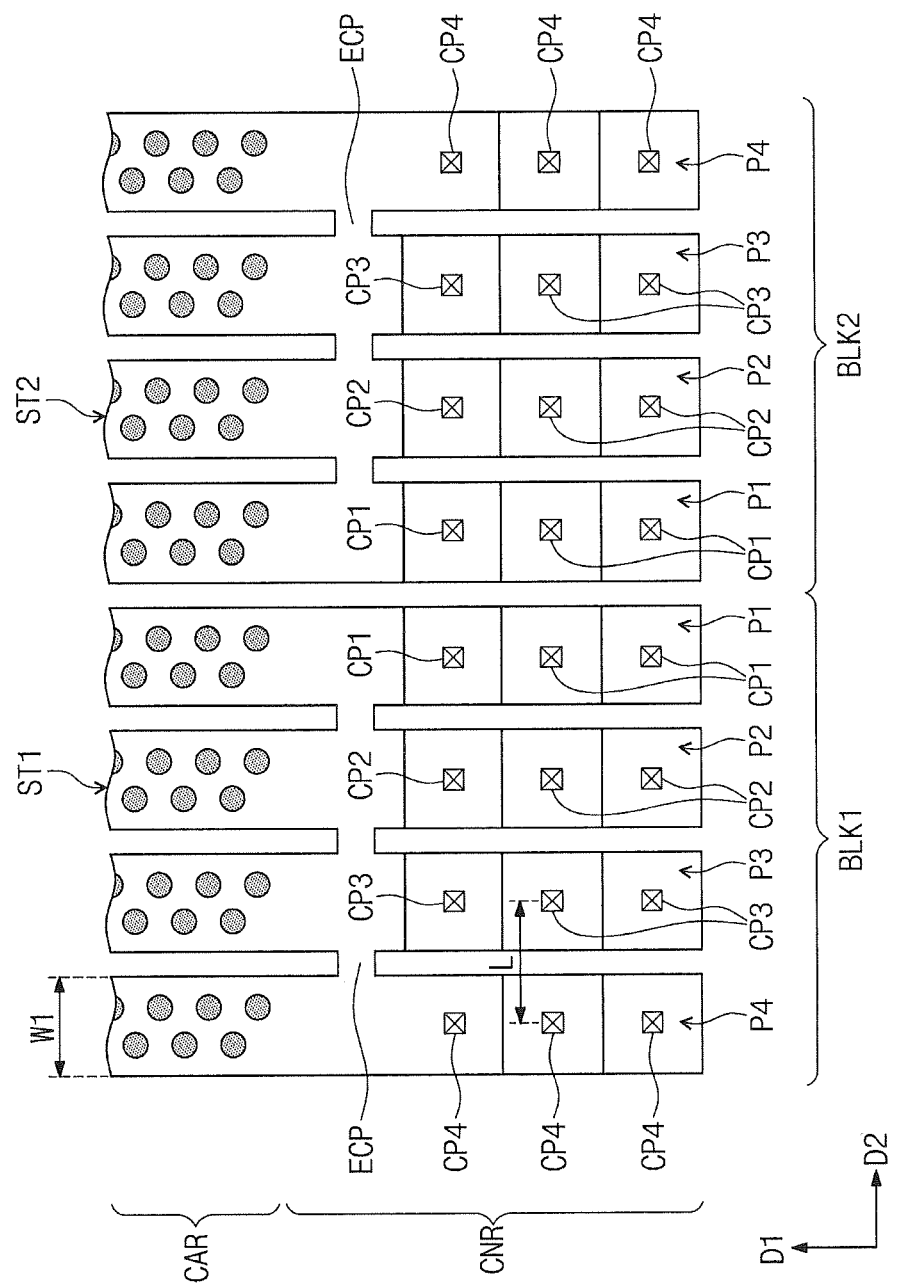
FIGS. 28 and 29 are plan and perspective views illustrating contact plugs connected to an electrode structure shown in FIGS. 26 and 27.
Figure 29:
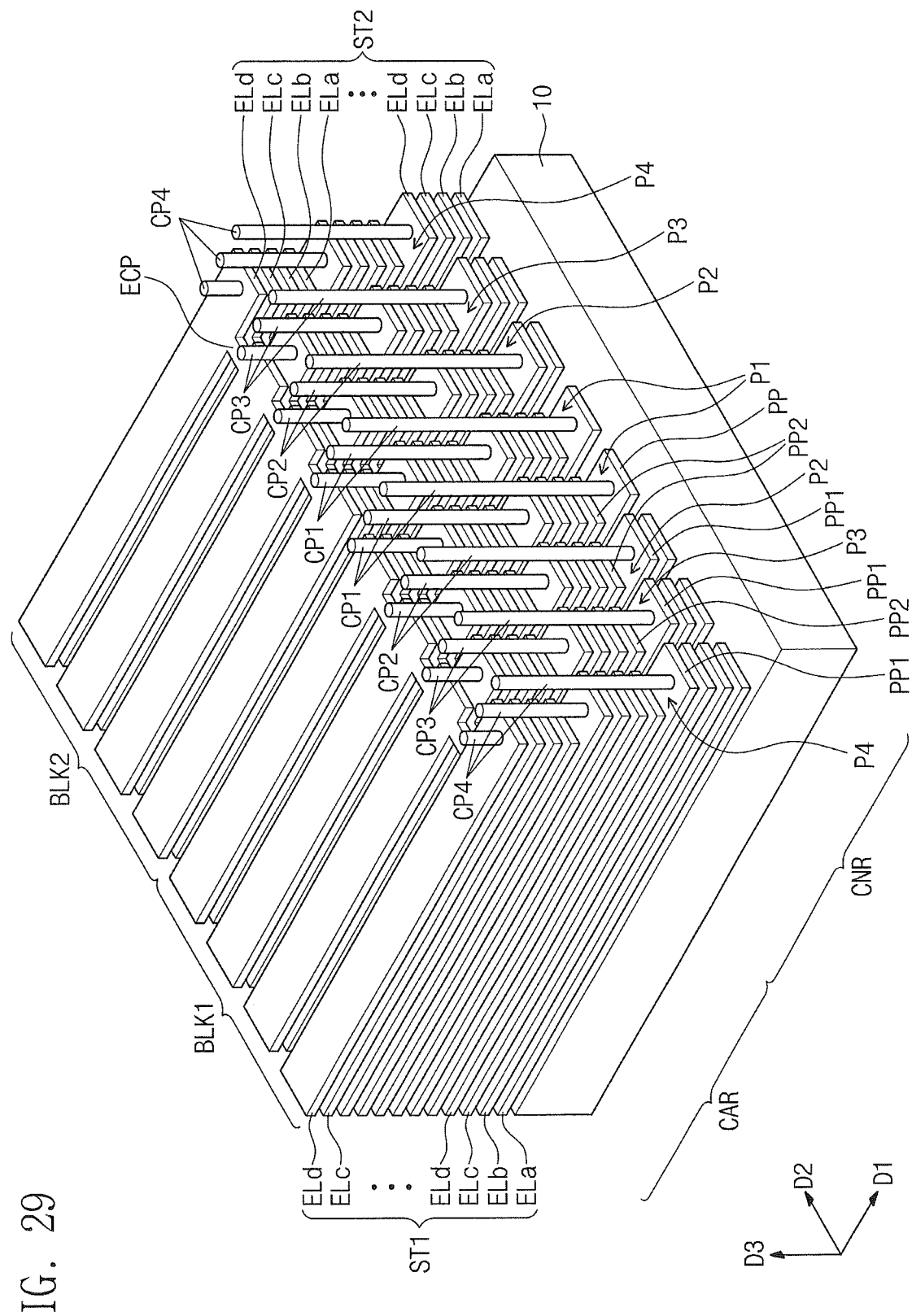

FIGS. 28 and 29 are plan and perspective views illustrating contact plugs connected to an electrode structure shown in FIGS. 26 and 27. In the description that follows, the electrode structure described with reference to FIGS. 26 and 27 will be minimized in order to avoid redundancy.

Referring to FIGS. 28 and 29, the first contact plugs CP1 may be coupled to the first pad regions P1 of the first electrodes ELa, respectively, and the second contact plugs CP2 may be coupled to the second pad regions P2 of the second electrodes ELb, respectively. Similarly, the third contact plugs CP3 may be coupled to the third pad regions P3 of the third electrodes ELc, respectively, and fourth contact plugs CP4 may be coupled to the fourth pad regions P4 of the fourth electrodes ELd, respectively.

The number of the first contact plugs CP1 may be the same as the number of the first electrodes ELa constituting the first and second electrode structures ST1 and ST2, and the first contact plugs CP1 may have different vertical lengths. The second to fourth contact plugs CP2, CP3, and CP4 may be provided in a similar manner to the first contact plugs CP1.

In some embodiments, the first to fourth contact plugs CP1, CP2, CP3, and CP4 may be provided to be spaced apart from each other by the same distance in the second direction D2. A horizontal distance, in the second direction D2, between the first to fourth contact plugs CP1, CP2, CP3, and CP4 may be greater than a width of the electrode portions EP of each electrode.

Figure 30:
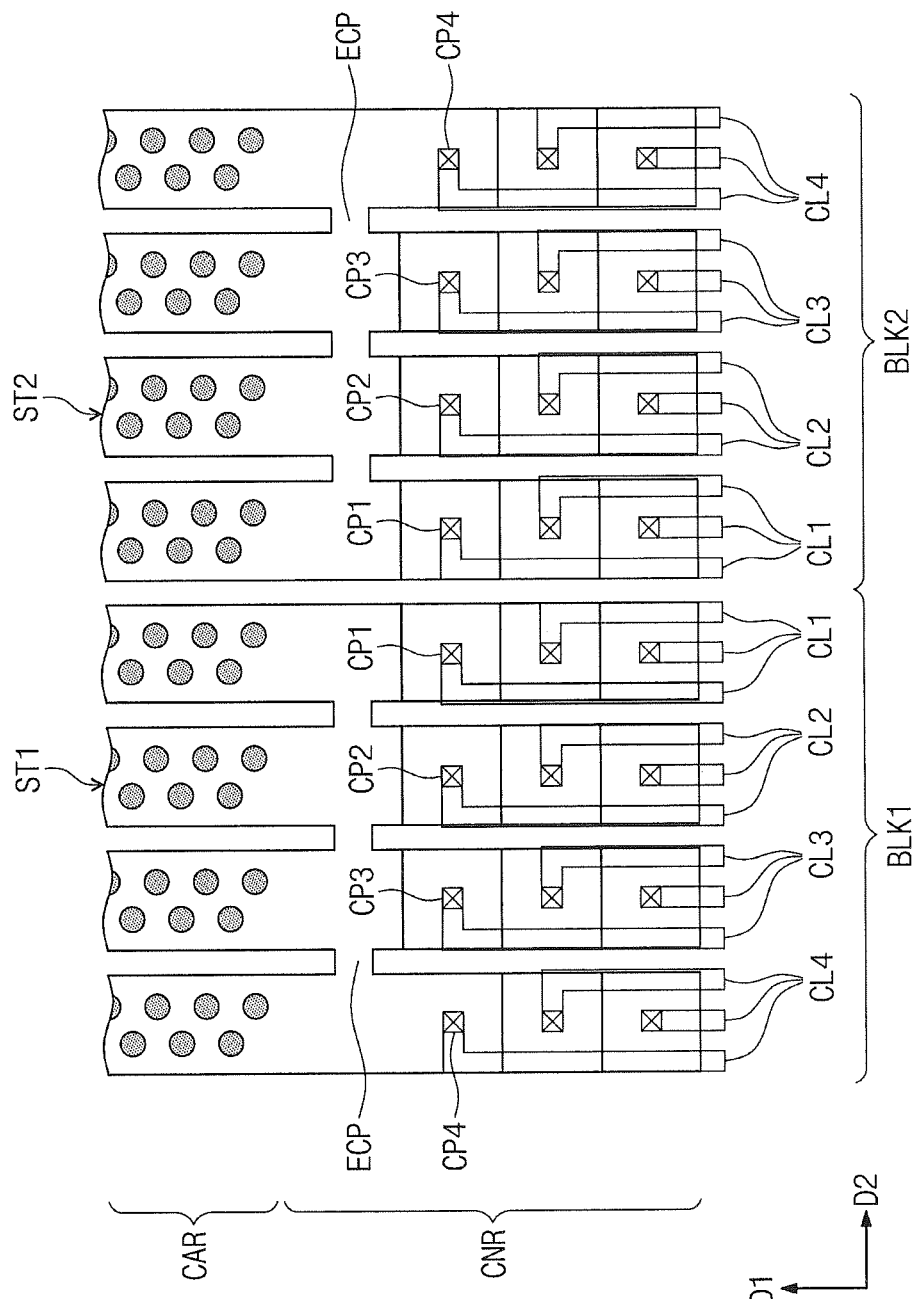
FIG. 30 is a plan view illustrating interconnection lines connected to an electrode structure shown in FIGS. 26 and 27.

FIG. 30 is a plan view illustrating interconnection lines connected to an electrode structure shown in FIGS. 26 and 27.

Referring to FIG. 30, in each of the first and second electrode structures ST1 and ST2, the first interconnection lines CL1 may be coupled to the first contact plugs CP1, respectively, and the second interconnection lines CL2 may be coupled to the second contact plugs CP2, respectively. Also, in each of the first and second electrode structures ST1 and ST2, the third interconnection lines CL3 may be coupled to the third contact plugs CP3, respectively, and fourth interconnection lines CL4 may be coupled to the fourth contact plugs CP4, respectively.

The first to fourth interconnection lines CL1, CL2, CL3, and CL4 may be disposed at the same vertical level from the substrate 10. Each of the first to fourth interconnection lines CL1, CL2, CL3, and CL4 may include the first portion extending in the first direction D1 and the second portion extending in the second direction D2, and the first portions of the first to fourth interconnection lines CL1, CL2, CL3, and CL4 may be disposed to be spaced apart from each other by the same distance in the second direction D2.

Figure 31:
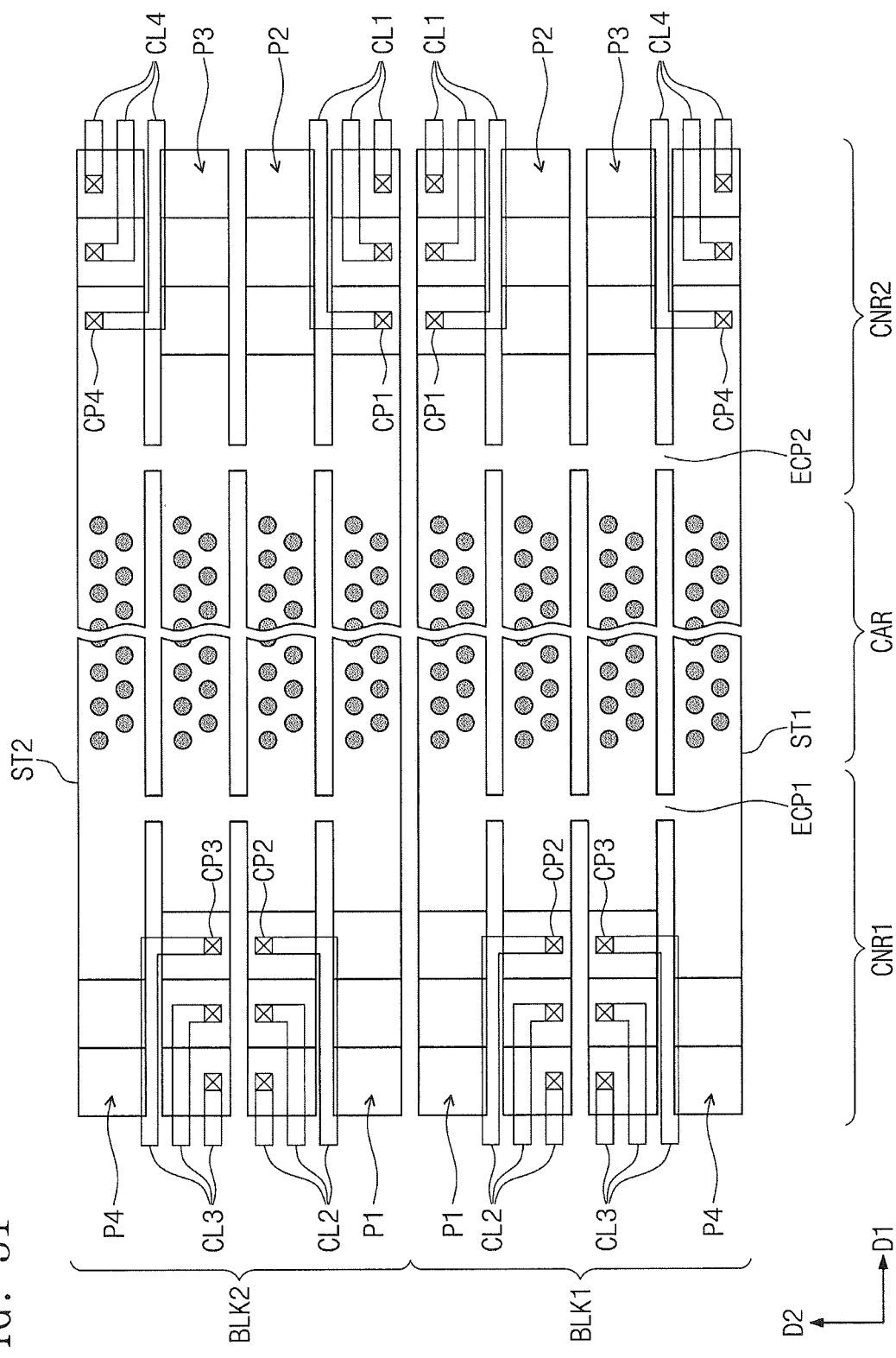
FIGS. 31 and 32 are plan views illustrating a 3D semiconductor memory device according to some embodiments of the inventive concept.
Figure 32:
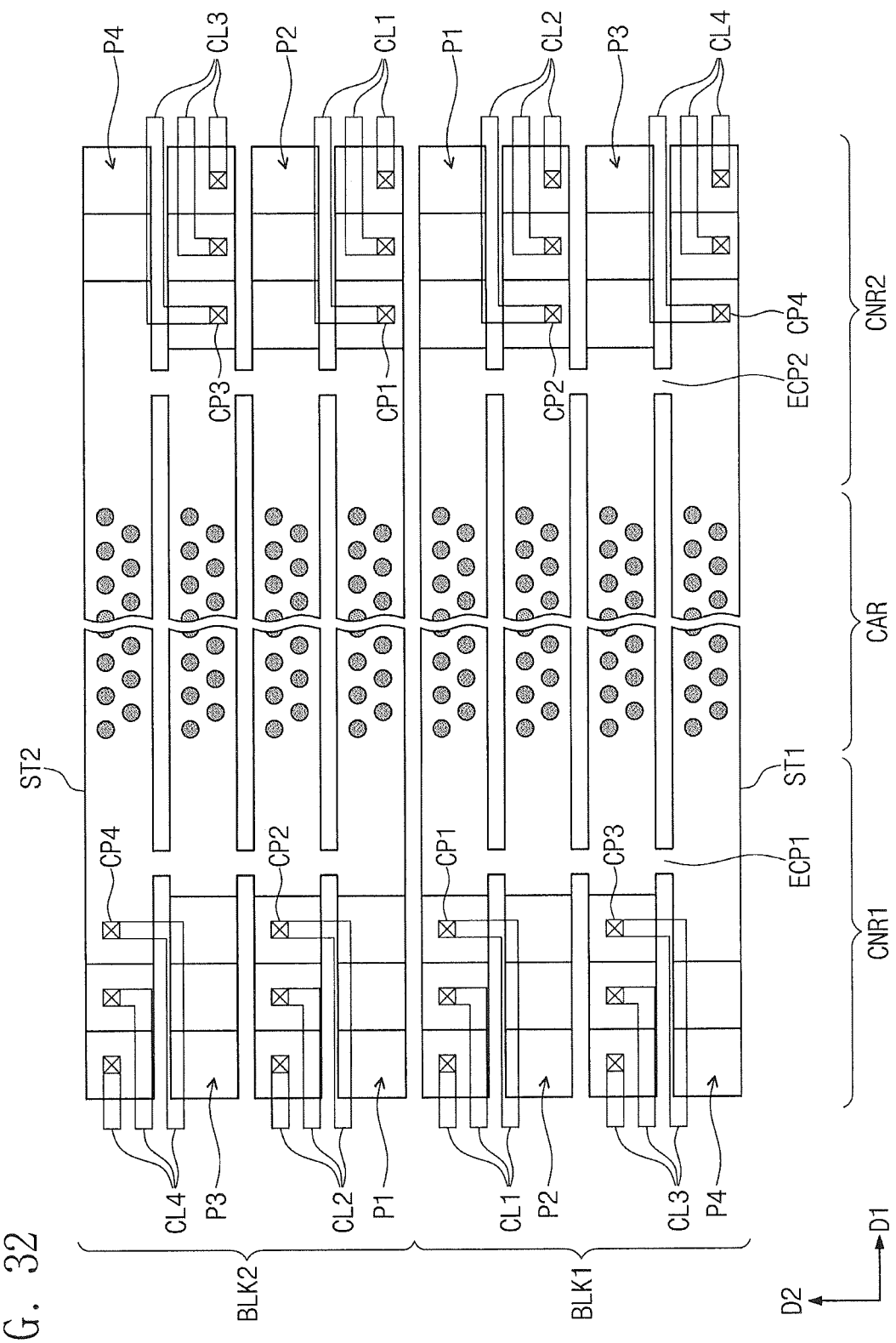

FIGS. 31 and 32 are plan views illustrating a 3D semiconductor memory device according to some embodiments of the inventive concept.

Referring to FIGS. 31 and 32, the substrate 10 may include the first and second connection regions CNR1 and CNR2 and the cell array region CAR therebetween. The first and second electrode structures ST1 and ST2 may be provided on the substrate 10 to be spaced apart from each other in the second direction D2.

As previously described with reference to FIGS. 26 and 27, each of the first and second electrode structures ST1 and ST2 may include the first to fourth electrodes ELa, ELb, ELc, and ELd, which are consecutively and sequentially stacked on the substrate 10. The first to fourth pad regions P1, P2, P3, and P4 of the first to fourth electrodes ELa, ELb, ELc, and ELd may be disposed on the first and second connection regions CNR1 and CNR2. Also, the first pad regions P1 of the first and second electrode structures ST1 and ST2 may be adjacent to each other in the second direction D2.

According to an embodiment shown in FIG. 31, the first and fourth contact plugs CP1 and CP4 may be provided on the second connection region CNR2 and may be coupled to the first and fourth pad regions P1 and P4 of the first and second electrode structures ST1 and ST2. The second and third contact plugs CP2 and CP3 may be provided on the first connection region CNR1 and may be coupled to the second and third pad regions P2 and P3 of the first and second electrode structures ST1 and ST2. The first and fourth interconnection lines CL 1 and CL4 may be coupled to the first and fourth contact plugs CP1 and CP4, on the second connection region CNR2, and the second and third interconnection lines CL2 and CL3 may be coupled to the second and third contact plugs CP2 and CP3 on the first connection region CNR1. As a result of the disposition of the contact plugs and the interconnection lines, it is possible to increase a process margin in a process of forming the contact plugs and the interconnection lines.

According to an embodiment shown in FIG. 32, the first and third contact plugs CP1 and CP3 and the first and third interconnection lines CL1 and CL3 coupled to the first and third pad regions P1 and P3 of the first electrode structure ST1 may be disposed on the first connection region CNR1, and the second and fourth contact plugs CP2 and CP4 and the second and fourth interconnection lines CL2 and CL4 coupled to the second and fourth pad regions P2 and P4 of the first electrode structure ST1 may be disposed on the second connection region CNR2. The second and fourth contact plugs CP2 and CP4 and the second and fourth interconnection lines CL2 and CL4 coupled to the second and fourth pad regions P2 and P4 of the second electrode structure ST2 may be disposed on the first connection region CNR1, the first and third contact plugs CP1 and CP3 and the first and third interconnection lines CL1 and CL3 coupled to the first and third pad regions P1 and P3 of the second electrode structure ST2 may be disposed on the second connection region CNR2. Accordingly, the contact plugs coupled to the first and second electrode structures ST1 and ST2 may be spaced apart from each other by the same distance in the second direction D2, on the first and second connection regions CNR1 and CNR2.

FIGS. 33 to 36 are perspective views illustrating a method of forming an electrode structure of a 3D semiconductor memory device according to some embodiments of the inventive concept.

Figure 33:
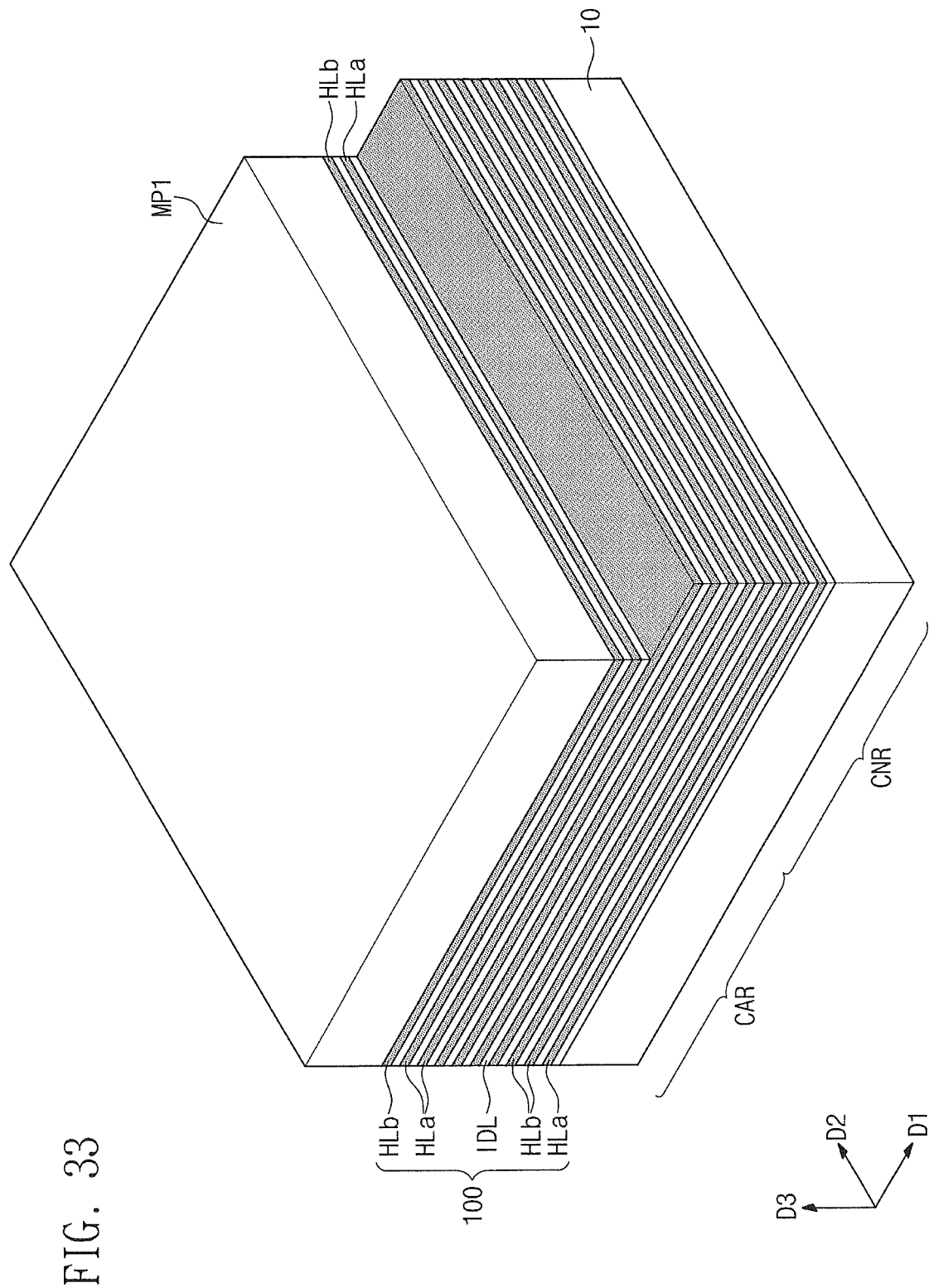
FIGS. 33 to 36 are perspective views illustrating a method of forming an electrode structure of a 3D semiconductor memory device according to some embodiments of the inventive concept.

Referring to FIG. 33, a layered structure 100 may be formed on the substrate 10 with the cell array region CAR and the connection region CNR. The layered structure 100 may include horizontal layers HLa and HLb and insulating layers ILD, which are vertically and alternatingly stacked on the substrate 10. In some embodiments, the following patterning method may be used to form the first to fourth electrodes ELa, ELb, ELc, and ELd described with reference to FIGS. 1 to 32. In other words, the horizontal layers HLa and HLb may be used as the first to fourth electrodes ELa, ELb, ELc, and ELd described above.

The horizontal layers HLa and HLb may be formed of a material having an etch selectivity with respect to the insulating layers ILD. For example, the insulating layers ILD may be formed of or include silicon oxide, and the horizontal layers HLa and HLb may be formed of or include at least one of silicon nitride, silicon oxynitride, poly silicon, or metals. In some embodiments, the horizontal layers HLa and HLb may be formed the same material.

A first mask pattern MP1 may be formed on the layered structure 100. The first mask pattern MP1 may be formed to expose a portion of the layered structure 100 on the connection region CNR.

Thereafter, a trimming process on the first mask pattern MP1 and an etching process on the layered structure 100 may be repeatedly performed. The etching process may be performed to etch a portion of the layered structure 100 using the first mask pattern MP1 as an etch mask, and the trimming process may be performed to reduce a size of the first mask pattern MP1. In some embodiments, the etching process may be performed to etch at least two of the horizontal layers HLa and HLb exposed by the first mask pattern MP1. In other words, the etching depth in the etching process may be equal to or greater than two times a vertical pitch of the horizontal layers HLa and HLb. The vertical pitch of the horizontal layers HLa and HLb may mean a vertical distance between top surfaces of vertically-adjacent ones of the horizontal layers HLa and HLb. The trimming process may be performed to horizontally recess a side surface of the first mask pattern MP1 toward the cell array region CAR by a predetermined depth or to reduce an area of the first mask pattern MP1. Here, the horizontal recess depth of the trimming process may correspond to the width, in the first direction D1, of each of the first to fourth pad regions P1, P2, P3, and P4.

Figure 34:
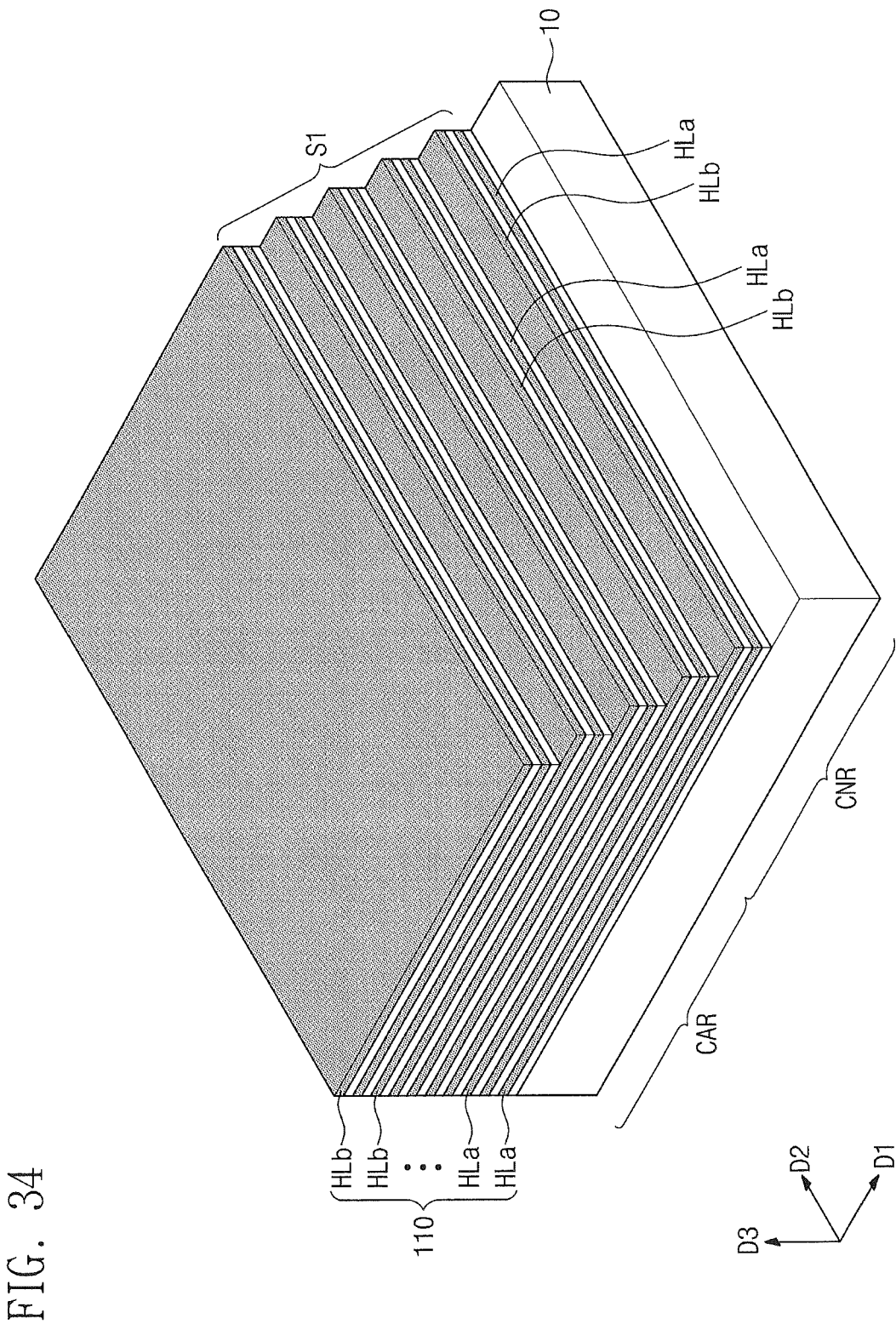

In some embodiments, the trimming process on the first mask pattern MP1 and the etching process on the layered structure 100 may be alternatingly performed to expose end portions of even-numbered ones of the horizontal layers HLb, as shown in FIG. 34, and hereinafter, such a structure will be referred to as a first stack 110. In other words, the first stack 110 may have the first stair-step structure S1, which is formed by the exposed end portions of the even-numbered ones of the horizontal layers HLb, on the connection region CNR.

Figure 35:
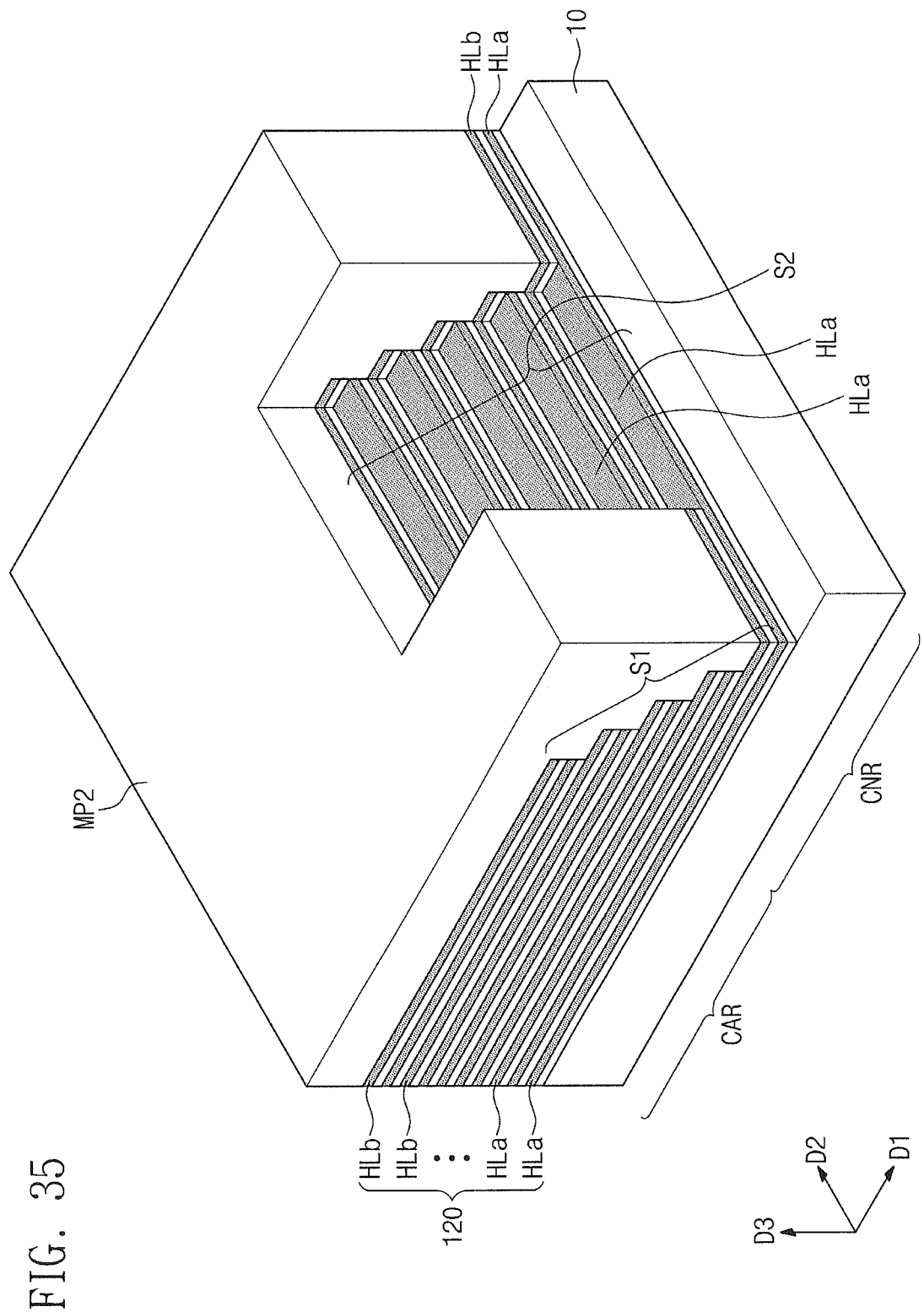

Referring to FIG. 35, a second mask pattern MP2 may be formed on the first stack 110. The second mask pattern MP2 may be formed to define an opening exposing a portion of the first stair-step structure S1 of the first stack 110.

A portion of the first stack 110 may be etched using the second mask pattern MP2 as an etch mask. In this case, the etching depth in the etching process on the first stack 110 may be smaller than that in the etching process using the first mask pattern MP1 as the etch mask. For example, the etching depth in the etching process on the first stack 110 may be substantially equal to the vertical pitch of the horizontal layers HL. As an example, the etching process on the first stack 110 may be performed to expose portions of odd-numbered ones of the horizontal layers HLa, and as a result, the second stair-step structure S2 may be formed on the connection region CNR. Accordingly, the first stair-step structure S1 and the second stair-step structure S2 may be formed on the connection region CNR, and such a structure will be referred to as a second stack 120. Since the second stair-step structure S2 is formed by etching a portion of the first stair-step structure S1, the first and second stair-step structures S1 and S2 may be adjacent to each other in the second direction D2.

After the formation of the second stack 120, the second mask pattern MP2 may be removed.

Figure 36:
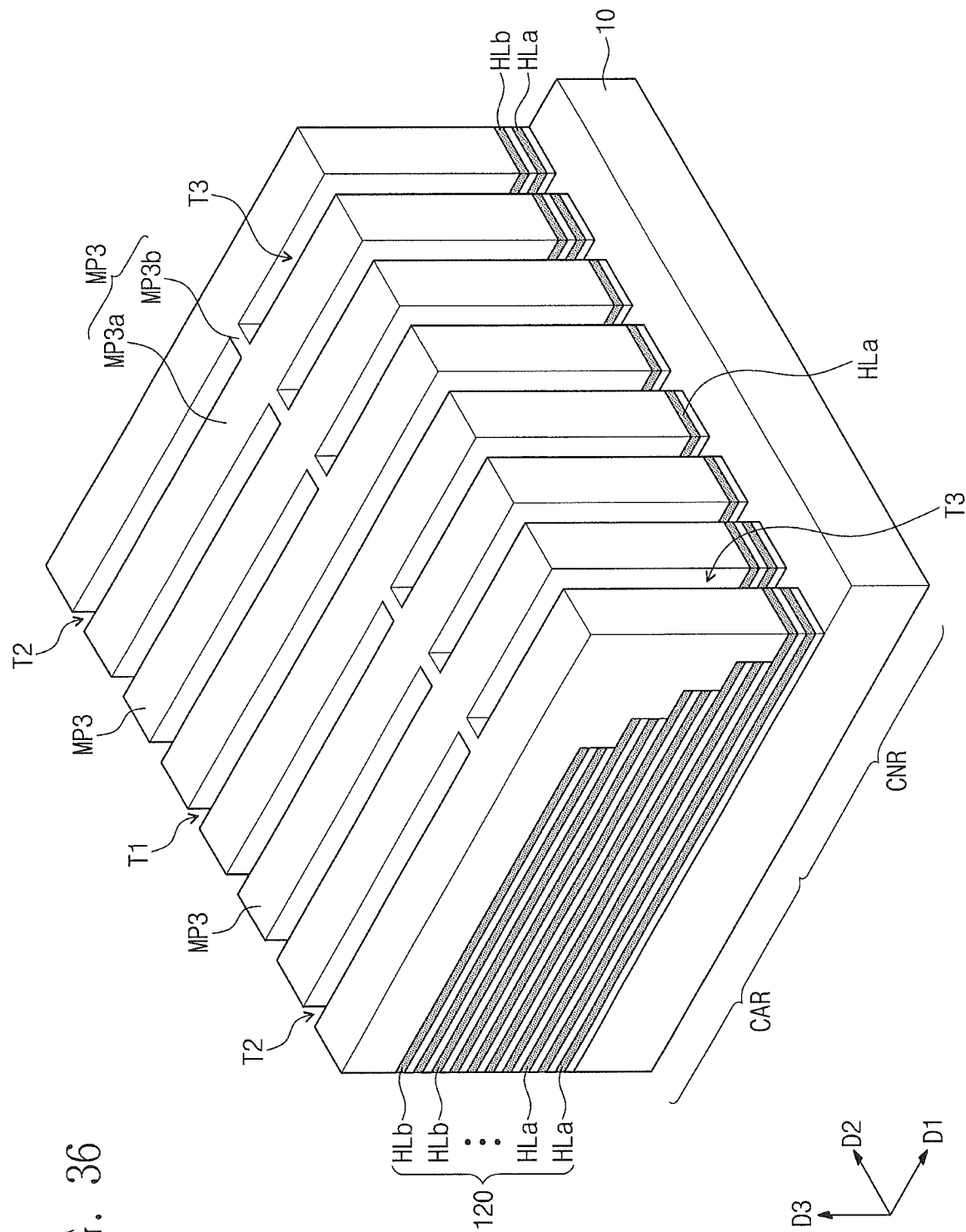

Referring to FIG. 36, third mask patterns MP3 may be formed on the second stack 120 with the first and second stair-step structures S1 and S2.

When viewed in a plan view, each of the third mask patterns MP3 may include first line portions MP3a and a second line portion MP3b. The first line portions MP3a may extend in the first direction D1 and may be spaced apart from each other in the second direction D2. The second line portion MP3b may be formed on the connection region CNR to extend in the second direction D2 and to connect the first line portions MP3a to each other.

The second stack 120 may be etched using the third mask pattern MP3 as an etch mas to form third stacks 130 separated from each other in the second direction D2. For example, first trenches T1 may be formed to horizontally separate the third stacks 130 from each other, second trenches T2 may be formed to horizontally separate the electrode portions EP on the cell array region CAR from each other, and third trenches T3 may be formed to separate the protrusions PP on the connection region CNR from each other.

As a result, each of the third stacks 130 may have the first and second stair-step structures S1 and S2. Here, each of the odd-numbered ones of the horizontal layers HLa of the third stack 130 may include the electrode portions EP, the electrode connecting portion ECP connecting the electrode portions EP, and the protrusions PP, like the first electrode ELa described with reference to FIG. 5A. Also, each of even-numbered ones of the horizontal layers HLb of the third stack 130 may include the electrode portions EP, the electrode connecting portion ECP connecting the electrode portions EP, and the first and second protrusions PP1 and PP2, like the second electrode ELb described with reference to FIG. 5B.

According to some embodiments of the inventive concept, a plurality of electrodes may be vertically stacked on a substrate. Each of the electrodes may include a plurality of electrode portions and an electrode connecting portion horizontally connecting the electrode portions to each other. Accordingly, all of the electrode portions of each of the electrodes may be coupled in common to a corresponding one of contact plugs, and this may make it possible to increase a horizontal distance between two adjacent contact plugs. In other words, it is possible to increase a process margin in a process of forming interconnection structures of a three-dimensional semiconductor device.

While example embodiments of the inventive concepts have been particularly shown and described, it will be understood by one of ordinary skill in the art that variations in form and detail may be made therein without departing from the spirit and scope of the attached claims.

What is claimed is:

1. A three-dimensional semiconductor memory device comprising:
    a substrate comprising a cell array region and a connection region;
    adjacent first and second electrode structures extending in parallel with each other along a first direction from the cell array region into the connection region and spaced apart from each other in a second direction perpendicular to the first direction, each of the first and second electrode structures comprising first to fourth electrodes sequentially stacked on the substrate, wherein the first to fourth electrodes comprise pad portions, respectively, on the connection region; and
    first to fourth contact plugs connected to the pad portions of the first to fourth electrodes, respectively,
    wherein the pad portions of the first to fourth electrodes of the first electrode structure are arranged symmetrically with the pad portions of the first to fourth electrodes of the second electrode structure in the second direction, and
    wherein the first and second directions are in parallel with a top surface of the substrate.

2. The three-dimensional semiconductor memory device of claim 1,
    wherein each of the first to fourth electrodes comprises:
    a plurality of electrode portions extending in the first direction and spaced apart from each other in the second direction, on the cell array region; and
    an electrode connecting portion on the connection region to extend in the second direction and to horizontally connect the plurality of electrode portions to each other,
    wherein the pad portions extend from the electrode connecting portion in the first direction.

3. The three-dimensional semiconductor memory device of claim 2,
    wherein each of the plurality of electrode portions has a first width in the second direction,
    wherein each of the pad portions has a second width in the second direction, and
    wherein the second width is substantially equal to the first width.

4. The three-dimensional semiconductor memory device of claim 2,
    wherein each of the plurality of electrode portions has a width in the second direction, and
    wherein the first to fourth contact plugs are spaced apart from each other by a distance greater than the width.

5. The three-dimensional semiconductor memory device of claim 2, wherein the electrode connecting portions of the first to fourth electrodes vertically overlap each other.

6. The three-dimensional semiconductor memory device of claim 2, further comprising:
    vertical structures on the cell array region to penetrate the plurality of electrode portions of the first electrode and the plurality of electrode portions of the second electrode; and
    a data storing layer between the first and second electrodes and the vertical structures.

7. The three-dimensional semiconductor memory device of claim 1, wherein respective sidewalls of the first to fourth electrodes are vertically aligned with each other.

8. The three-dimensional semiconductor memory device of claim 1, further comprising first to fourth interconnection lines coupled to the first to fourth contact plugs, respectively.

9. The three-dimensional semiconductor memory device of claim 8, wherein the first to fourth interconnection lines are located at the same vertical level from the substrate.

10. A three-dimensional semiconductor memory device comprising:
    a substrate comprising a cell array region and a connection region;
    an electrode structure extending along a first direction and comprising first to fourth electrodes sequentially stacked on the substrate, the first to fourth electrodes comprising first to fourth pad portions on the connection region, respectively,
    first to fourth contact plugs coupled to the first to fourth pad portions, respectively; and
    first to fourth interconnection lines coupled to the first to fourth contact plugs, respectively,
    wherein the first to fourth pad portions of the first to fourth electrodes are arranged along a second direction perpendicular to the first direction,
    wherein the first and second interconnection lines are located at the same vertical level from the substrate, and
    wherein the first and second directions are in parallel with a top surface of the substrate.

11. The three-dimensional semiconductor memory device of claim 10, wherein the first to fourth pad portions of the first to fourth electrodes form a staircase structure in the second direction.

12. The three-dimensional semiconductor memory device of claim 10 wherein each of the first to fourth electrodes comprises:
    a plurality of electrode portions extending in the first direction and spaced apart from each other in the second direction, on the cell array region; and
    an electrode connecting portion on the connection region to extend in the second direction and to horizontally connect the plurality of electrode portions to each other,
    wherein the first to fourth pad portions extend from the electrode connecting portion in the first direction.

13. The three-dimensional semiconductor memory device of claim 12,
    wherein each of the plurality of electrode portions has a first width in the second direction,
    wherein each of the first to fourth pad portions has a second width in the second direction, and
    wherein the second width is substantially equal to the first width.

14. The three-dimensional semiconductor memory device of claim 12, wherein each of the plurality of electrode portions has a width in the second direction, and wherein the first to fourth contact plugs are spaced apart from each other by a distance greater than the width.

15. The three-dimensional semiconductor memory device of claim 12, wherein the electrode connecting portions of the first to fourth electrodes vertically overlap each other.

16. A three-dimensional semiconductor memory device comprising:

a substrate comprising first and second connection regions spaced apart from each other in a first direction and a cell array region between the first and second connection regions; and an electrode structure extending along the first direction and comprising first to fourth electrodes sequentially and vertically stacked on the substrate, the first to fourth electrodes comprising first to fourth pad portions on each of the first and second connection regions, respectively, wherein the first to fourth pad portions of the first to fourth electrodes are arranged along a second direction perpendicular to the first direction, wherein each of the first to fourth electrodes comprises:

a plurality of electrode portions extending in the first direction and spaced apart from each other in the second direction, on the cell array region; and an electrode connecting portion on the first connection region or the second connection region to extend in the second direction and to horizontally connect the plurality of electrode portions to each other, and wherein each of the first to fourth pad portions extends from the electrode connecting portion in the first direction.

17. The three-dimensional semiconductor memory device of claim 16, further comprising:

first to fourth contact plugs coupled to the first to fourth pad portions, respectively; and first to fourth interconnection lines coupled to the first to fourth contact plugs, respectively, wherein some of the first to fourth contact plugs are on the first connection region, and wherein others of the first to fourth contact plugs are on the second connection region.

18. The three-dimensional semiconductor memory device of claim 17, wherein the first to fourth interconnection lines are located at the same vertical level from the substrate.

19. The three-dimensional semiconductor memory device of claim 16, wherein respective sidewalls of the first to fourth electrodes are vertically aligned with each other.

* * * * *